(12) United States Patent
Baek et al.

(10) Patent No.: US 12,446,222 B2
(45) Date of Patent: Oct. 14, 2025

(54) SEMICONDUCTOR DEVICE, ELECTRONIC SYSTEM INCLUDING THE SAME, AND METHOD OF FABRICATING THE SAME

(71) Applicant: SAMSUNG ELECTRONICS CO., LTD., Suwon-si (KR)

(72) Inventors: Seokcheon Baek, Hwaseong-si (KR); Miram Kwon, Suwon-si (KR); Seongjun Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 601 days.

(21) Appl. No.: 17/869,909

(22) Filed: Jul. 21, 2022

(65) Prior Publication Data

US 2023/0084557 A1 Mar. 16, 2023

(30) Foreign Application Priority Data

Sep. 16, 2021 (KR) .................. 10-2021-0124188

(51) Int. Cl.
*H10B 43/27* (2023.01)
*H10B 41/10* (2023.01)
*H10B 41/27* (2023.01)
*H10B 41/35* (2023.01)
*H10B 41/40* (2023.01)
(Continued)

(52) U.S. Cl.
CPC ............ *H10B 43/27* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/50; H10B 43/10; H10B 43/40; H10B 41/10; H10B 41/50; H10B 43/20; H10B 41/20; H10B 41/27; H10B 41/35; H10B 41/40; H10B 43/27; H10B 43/35; H10D 88/00
See application file for complete search history.

(56) References Cited

U.S. PATENT DOCUMENTS

| 8,736,069 B2 | 5/2014 | Chiu et al. |
| 9,419,008 B2 | 8/2016 | Oh et al. |

(Continued)

FOREIGN PATENT DOCUMENTS

KR 1020210109808 A 9/2021

*Primary Examiner* — Mark W Tornow
*Assistant Examiner* — Priya M Rampersaud
(74) *Attorney, Agent, or Firm* — Muir Patent Law, PLLC

(57) ABSTRACT

A semiconductor device includes a substrate having cell and connection regions, and a stack structure having dielectric layers and electrodes that are vertically and alternately stacked on the substrate. The stack structure includes a first pad part, a first fence part, a second pad part, and a second fence part that are sequentially arranged along a first direction. Each of the first and second pad parts has a first stepwise structure formed along the first direction and a second stepwise structure formed along a second direction that intersects the first direction, and each of the first and second fence parts includes dummy electrodes at the same levels as the electrodes and spaced apart from the electrodes. Sidewalls of the electrodes that define second stepwise structure of the second part are offset from sidewalls of the dummy electrodes that define second dummy stepwise structure of the first pad part.

19 Claims, 48 Drawing Sheets

(51) Int. Cl.
  *H10B 43/10*  (2023.01)
  *H10B 43/35*  (2023.01)
  *H10B 43/40*  (2023.01)

(56) References Cited

U.S. PATENT DOCUMENTS

| | | | |
|---|---|---|---|
| 10,840,183 B2 | 11/2020 | Yun et al. | |
| 10,950,704 B2 | 3/2021 | Shin et al. | |
| 11,727,971 B2* | 8/2023 | Cheng | H10B 41/27 |
| 2013/0161821 A1* | 6/2013 | Hwang | H10B 41/20 |
| | | | 257/E21.585 |
| 2017/0033117 A1* | 2/2017 | Lee | H01L 21/76879 |
| 2020/0161326 A1 | 5/2020 | Oh et al. | |
| 2020/0295028 A1* | 9/2020 | Kim | H10B 43/20 |
| 2021/0028104 A1* | 1/2021 | Lee | H10B 43/10 |
| 2021/0057431 A1* | 2/2021 | Kang | H01L 21/76224 |
| 2021/0272900 A1* | 9/2021 | Shin | H01L 23/5226 |
| 2022/0328511 A1* | 10/2022 | Chung | H10B 43/40 |

\* cited by examiner

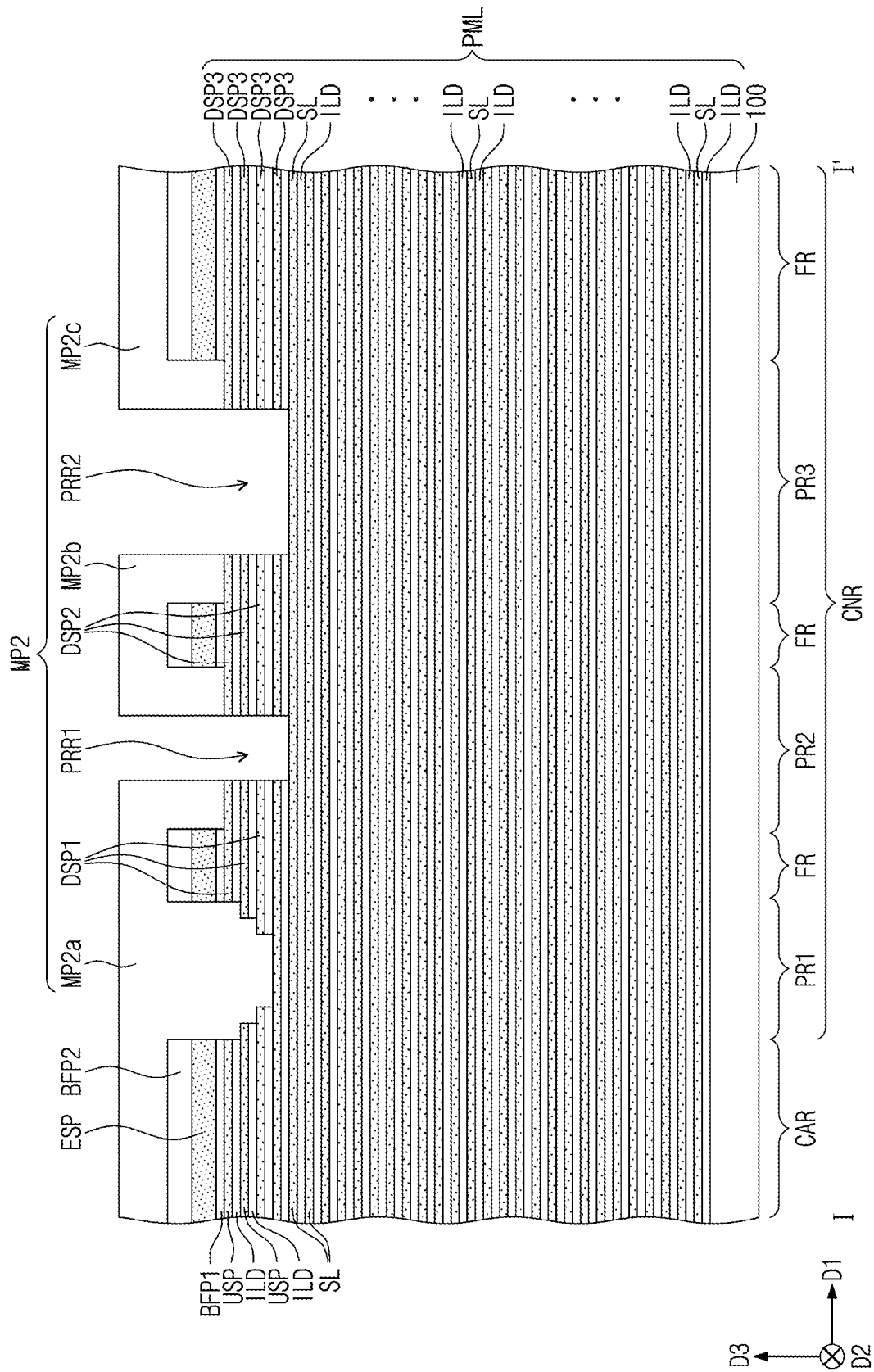

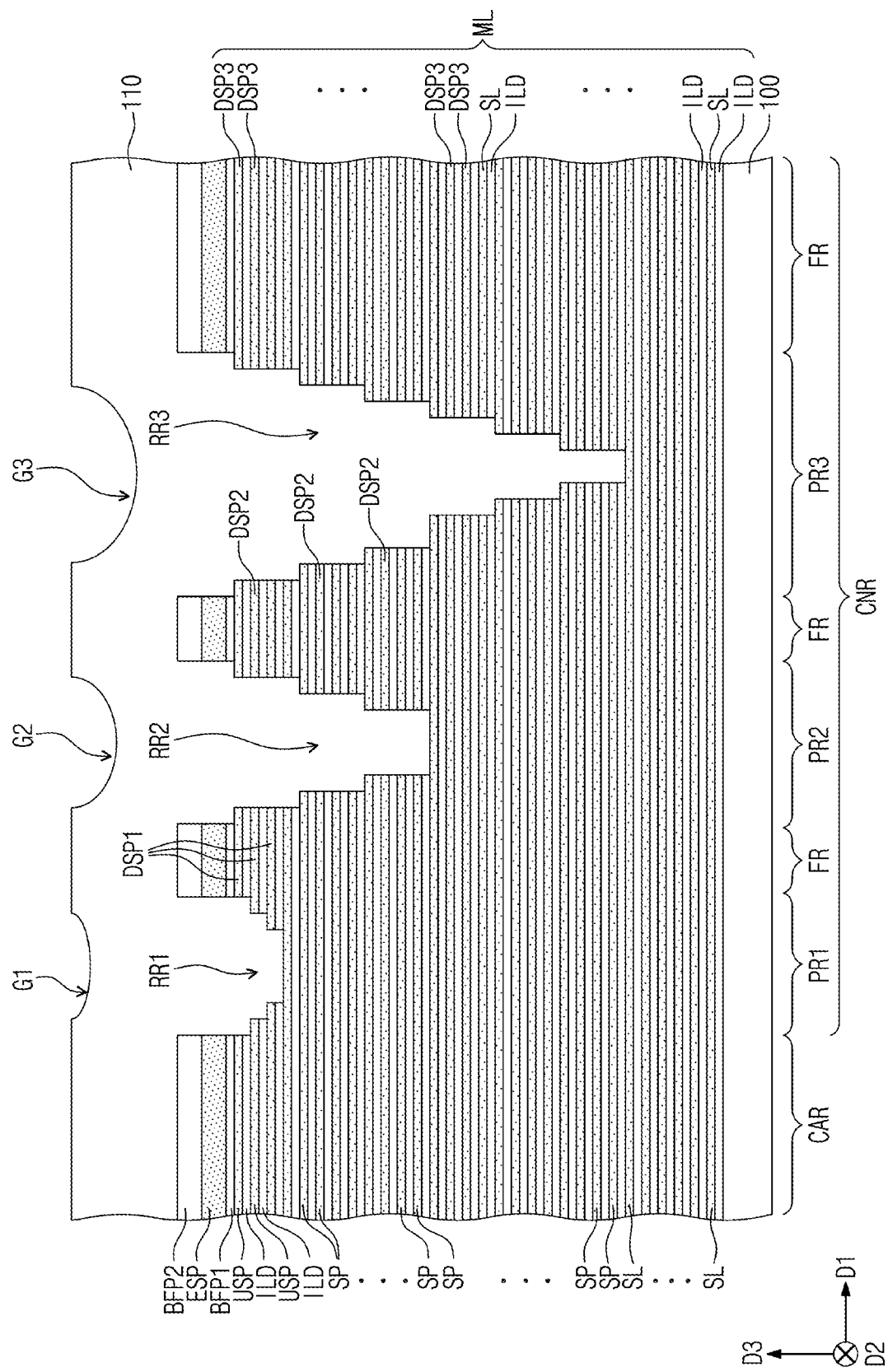

SEMICONDUCTOR DEVICE, ELECTRONIC SYSTEM INCLUDING THE SAME, AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0124188, filed on Sep. 16, 2021, in the Korean Intellectual Property Office, the disclosure of which is hereby incorporated by reference in its entirety.

BACKGROUND

1. Field

The present disclosure relates to a semiconductor device, an electronic system including the same, and a method of fabricating the same.

2. Description of the Related Art

It is necessary to have a semiconductor device capable of storing a large amount of data in an electronic system which requires data storage. Therefore, studies have been conducted to increase data storage capacity of the semiconductor device. For example, as an approach to increasing data storage capacity of the semiconductor device, a semiconductor device may include three-dimensionally arranged memory cells instead of two-dimensionally arranged memory cells.

SUMMARY

According to some embodiments, a semiconductor device may include a substrate including a cell array region and a connection region; and a stack structure including a plurality of dielectric layers and a plurality of electrodes that are vertically and alternately stacked on the substrate, the stack structure including a first pad part, a first fence part, a second pad part, and a second fence part that are sequentially arranged along a first direction. Each of the first and second pad parts of the stack structure may have: a first stepwise structure formed along the first direction; and a second stepwise structure formed along a second direction that intersects the first direction. Each of the first and second fence parts of the stack structure may include a plurality of dummy electrodes that are at levels the same as levels of the electrodes and are spaced apart in the first direction from the electrodes. The dummy electrodes on the first fence part may have: a first dummy stepwise structure formed along the first direction; and a second dummy stepwise structure formed along the second direction. Sidewalls of the electrodes that form the second stepwise structure on the second part may be offset from sidewalls of the dummy electrodes that form the second dummy stepwise structure on the first pad part.

According to some embodiments, a semiconductor device may include a substrate including a cell array region and a connection region; a stack structure including a plurality of dielectric layers and a plurality of electrodes that are vertically and alternately stacked on the substrate, the stack structure including a plurality of fence parts and a plurality of pad parts that are alternately disposed along a first direction on the connection region; and a plurality of buried dielectric patterns that cover the pad parts between the fence parts of the stack structure. Each of the pad parts of the stack structure may have: a first stepwise structure formed along the first direction; and a second stepwise structure formed along a second direction that intersects the first direction. The fence parts of the stack structure may have substantially the same thickness and extend along the second direction. Each of the buried dielectric patterns may have a rounded top surface.

According to some embodiments, an electronic system may include a semiconductor device including a cell array and an input/output pad that is electrically connected to the cell array and a peripheral circuit, the cell array including a substrate that includes a cell array region and a connection region, a stack structure that includes a plurality of dielectric layers and a plurality of electrodes that are vertically and alternately stacked on the substrate, the stack structure including a plurality of fence parts and a plurality of pad parts that are alternately disposed along a first direction on the connection region, and a plurality of buried dielectric patterns that cover the pad parts between the fence parts of the stack structure; and a controller electrically connected through the input/output pad to the semiconductor device, the controller controlling the semiconductor device. Each of the pad parts of the stack structure may have: a first stepwise structure formed along the first direction; and a second stepwise structure formed along a second direction that intersects the first direction. The fence parts of the stack structure may have a thickness that is uniform in the first direction and the second direction.

According to some embodiments, a method of fabricating a semiconductor device may include providing a substrate that includes a cell array region and a connection region, the connection region including a plurality of pad regions and a plurality of fence regions that are alternately arranged along a first direction; forming a preliminary mold structure including a plurality of dielectric layers and a plurality of sacrificial layers that are alternately stacked on the substrate; forming a plurality of etch stop patterns on the preliminary mold structure on the cell array region and the fence regions; patterning the preliminary mold structure to form a mold structure that has a plurality of recess regions on the pad regions; forming a buried dielectric layer that covers the mold structure; patterning the buried dielectric layer to form a plurality of protruding buried patterns on corresponding pad regions; and using the etch stop patterns as an etch stop layer to perform a planarization process on the protruding buried patterns.

BRIEF DESCRIPTION OF THE DRAWINGS

Features will become apparent to those of skill in the art by describing in detail exemplary embodiments with reference to the attached drawings, in which:

FIGS. 5A to 11A illustrate plan views showing stages in a method of forming a mold structure of a semiconductor device according to some embodiments.

FIGS. 5B to 11B illustrate cross-sectional views along line I-I' of FIGS. 5A to 11A, respectively.

FIGS. 13, 14, 15, and 16 illustrate cross-sectional views showing stages in a method of planarizing a buried dielectric layer that covers a mold structure of a semiconductor device according to some embodiments.

DETAILED DESCRIPTION

Figure 1:
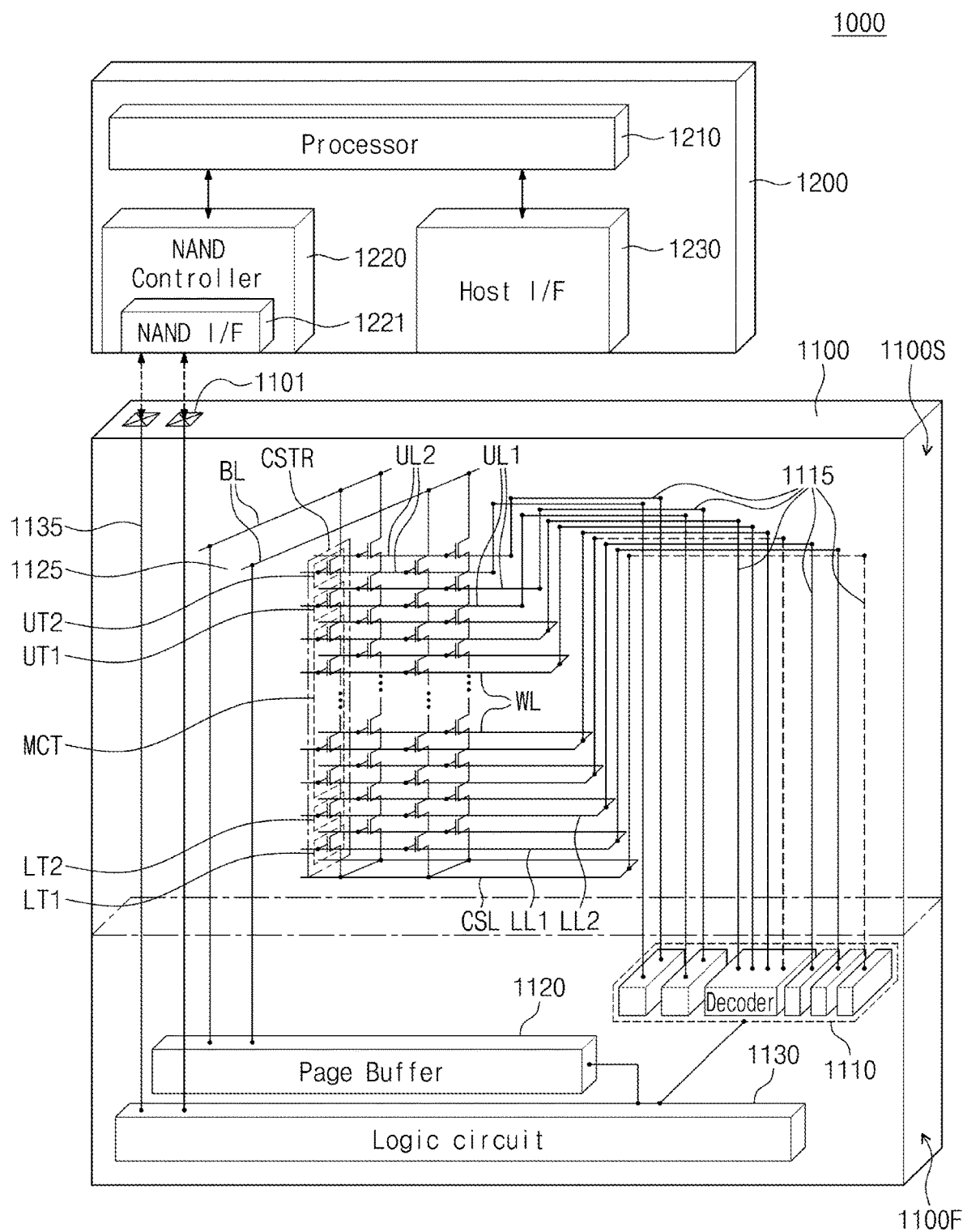
FIG. 1 illustrates a simplified schematic diagram showing an electronic system that includes a semiconductor device according to some embodiments.

FIG. 1 illustrates a simplified schematic diagram showing an electronic system that includes a semiconductor device according to some embodiments.

Referring to FIG. 1, an electronic system 1000 according to some embodiments may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, e.g., a NAND Flash memory device. The semiconductor device 1100 may include a first structure 1100F and a second structure 1100S on the first structure 1100F. In some embodiments, the first structure 1100F may be disposed on a side of the second structure 1100S. The first structure 1100F may be a peripheral circuit structure that includes a decoder circuit 1110, a page buffer 1120, and a logic circuit 1130. The second structure 1100S may be a memory cell structure that includes bit lines BL, a common source line CSL, word lines WL, first and second gate upper lines UL1 and UL2, first and second gate lower lines LL1 and LL2, and memory cell strings CSTR between the bit line BL and the common source line CSL.

For the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some example embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

For the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 that includes the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 2:
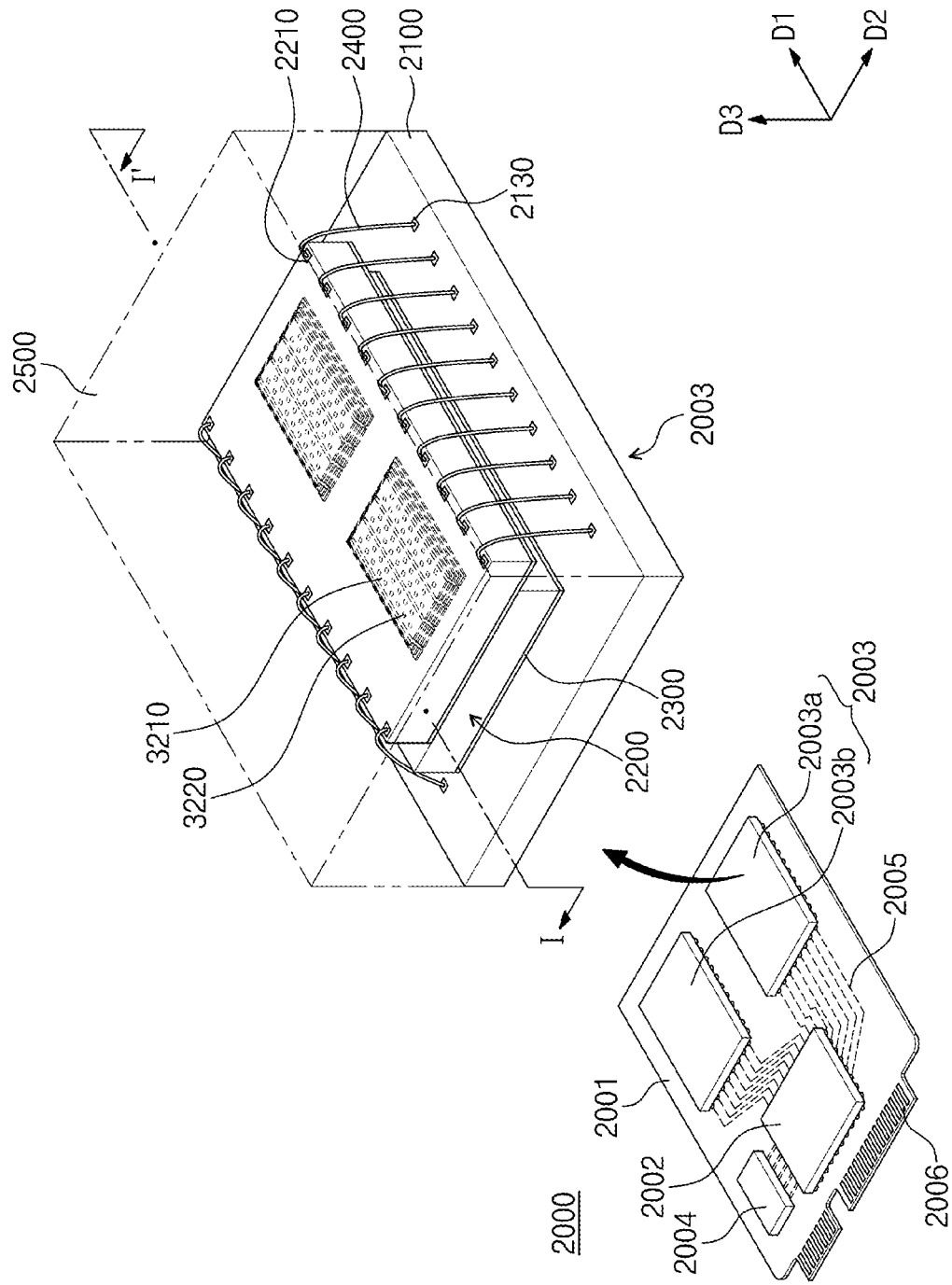
FIG. 2 illustrates a simplified perspective view showing an electronic system that includes a semiconductor device according to some embodiments.

FIG. 2 illustrates a simplified perspective view showing an electronic system that includes a semiconductor device according to some embodiments.

Referring to FIG. 2, an electronic system 2000 according to some embodiments may include a main board 2001, and may also include a controller 2002, at least one semiconductor package 2003, and a dynamic random access memory (DRAM) 2004 that are mounted on the main board 2001. The semiconductor package 2003 and the DRAM 2004 may be connected to the controller 2002 through wiring patterns 2005 formed on the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. In some embodiments, the electronic system 2000 may communicate with the external host through one or more interfaces, e.g., universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesion layers 2300 disposed on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including package upper pads 2130. Each of the semiconductor chips 2200 may include one or more input/output pads 2210. The input/output pad 2210 may correspond to the input/output pad 1101 of FIG. 1. Each of the semiconductor chips 2200 may include stack structures 3210 and vertical structures 3220. Each of the semiconductor chips 2200 may include a semiconductor device according to some embodiments which will be discussed below.

In some embodiments, the connection structures 2400 may be bonding wires that electrically connect the input/output pads 2210 to the package upper pads 2130. Therefore, on each of the first and second semiconductor packages 2003a and 2003b, the semiconductor chips 2200 may be electrically connected to each other in a wire bonding manner, and may be electrically connected to the package upper pads 2130 of the package substrate 2100. In some embodiments, on each of the first and second semiconductor packages 2003a and 2003b, the semiconductor chips 2200 may be electrically connected to each other through connection structures, e.g., through silicon vias (TSV), instead of the connection structures 2400 shaped like bonding wires.

In some embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 3:
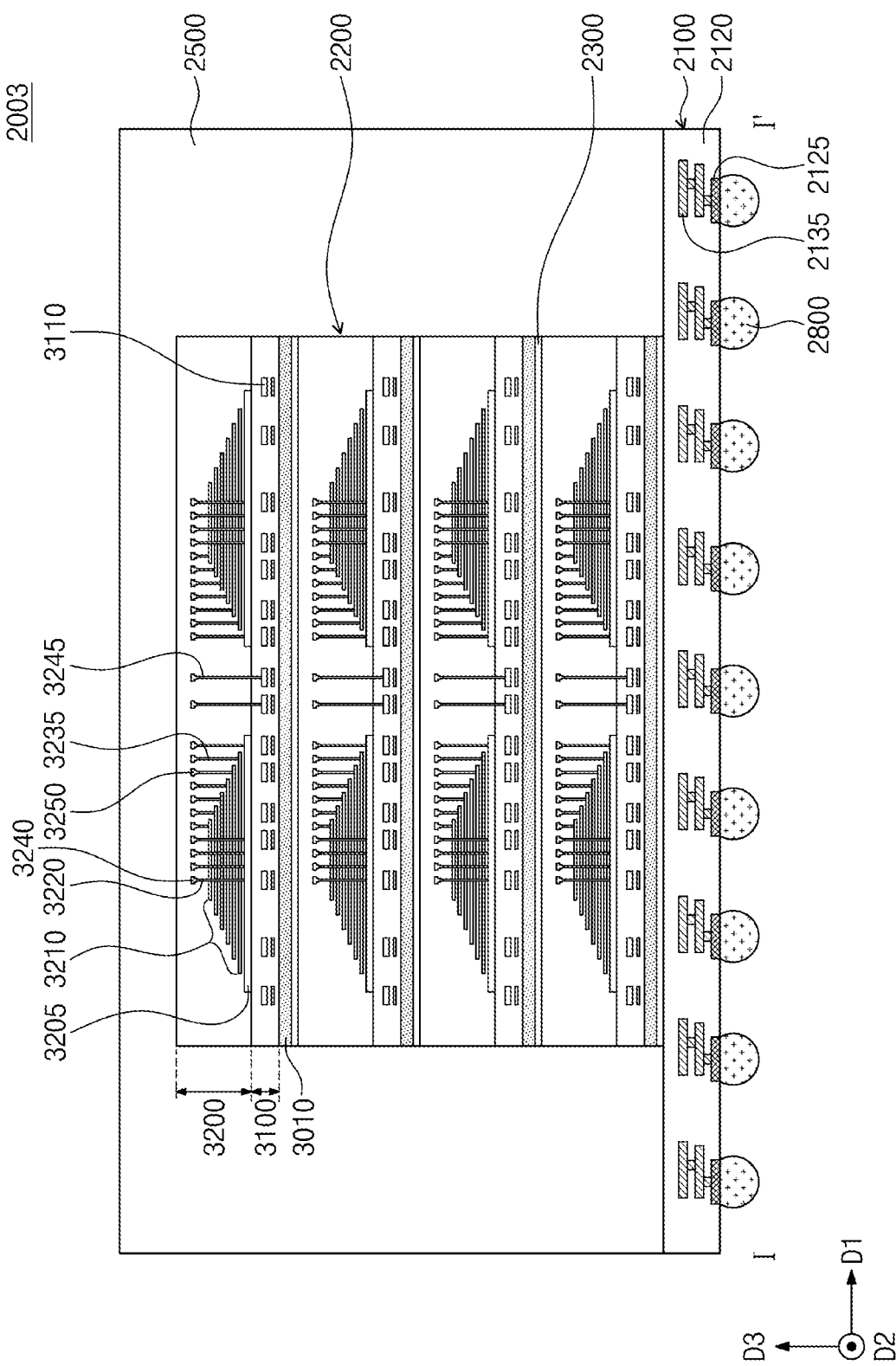
FIGS. 3 and 4 illustrate simplified cross-sectional views showing a semiconductor package according to some embodiments.
Figure 4:
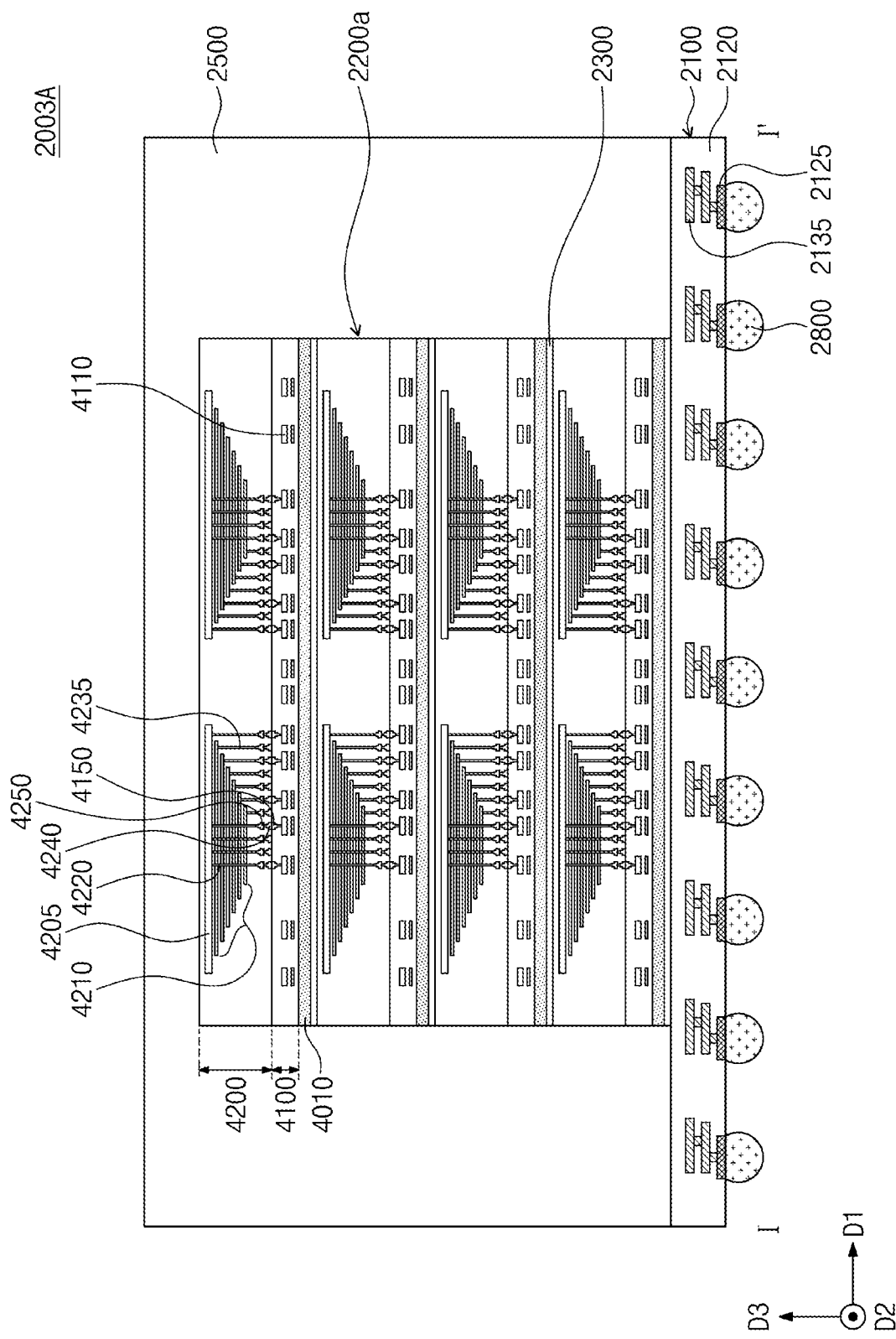

FIGS. 3 and 4 illustrate simplified cross-sectional views showing a semiconductor package according to some embodiments. FIGS. 3 and 4 each depicts an example of the semiconductor package illustrated in FIG. 2, conceptually showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, package upper pads (see 2130 of FIG. 2) disposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The package upper pads 2130 may be electrically connected to the connection structures 2400. The lower pads 2125 may be connected through conductive connectors 2800 to the wiring patterns 2005 of the main board 2001 in the electronic system 2000, as shown in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 and separation structures that penetrate the stack structure 3210, bit lines 3240 electrically connected to the vertical structures 3220, and cell contact plugs 3235 electrically connected to word lines (see WL of FIG. 1) of the stack structure 3210. Each of the first structure 3100, the second structure 3200, and the semiconductor chips 2200 may further include a metal structure which will be discussed below.

Each of the semiconductor chips 2200 may include one or more through lines 3245 that electrically connect with the peripheral wiring lines 3110 of the first structure 3100 and extend into the second structure 3200. The through line 3245 may be disposed outside the stack structure 3210 and may further be disposed to penetrate the stack structure 3210.

Each of the semiconductor chips 2200 may further include one or more input/output pads (see 2210 of FIG. 2) electrically connected to the peripheral wiring lines 3110 of the first structure 3100.

Referring to FIG. 4, a semiconductor package 2003A may be configured such that each of semiconductor chips 2200a may include a semiconductor substrate 4010, a first structure 4100 on the semiconductor substrate 4010, and a second structure 4200 disposed on and wafer-bonded to the first structure 4100.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 and separation structures that penetrate the stack structure 4210, and second bonding structures 4250 electrically connected to corresponding word lines (see WL of FIG. 1) of the stack structure 4210. For example, the second bonding structures 4250 may be electrically connected to the vertical structures 4220 through bit lines 4240 electrically connected to the vertical structures 4220, and may also be electrically connected to the word lines (see WL of FIG. 1) through cell contact plugs 4235 electrically connected to the word lines (see WL of FIG. 1). The first bonding structures 4150 of the first structure 4100 and the second bonding structures 4250 of the second structure 4200 may be coupled to each other while being in contact with each other. The first and second bonding structures 4150 and 4250 may have their bonding portions formed of, e.g., copper (Cu).

Each of the first structure 4100, the second structure 4200, and the semiconductor chips 2200a may further include a metal structure which will be discussed below. Each of the semiconductor chips 2200a may further include one or more input/output pads (see 2210 of FIG. 2) electrically connected to the peripheral wiring lines 4110.

The semiconductor chips 2200 of FIG. 3 may be electrically connected to each other through the connection structures 2400 shaped like bonding wires, and this may also be applicable to the semiconductor chips 2200a of FIG. 4. In some embodiments, semiconductor chips, such as the semiconductor chips 2200 of FIG. 3 or the semiconductor chips 2200a of FIG. 4, in a single semiconductor package may be electrically connected to each other through one or more connection structures that include through electrodes, e.g., TSV (through silicon via).

The first structure 3100 of FIG. 3 and the first structure 4100 of FIG. 4 may correspond to a peripheral circuit structure which will be discussed below. The second structure 3200 of FIG. 3 and the second structure 4200 of FIG. 4 may correspond to a cell array structure CS which will be discussed below.

FIGS. 5A to 11A illustrate plan views of stages in a method of forming a mold structure of a semiconductor device according to some embodiments. FIGS. 5B to 11B illustrate cross-sectional views taken along line I-I' of FIGS. 5A to 11A, showing stages in the method of forming a mold structure of a semiconductor device according to some embodiments. FIGS. 6C, 7C, and 8C illustrate cross-sectional views taken along line II-IF of FIGS. 6A, 7A, and 8A, respectively, and FIGS. 6D, 7D, and 8D illustrate cross-sectional views taken along line of FIGS. 6A, 7A, and 8A, respectively.

Figure 5A:
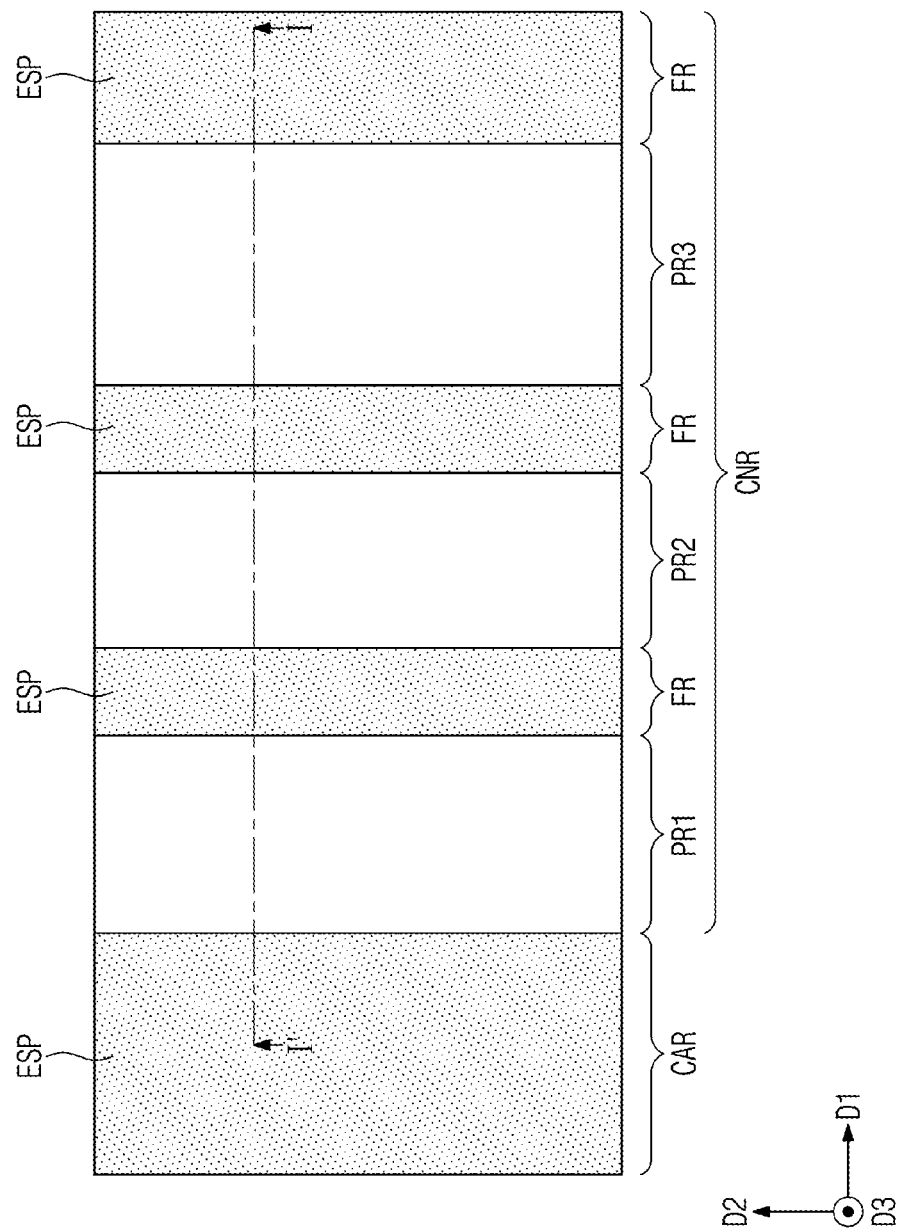
Figure 5B:
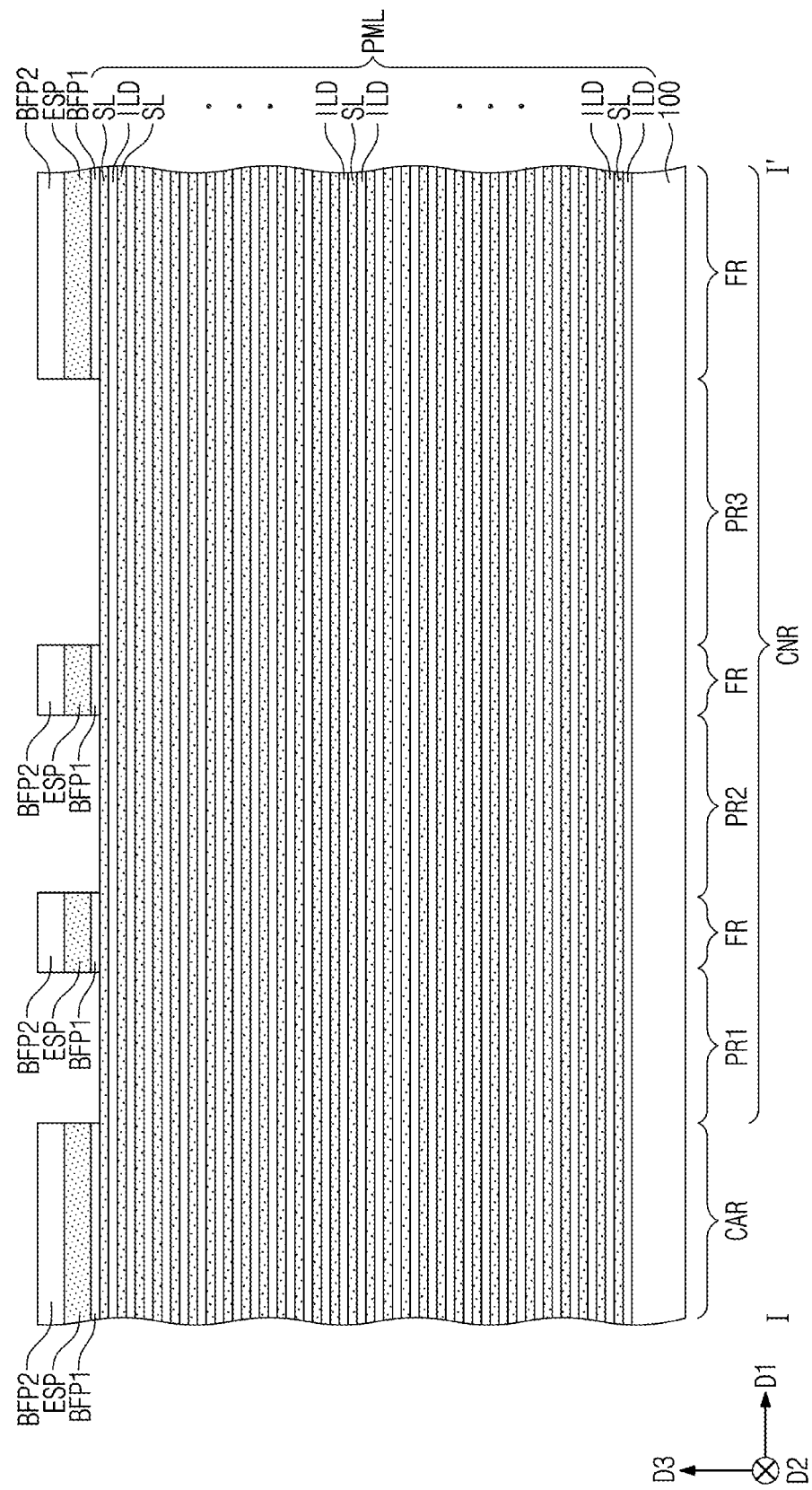

Referring to FIGS. 5A and 5B, a substrate 100 may include a cell array region CAR and a connection region CNR. The connection region CNR may include pad regions PR1, PR2, and PR3, and fence region FR that are arranged alternately along a first direction D1. For example, the pad regions PR1, PR2, and PR3 may include a first pad region PR1, a second pad region PR2, and a third pad region PR3 that are sequentially arranged along the first direction D1. The first pad region PR1 may be adjacent to the cell array region CAR, and the fence region FR may be provided between every two of the first, second, and third pad regions PR1, PR2, and PR3.

On the substrate 100, a preliminary mold structure PML may be formed in which sacrificial layers SL and dielectric layers ILD may be vertically and alternately stacked. For the preliminary mold structure PML, the sacrificial layers SL may be formed of a material having an etch selectivity with respect to the dielectric layers ILD. For example, the sacrificial layers SL and the dielectric layers ILD may be formed of dielectric materials having a different etch selectivity with respect to each other. For example, the sacrificial layers SL may include a dielectric material different from that of the dielectric layers ILD. For example, the sacrificial layers SL may be formed of a silicon nitride layer, and the dielectric layers ILD may be formed of a silicon oxide layer.

A first buffer dielectric layer, an etch stop layer, and a second buffer dielectric layer may be sequentially stacked on the preliminary mold structure PML. The etch stop layer may be formed of a material having an etch selectivity with respect to the first and second buffer dielectric layers. For example, the first and second buffer dielectric layers may include a silicon oxide layer, and the etch stop layer may include a silicon nitride layer or a silicon oxynitride layer. The second buffer dielectric layer may be thicker than the first buffer dielectric layer.

Afterwards, the first buffer dielectric layer, the etch stop layer, and the second buffer dielectric layer may by patterned to form first buffer dielectric patterns BFP1, etch stop patterns ESP, and second buffer dielectric patterns BFP2 on the preliminary mold structure PML. The etch stop patterns ESP may expose the preliminary mold structure PML on, e.g., regions vertically overlapping, the first, second, and third pad regions PR1, PR2, and PR3. The etch stop patterns ESP may have their linear shapes that extend in a second direction D2 and may be spaced apart from each other in the first direction D1 (FIG. 5A). The etch stop patterns ESP may be formed on, e.g., regions vertically overlapping, the cell array region CAR and the fence regions FR (FIG. 5B).

Referring to FIGS. 6A, 6B, 6C, and 6D, a first mask pattern MP1 may be formed on the preliminary mold structure PML on which the etch stop patterns ESP are formed. For example, the formation of the first mask pattern MP1 may include coating a first photoresist layer that covers an entire surface of the preliminary mold structure PML, and performing exposure and development processes on the first photoresist layer.

Figure 6A:
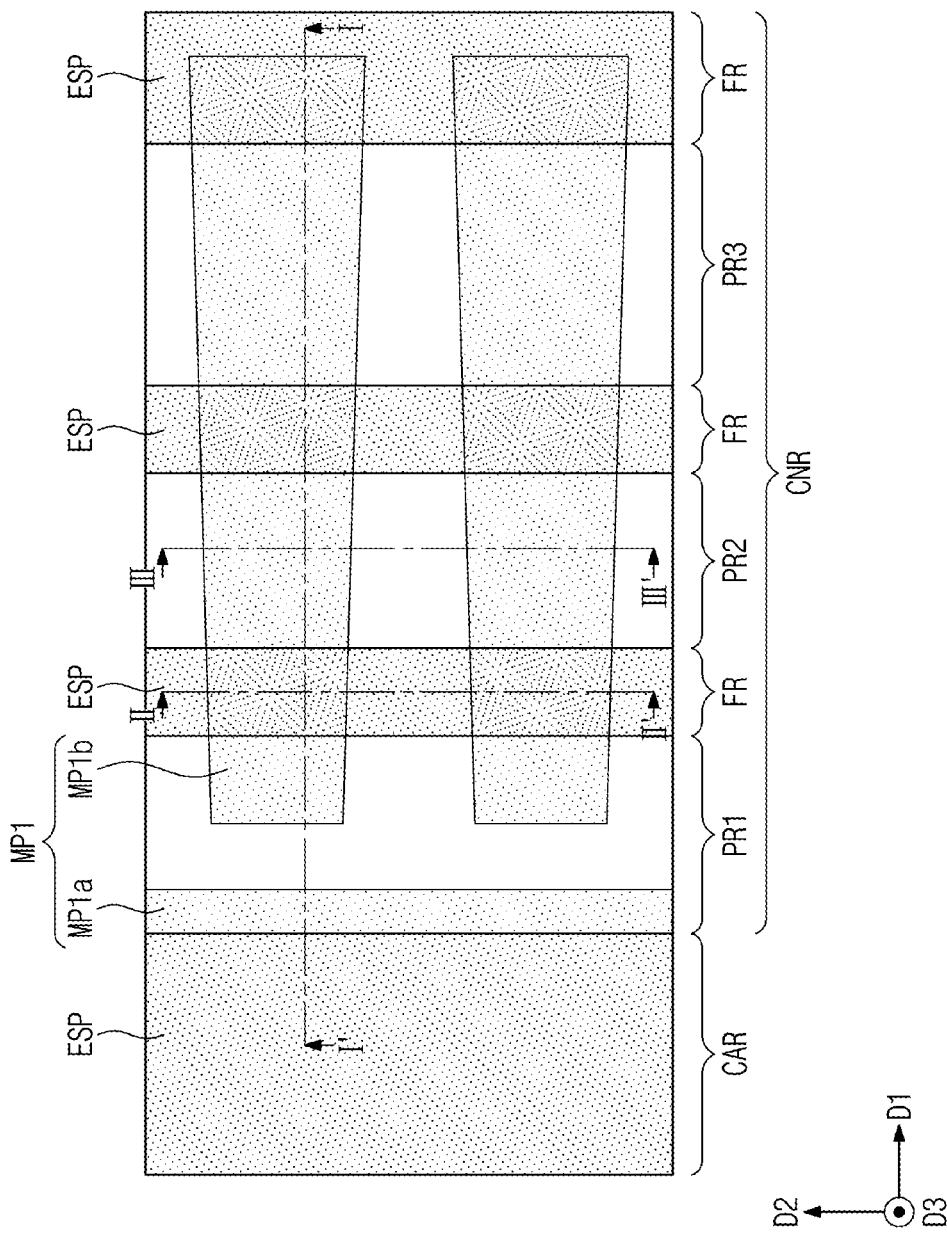
Figure 6B:
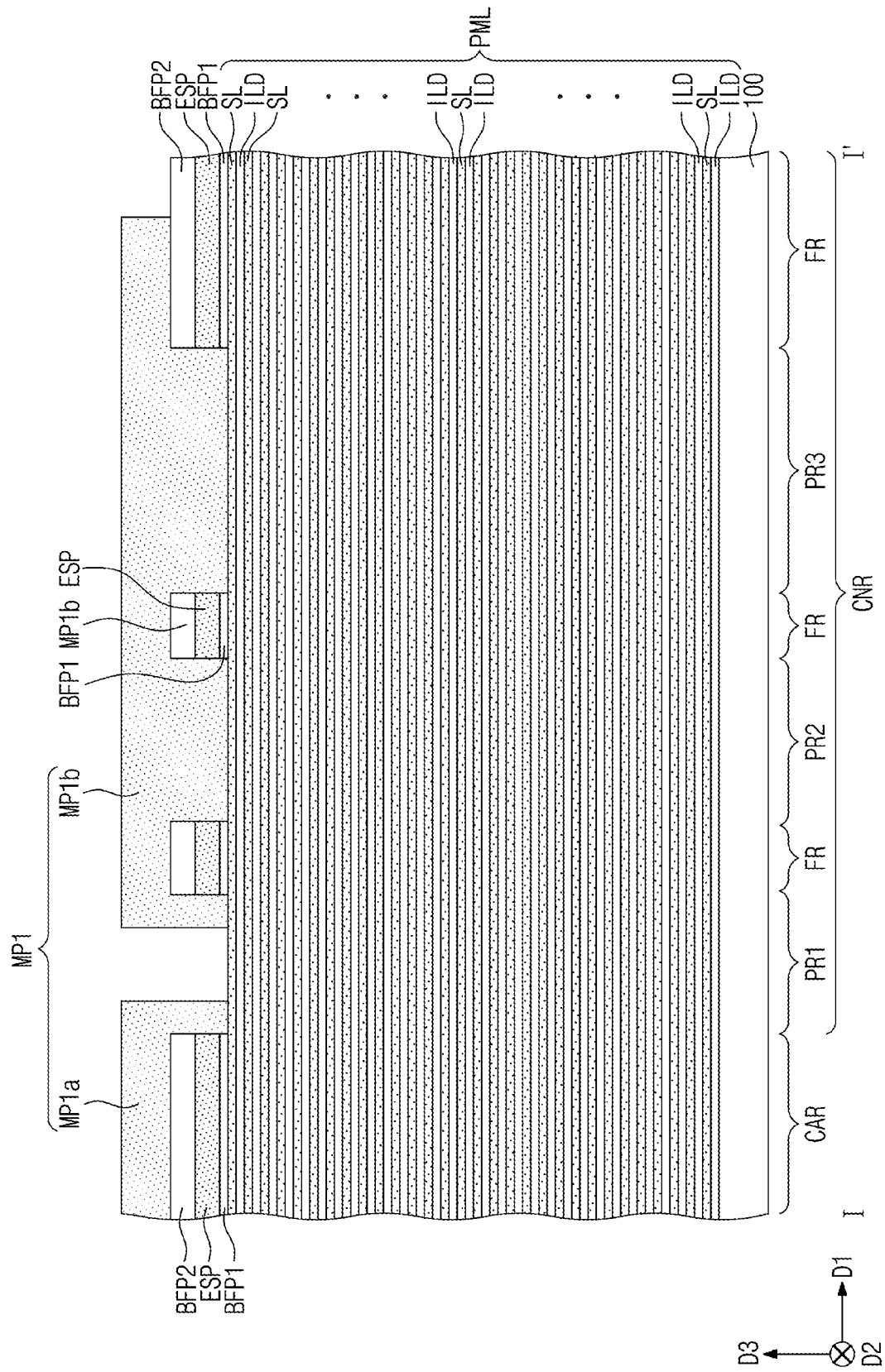
Figure 6C:
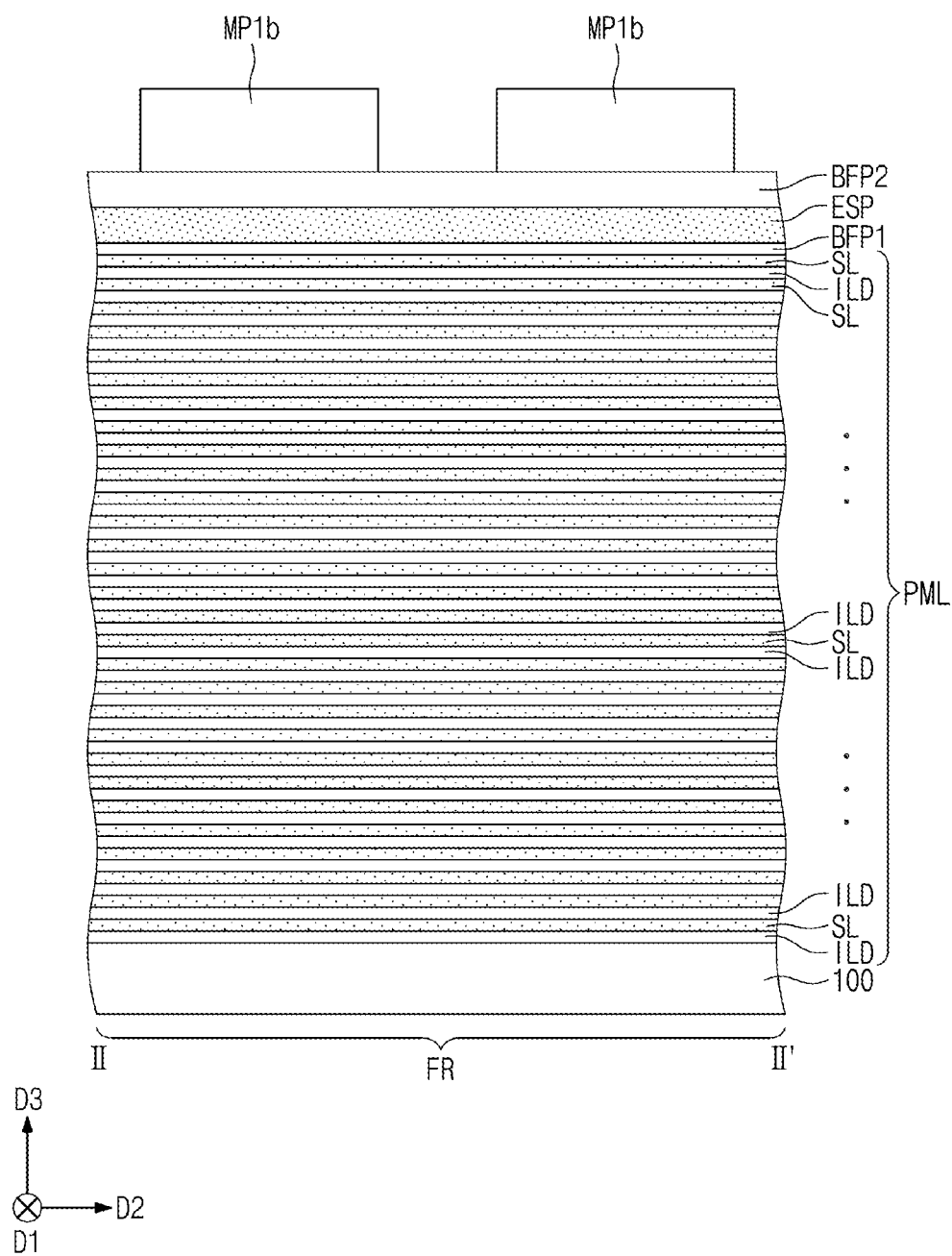
FIGS. 6C, 7C, and 8C illustrate cross-sectional views along line II-IF of FIGS. 6A, 7A, and 8A, respectively.
Figure 6D:
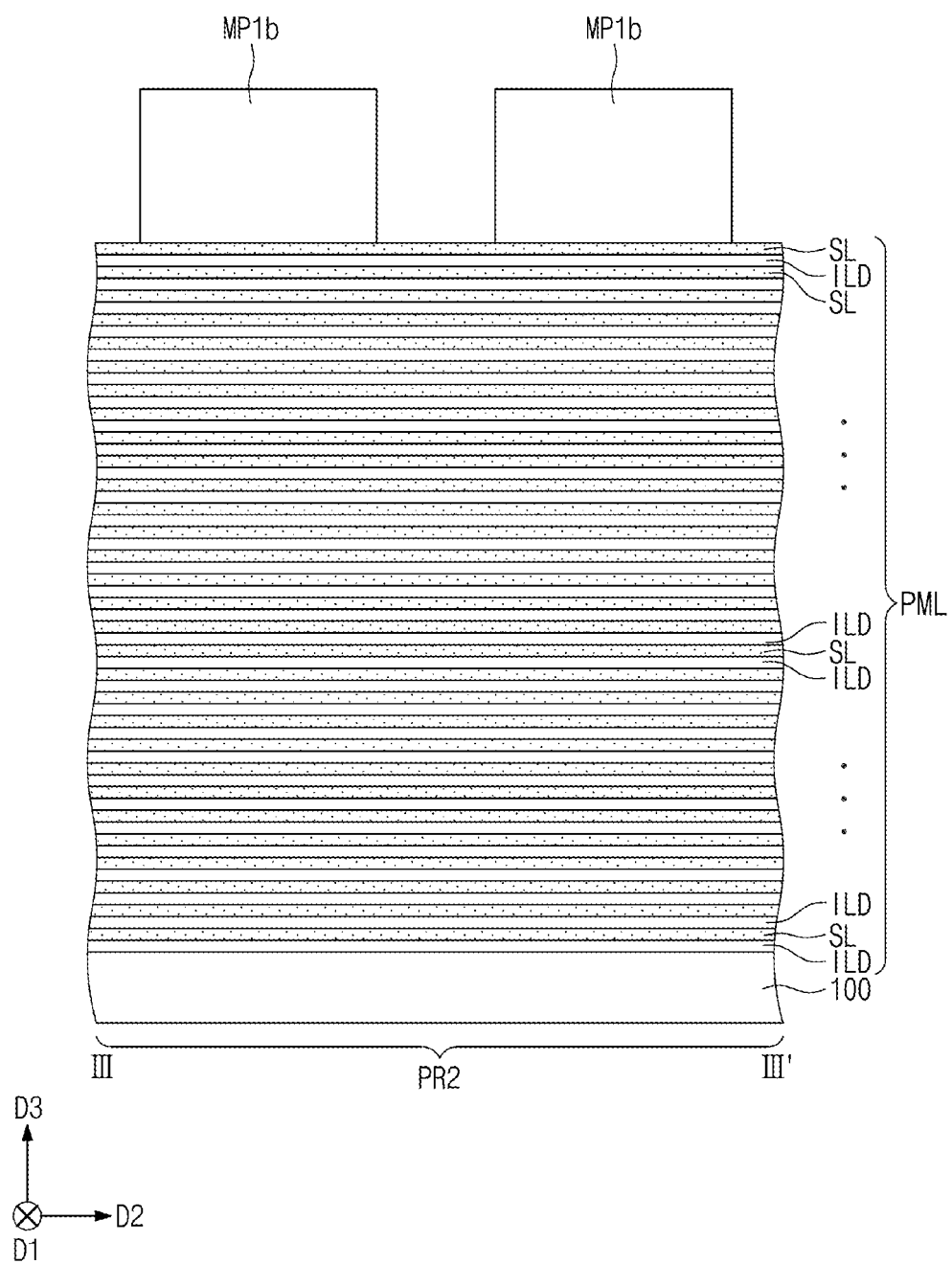
FIGS. 6D, 7D, and 8D illustrate cross-sectional views along line of FIGS. 6A, 7A, and 8A, respectively.
Figure 7A:
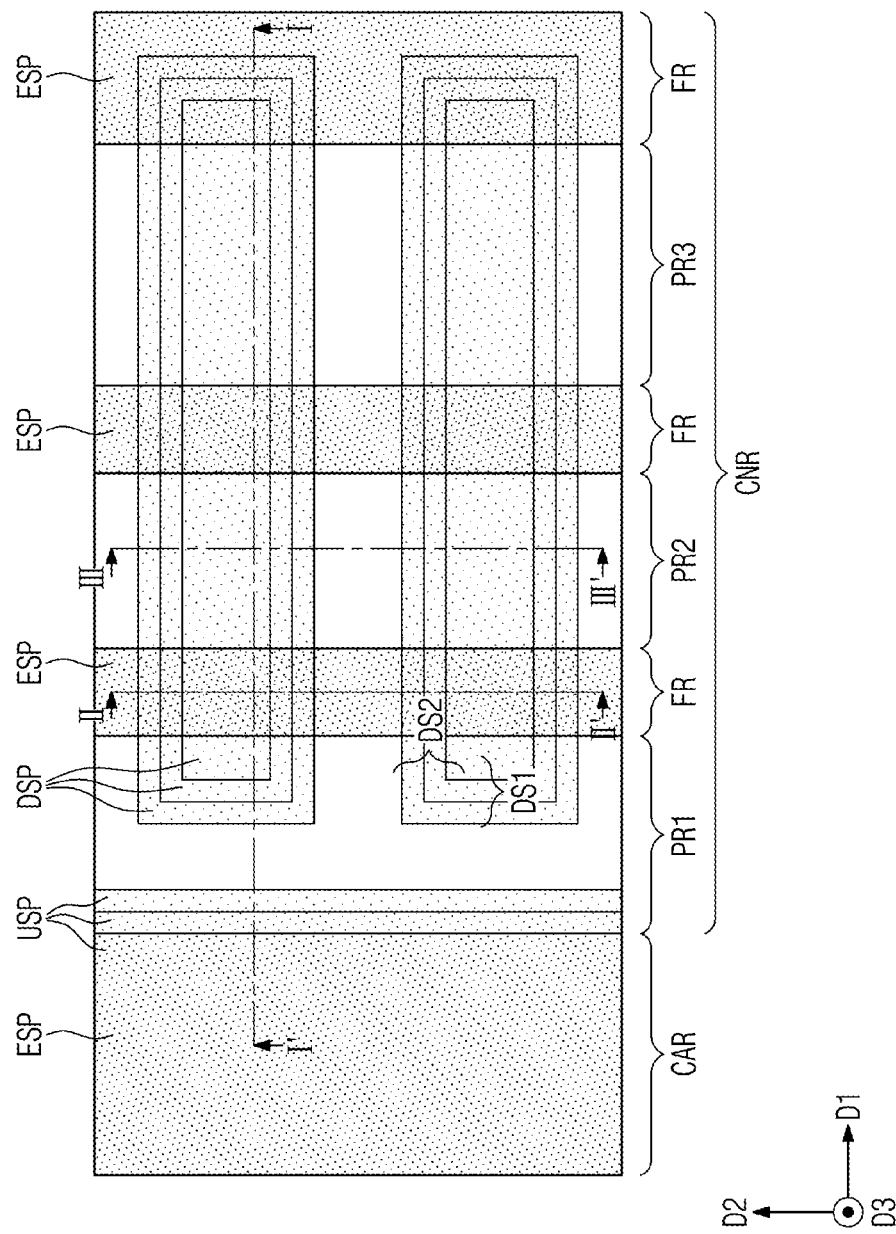
Figure 7B:
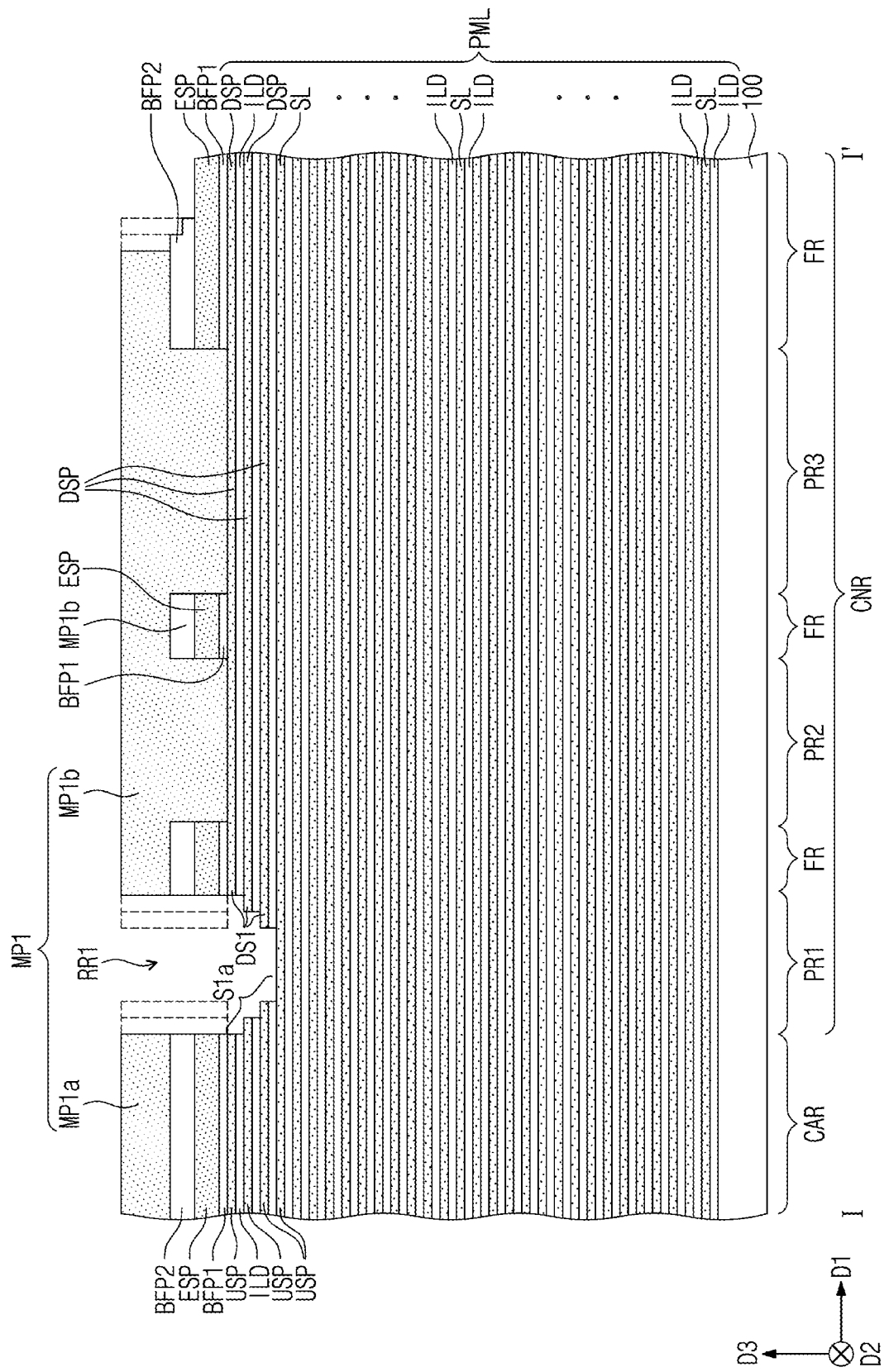
Figure 7C:
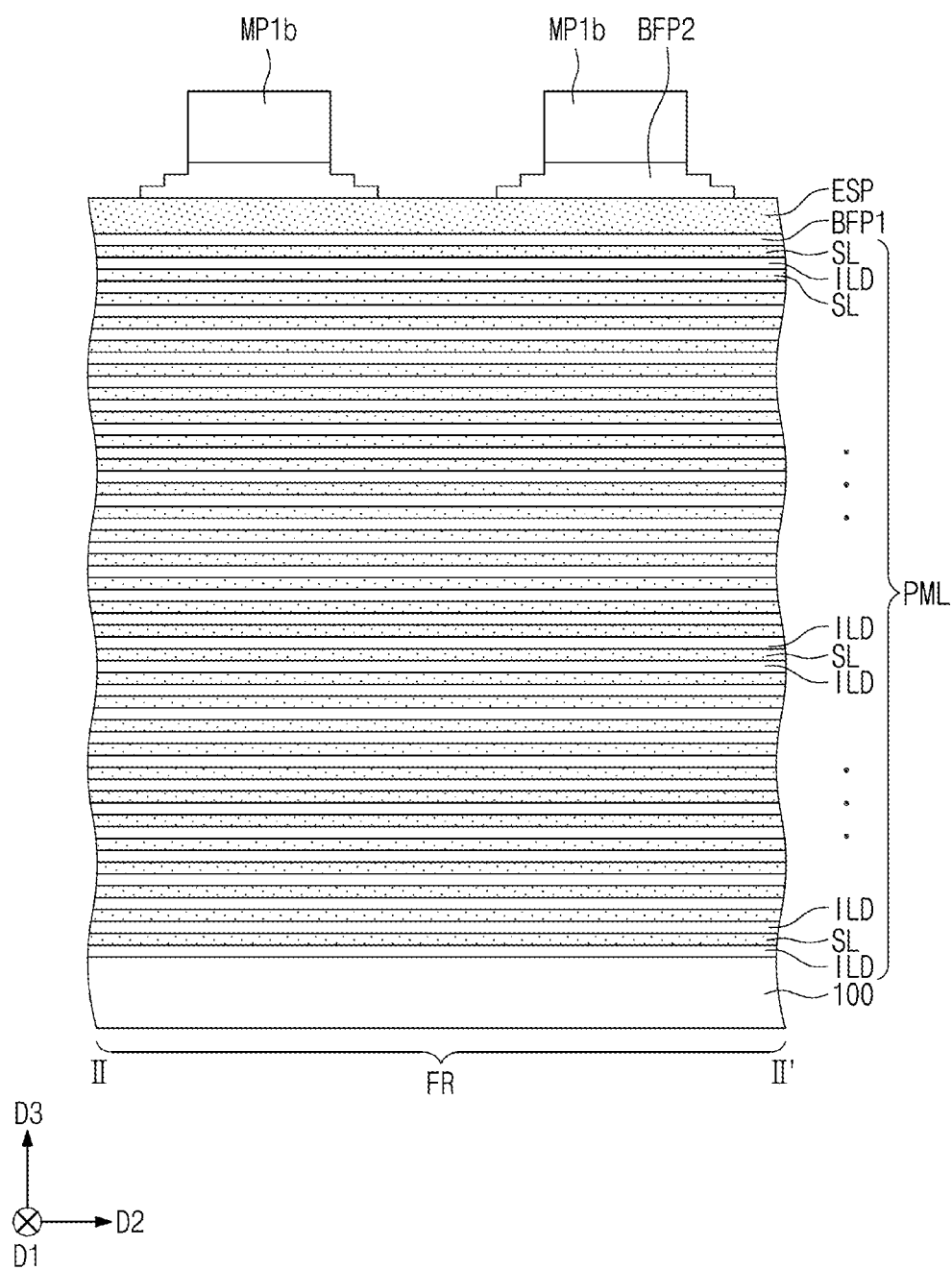
Figure 7D:
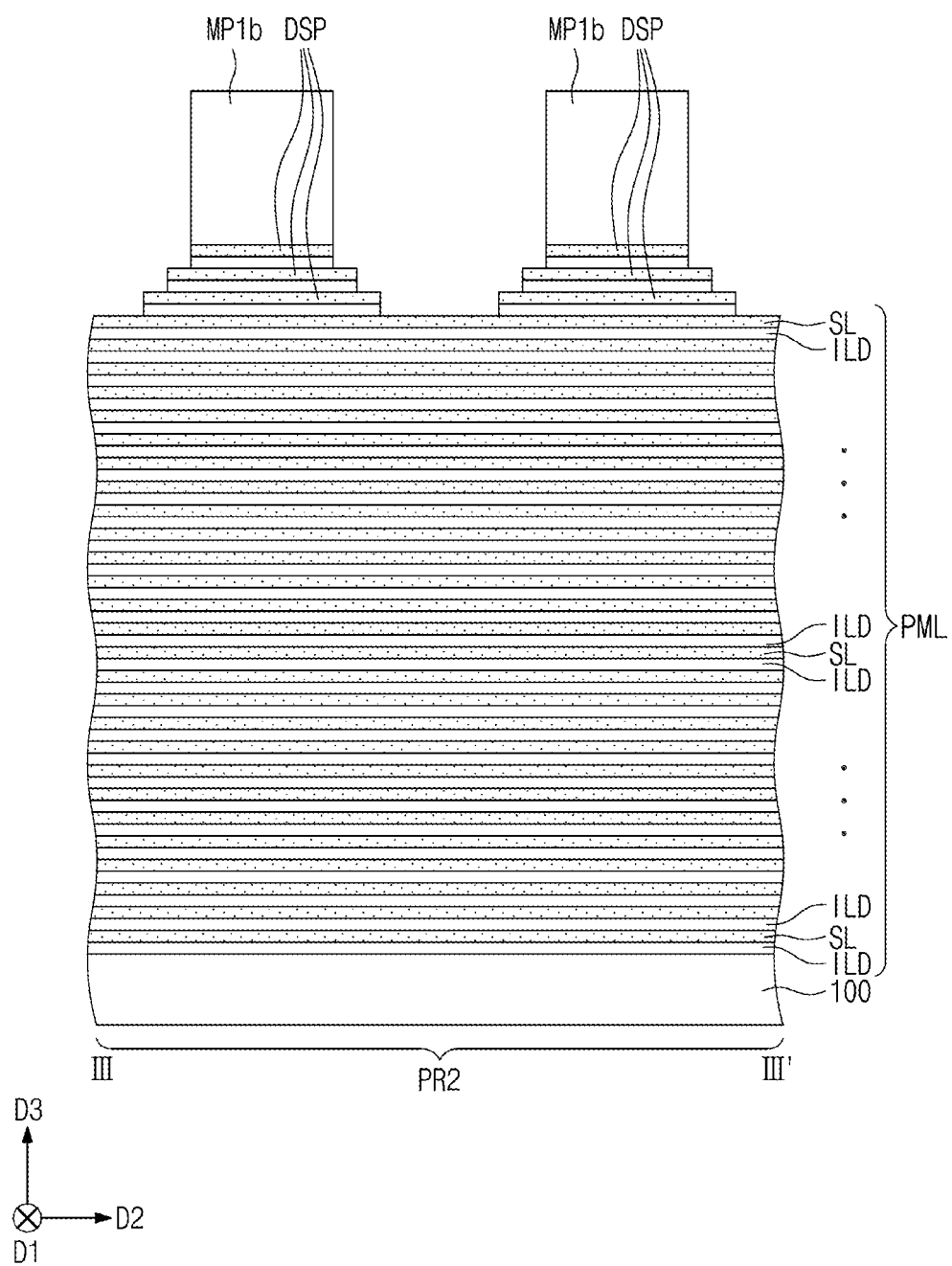
Figure 8A:
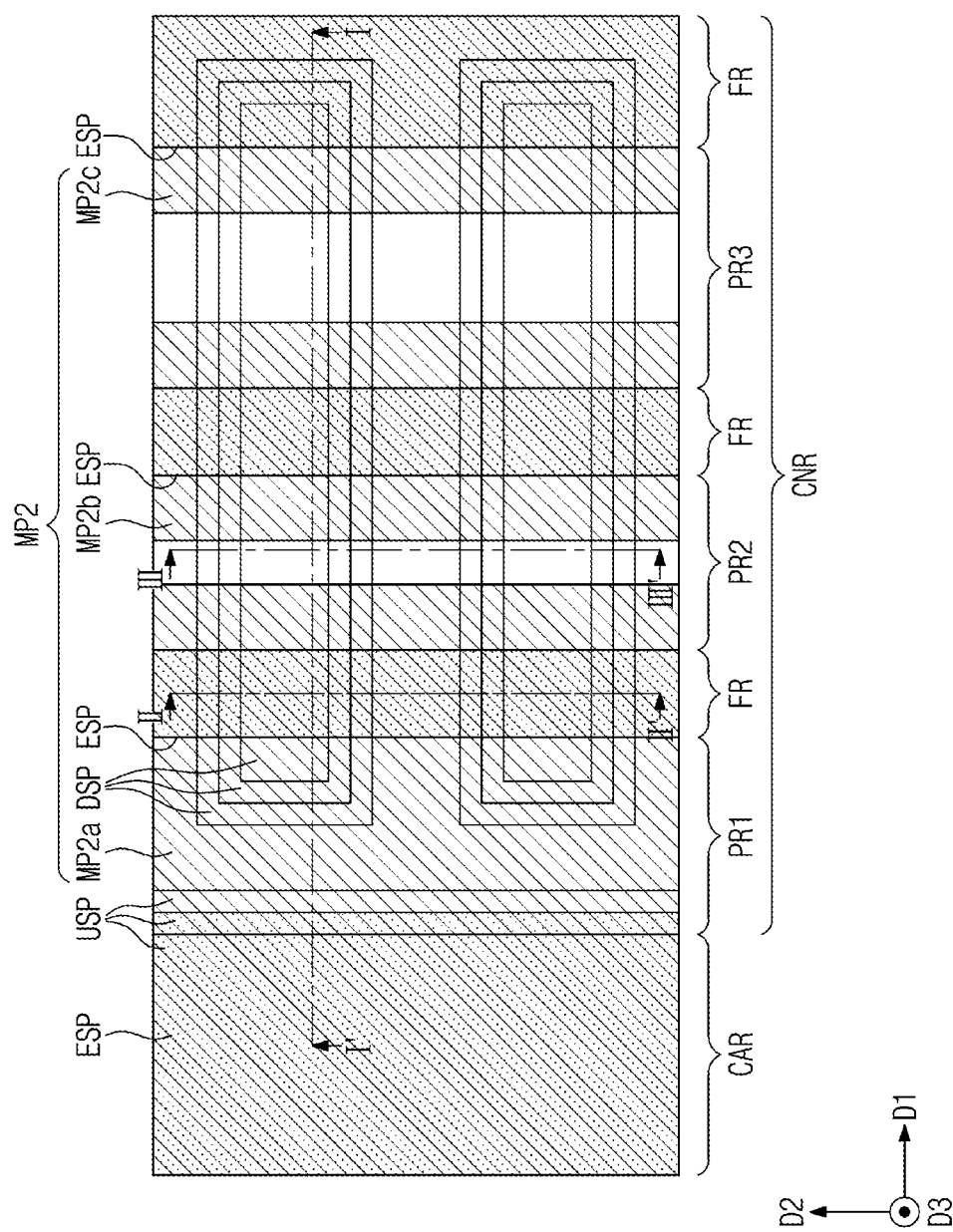
Figure 8C:
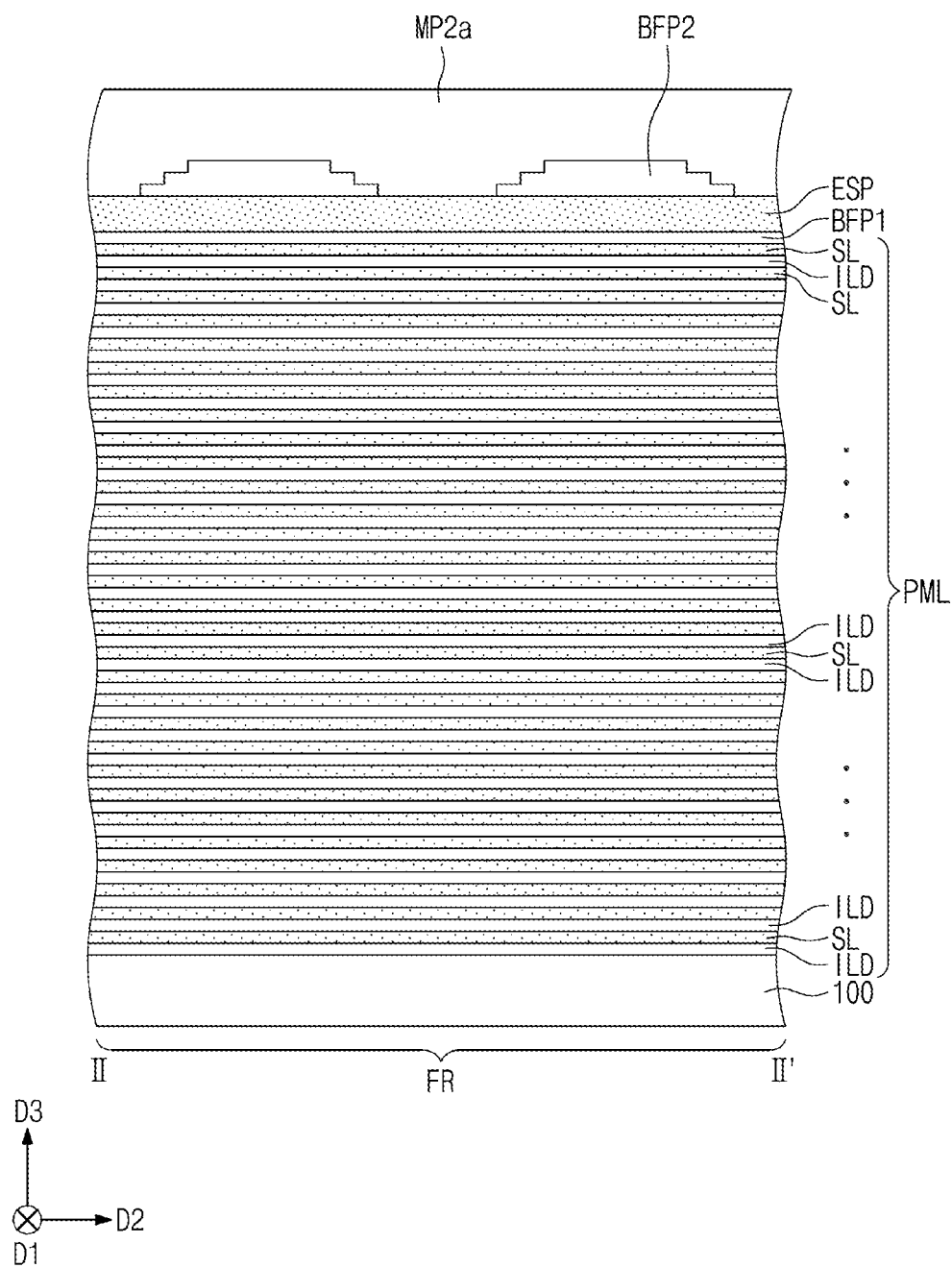
Figure 8D:
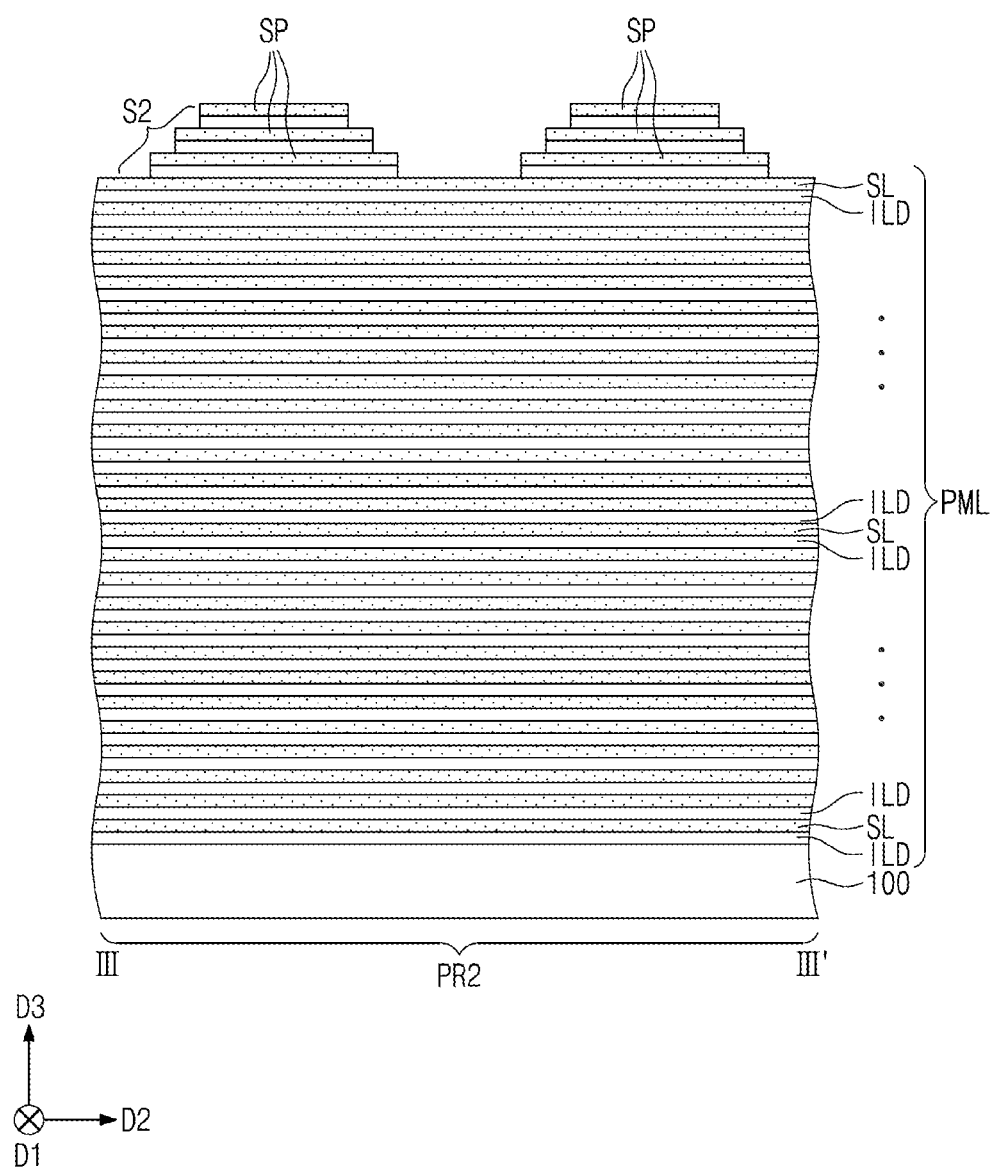

In detail, on the connection region CNR, the first mask pattern MP1 may expose a portion of the preliminary mold structure PML. For example, the first mask pattern MP1 may extend in the second direction D2, and may include a first part MP1a that covers the cell array region CAR and second parts MP1b that are spaced apart from the first part MP1a to cover portions of the connection region CNR. The second parts MP1b may extend in the first direction D1 and may be spaced apart from each other in the second direction D2. The second parts MP1b may each have an island shape on the preliminary mold structure PML, e.g., as viewed in a top view (FIG. 6A). The first and second parts MP1a and MP1b of the first mask pattern MP1 may be spaced apart from each other, e.g., in the first direction D1, on the first pad region PR1.

The first mask pattern MP1 may have a top surface located at a higher level than that of a top surface of the second buffer dielectric pattern BFP2. The first mask pattern MP1 may cover sidewalls of the etch stop patterns ESP and sidewalls of the first and second buffer dielectric patterns BFP1 and BFP2.

The number of times of subsequent etching process performed on the preliminary mold structure PML may be greater on the third pad region PR3 far away from the cell array region CAR than on the first pad region PR1 adjacent to the cell array region CAR. In consideration of the difference mentioned above, the second parts MP1b of the first mask pattern MP1 may have their widths in the second direction D2, and the first mask pattern MP1 may have a width that increases in a direction oriented away from the cell array region CAR. For example, as illustrated in FIG. 6A, the second parts MP1b of the first mask pattern MP1 may have their minimum widths on the first pad region PR1, e.g., and may have their widths increase in a direction oriented from the first pad region PR1 toward the third pad region PR3, and may have trapezoidal top surfaces, e.g., may have trapezoidal shapes in a top view.

Referring to FIGS. 7A, 7B, 7C, and 7D, the first mask pattern MP1 may be used as an etching mask to alternately and repeatedly perform a first etching process on a portion of the preliminary mold structure PML and a first trimming process that reduces an area of the first mask pattern MP1. Therefore, on the cell array region CAR, an upper structure may be formed to include upper sacrificial patterns USP, and an upper dummy structure may be formed to include dummy sacrificial patterns DSP. In addition, on the first pad region PR1, a first recess region RR1 may be formed in the preliminary mold structure PML.

For example, the first etching process may be performed such that the first mask pattern MP1 is used as an etching mask to etch the preliminary mold structure PML to a first etching depth. The first etching depth may correspond to a vertical pitch of the sacrificial layers SL, and the vertical pitch of the sacrificial layers SL may indicate a vertical distance between top surfaces of the sacrificial layers SL vertically adjacent to each other. For example, the vertical pitch of the sacrificial layers may denote an interval in a third direction D3 between the sacrificial layers SL.

In some embodiments, as the first etching process is performed, one sacrificial layer SL may be etched to form an upper sacrificial pattern USP and a dummy sacrificial pattern DSP. The upper sacrificial patterns USP may cover the cell array region CAR and a portion of the first pad region PR1. The dummy sacrificial patterns DSP may be located at the same levels as those of the upper sacrificial patterns USP and may be spaced apart from each other in the first direction D1, e.g., separated by the first recess region RR1.

The first trimming process may expand a zone that is exposed by the first mask pattern MP1, and may partially expose the upper sacrificial pattern USP and the dummy sacrificial pattern DSP that are formed in the previous step. The first trimming process may cause sidewalls of the first and second parts MP1a and MP1b to horizontally move certain distances in the first and second directions D1 and D2. In this case, widths of pad parts of sacrificial patterns (or electrodes) to which contact plugs are coupled may depend on movement lengths of the sidewalls of the first mask pattern MP1.

For example, the first trimming process may include an isotropic dry etching process or a wet etching process. In addition, in the first trimming process, the first mask pattern MP1 may be etched back to recess the top surface of the first mask pattern MP1. For example, the first trimming process may reduce an area and a thickness of the first mask pattern MP1.

The number of stair steps of a stepwise structure, e.g., a structure having a step-shaped cross-section, may depend on the number of times of the first etching process and the first trimming process. For example, each of the first etching process and the first trimming process may be performed three to five times.

The upper structure may include the upper sacrificial patterns USP that are vertically stacked on the cell array region CAR and the first pad region PR1, and the upper sacrificial patterns USP may constitute an upper stepwise structure S1a along the first direction D1 on the first pad region PR1. As the vertical distance from the substrate 100 increases, lengths in the first direction D1 of the upper sacrificial patterns USP may decrease. A height of the stair step of the upper stepwise structure S1a may correspond to the vertical pitch of the sacrificial layers SL.

The upper dummy structure may include the dummy sacrificial patterns DSP that are vertically stacked, and the dummy sacrificial patterns DSP may form a first dummy stepwise structure DS1 along the first direction D1 and a second dummy stepwise structure DS2 along the second direction D2. The first dummy stepwise structure DS1 may be formed to face in the first direction D1 toward the upper stepwise structure S1a. The first dummy stepwise structure DS1 may have a slope substantially the same as that of the second dummy stepwise structure DS2, e.g., the slope may be an inclination angle of a line connecting a topmost outer edge of the stepwise structure and a bottommost outer edge of the stepwise structure with respect to a bottom surface of the substrate 100. The upper dummy structure may have the second dummy stepwise structure DS2 in the second direction D2 on the fence regions FR and the second and third pad regions PR2 and PR3.

In some embodiments, during the formation of the upper structure and the upper dummy structure, a portion of the second buffer dielectric pattern BFP2 may be patterned into a stepwise structure on the fence regions FR. After the formation of the upper structure and the upper dummy structure, the trimmed first mask pattern MP1 may be removed.

Referring to FIGS. 8A, 8B, 8C, and 8D, a second mask pattern MP2 may be formed on the preliminary mold structure PML.

The second mask pattern MP2 may have openings that expose the preliminary mold structure PML on, e.g., regions overlapping, the second pad region PR2 and the third pad region PR3. The second mask pattern MP2 may have a linear shape that extends in the second direction D2. The second mask pattern MP2 may include a first part MP2a that covers the cell array region CAR and the first pad region PR1, and may also include second and third parts MP2b and MP2c that cover the fence regions FR. The second mask pattern MP2 may expose the second dummy stepwise structure DS2 of the upper dummy structure on the second and third pad regions PR2 and PR3.

For example, the formation of the second mask pattern MP2 may include coating a second photoresist layer that covers entire surfaces of structures on the substrate 100, and performing exposure and development processes on the second photoresist layer.

The second mask pattern MP2 may be used as an etching mask to perform a second etching process that etch the dummy sacrificial patterns DSP and the sacrificial layers SL to a second etching depth. The second etching depth may be at least twice the vertical pitch of the sacrificial layers SL. For example, the second etching process may etch portions of at least two dummy sacrificial patterns DSP and also etch two or more sacrificial layers SL. For example, four sacrificial layers SL may be etched in the second etching process.

The second etching process performed on the preliminary mold structure PML may form a preliminary recess region PRR1 and PRR2 on the second and third pad regions PR2 and PR3, respectively, and may also form second and third dummy sacrificial patterns DSP2 and DSP3. A width in the first direction D1 of the preliminary recess region PRR1 and PRR2 may be greater on the third pad region PR3 than on the second pad region PR2. The second etching process may cause sidewalls of the dummy sacrificial patterns DSP to vertically align with each other in the first direction D1. The second etching process may etch the second dummy stepwise structure DS2 of the upper dummy structure, and the second dummy stepwise structure DS2 may be transferred to a portion of the preliminary mold structure PML, with the result that sacrificial patterns SP may form a second stepwise structure S2 on the second and third pad regions PR2 and PR3.

Figure 9A:
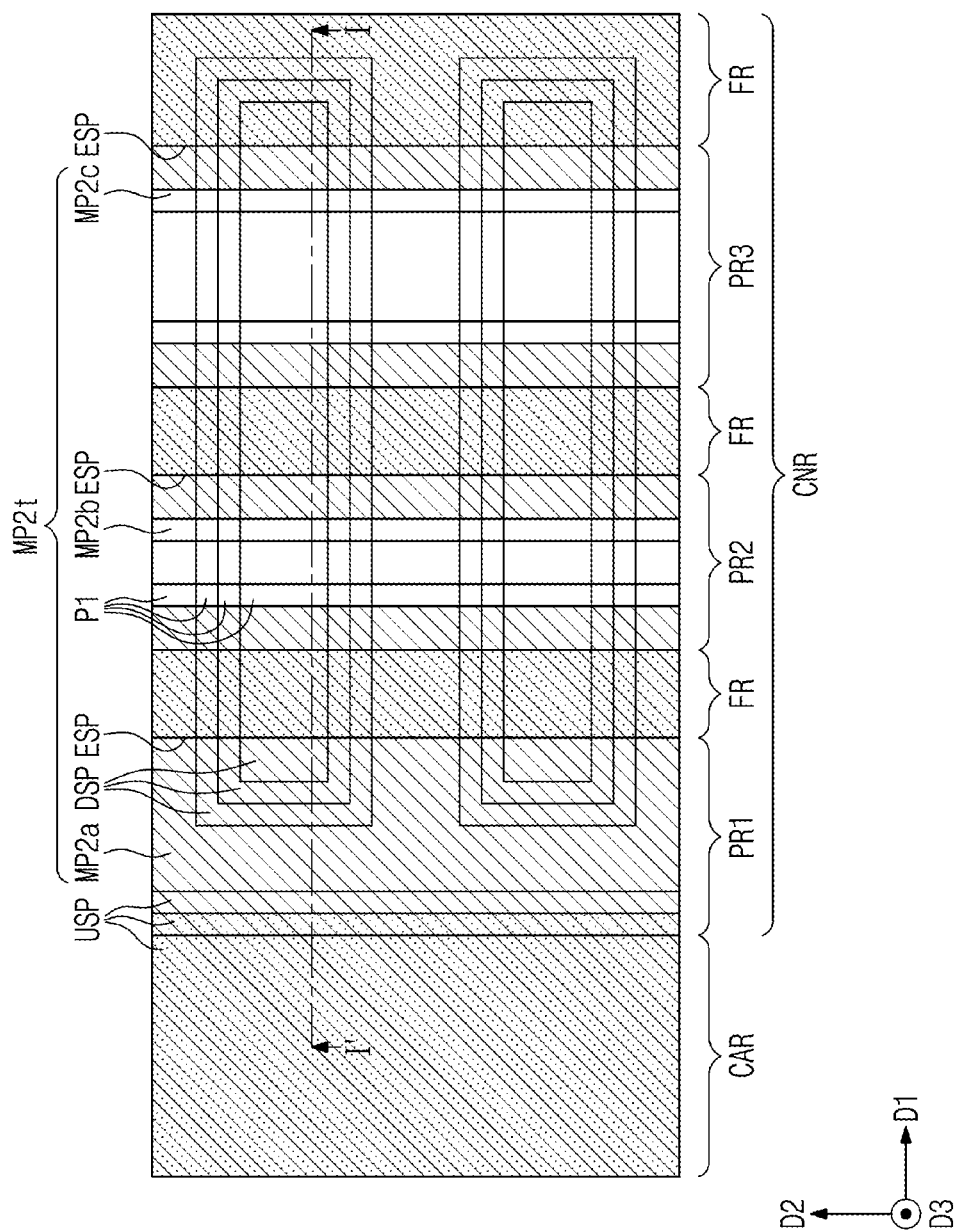
Figure 9B:
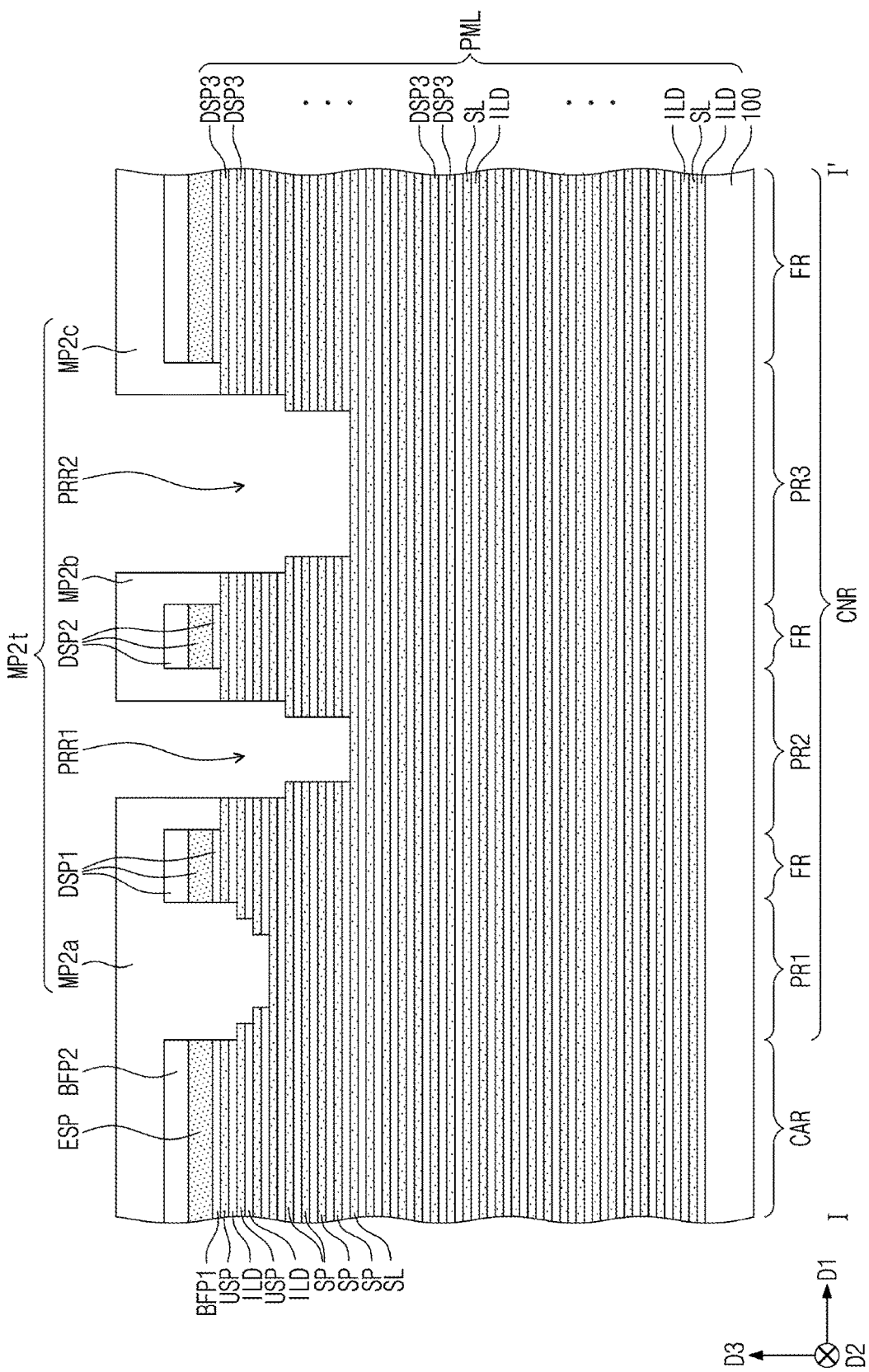

Referring to FIGS. 9A and 9B, after the second etching process, a second trimming process may be performed on the second mask pattern MP2. The second trimming process may expand a zone that is exposed by the second mask pattern MP2. A trimmed second mask pattern MP2t may expose a portion of the second dummy stepwise structure DS2 of the dummy sacrificial patterns DSP.

The second trimming process may cause a sidewall of the second mask pattern MP2 to horizontally move in the first direction a certain distance, such that the second mask pattern MP2 may decrease in area. For example, the second trimming process may include an isotropic dry etching process or a wet etching process. In addition, in the second trimming process, the second mask pattern MP2 may be etched back to recess a top surface of the second mask pattern MP2. For example, the second trimming process may reduce an area and a thickness of the second mask pattern MP2.

The trimmed second mask pattern MP2t may be used as an etching mask to perform the second etching process to partially etch the preliminary mold structure PML. Therefore, the first and second preliminary recess regions PRR1 and PRR2 may increase in depth and in width in the first direction D1.

Figure 10A:
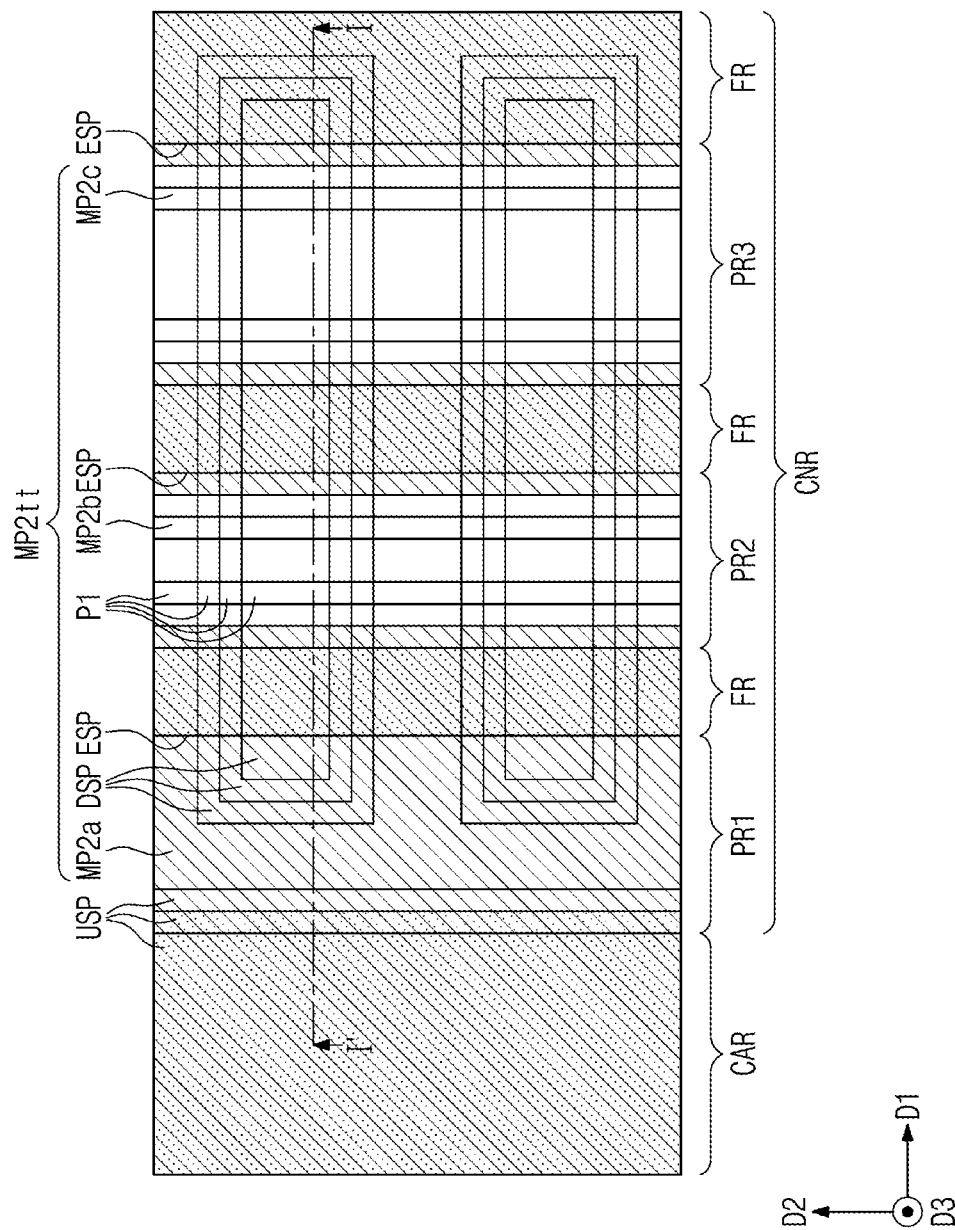
Figure 10B:
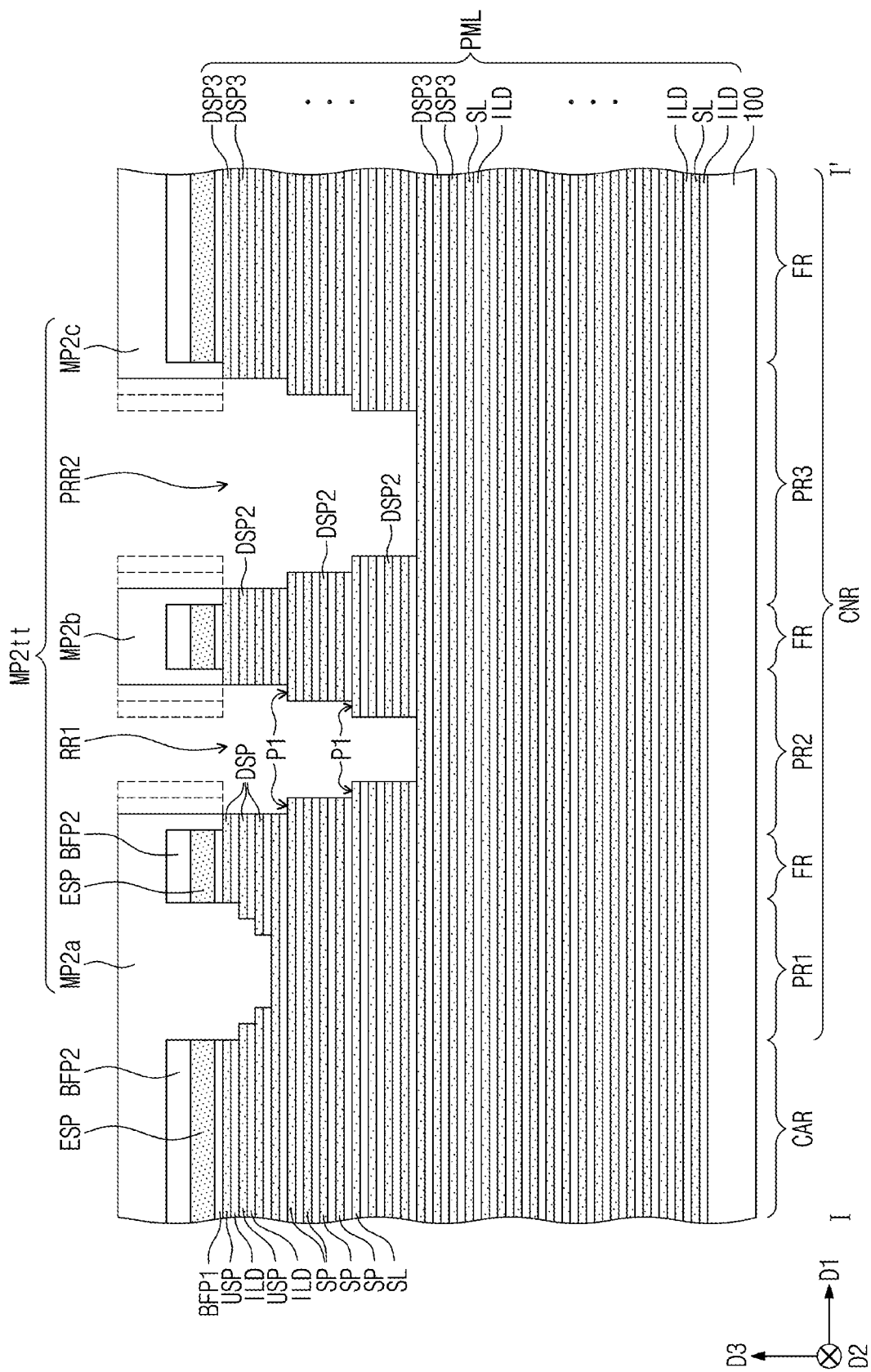

Referring to FIGS. 10A and 10B, the second etching process and the second trimming process may be alternately and repeatedly performed. The number of times of the second etching process and the second trimming process may depend on a stacking number of the sacrificial layers SL that are stacked on the substrate 100.

As the second etching process and the second trimming process are alternately and repeatedly performed, a second recess region RR2 may be formed on the second pad region PR2 and a second preliminary recess region PRR2 may be formed on the third pad region PR3.

On the second recess region RR2, a stepwise structure may be formed in the first direction D1, and first pad parts P1 of the sacrificial patterns SP may be exposed. The preliminary mold structure PML may have a stepwise structure whose slope is substantially the same on the second recess region RR2 and the second preliminary recess region PRR2.

Figure 11A:
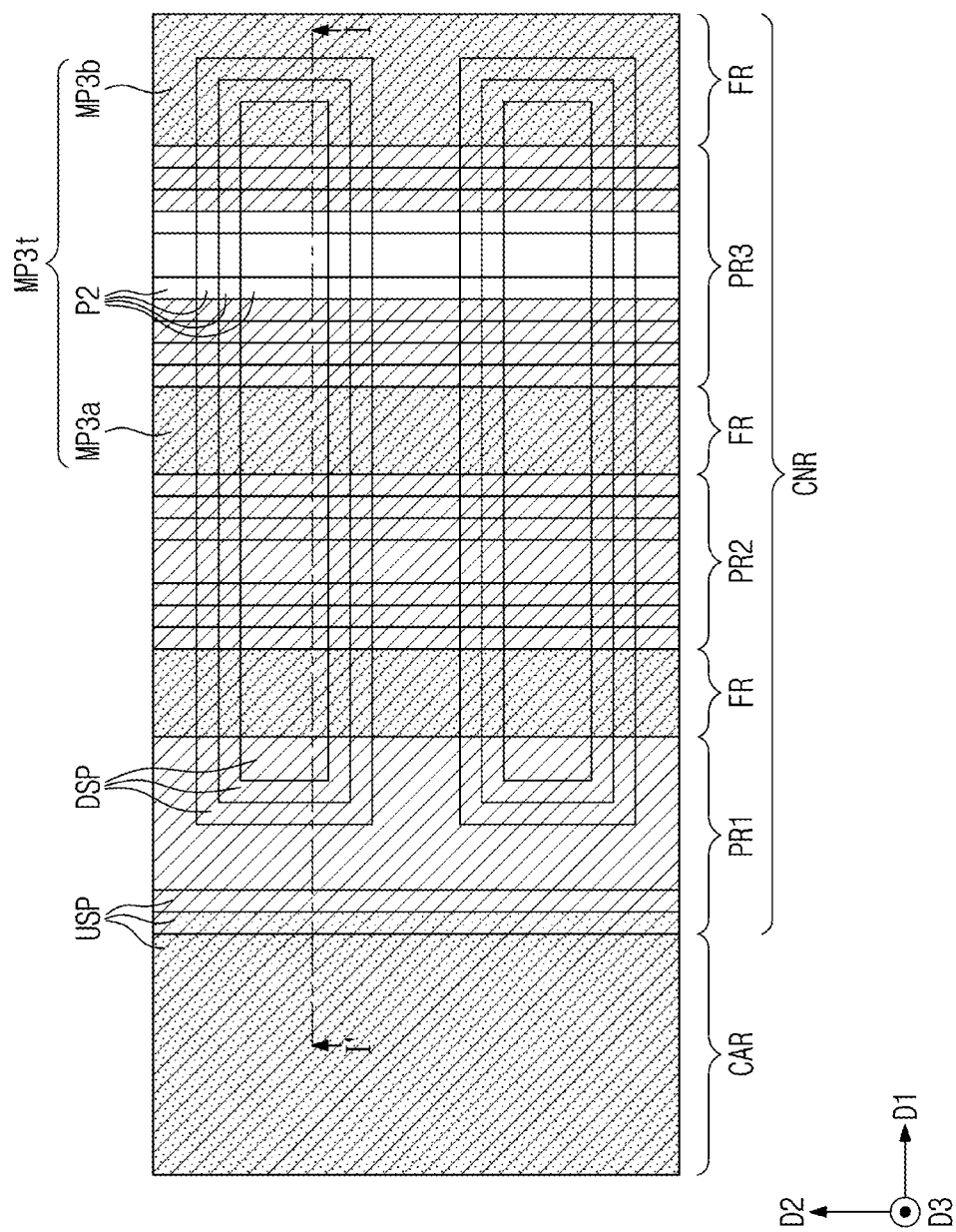
Figure 11B:
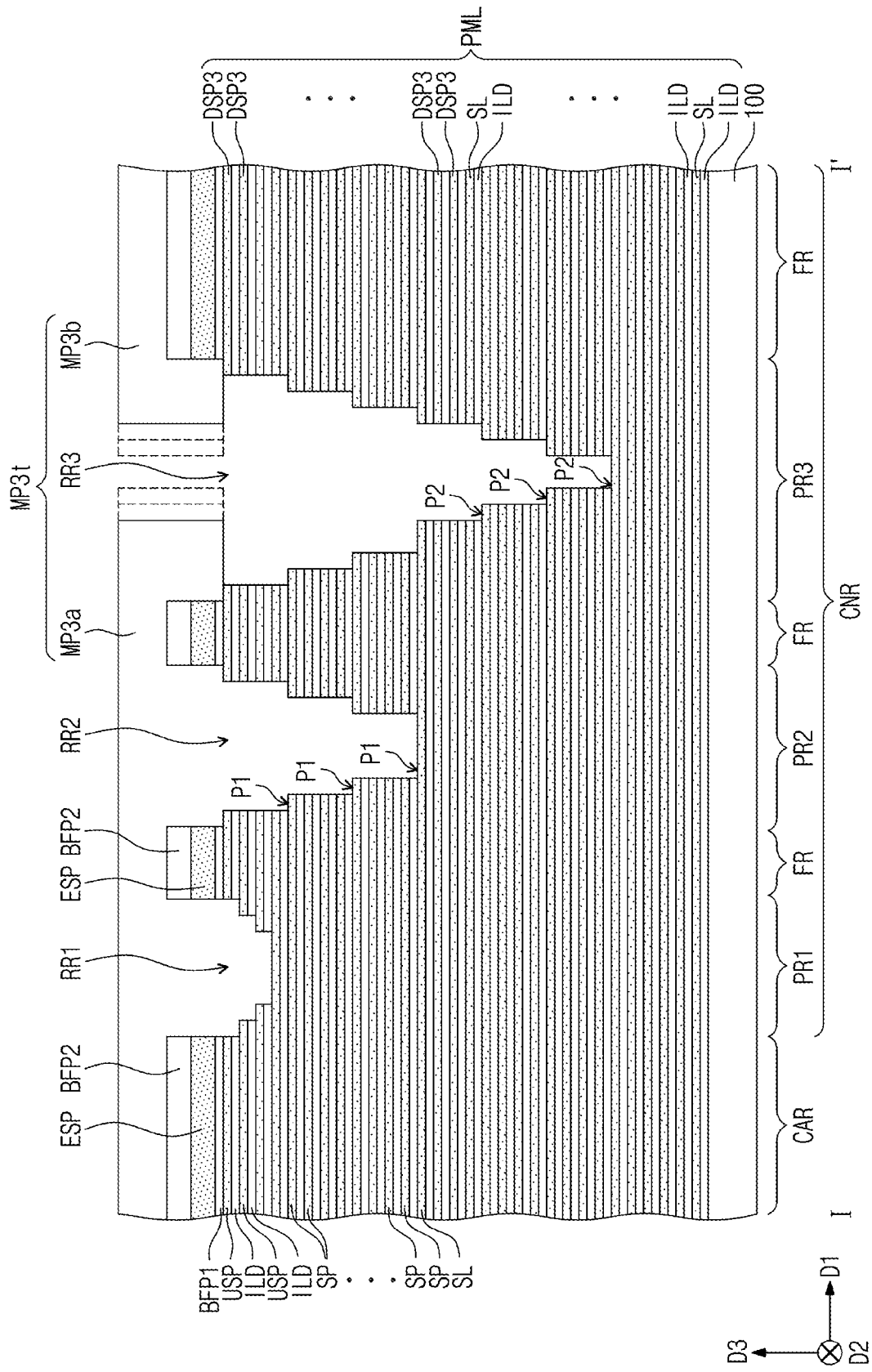

Referring to FIGS. 11A and 11B, on the preliminary mold structure PML, a third mask pattern MP3 may be formed to have an opening that exposes the third pad region PR3.

Thereafter, the third mask pattern MP3 may be used as an etching mask to alternately and repeatedly perform the second etching process that etches the dummy sacrificial patterns DSP and the sacrificial layers SL to the second etching depth and the second trimming process on the third mask pattern MP3. Therefore, on the third pad region PR3, a depth of the second preliminary recess region PRR2 may increase to form a third recess region RR3. For example, a mold structure ML may be formed which has the first, second, and third recess regions RR1, RR2, and RR3 that have different depths on the first, second, and third pad regions PR1, PR2, and PR3. On the third recess region RR3, the sacrificial patterns SP may have exposed second pad parts P2. The second pad parts P2 may be located at lower levels than those of the first pad parts P1. After the formation of the mold structure ML having the first, second, and third recess regions RR1, RR2, and RR3 with different depths from each other, the third mask pattern MP3 may be removed.

Figure 12A:
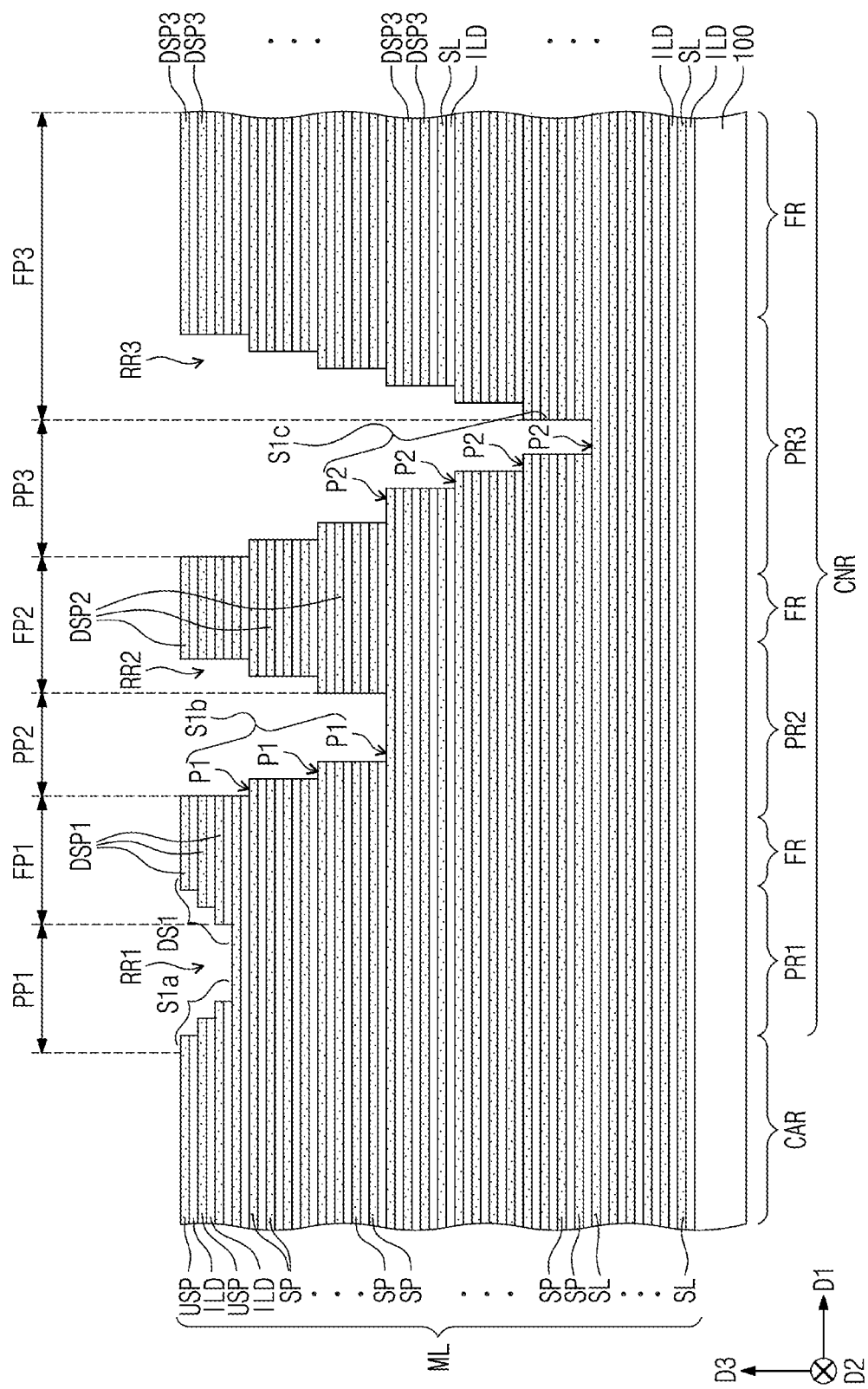
FIGS. 12A and 12B illustrate cross-sectional views showing a mold structure of a semiconductor device according to some embodiments.
Figure 12B:
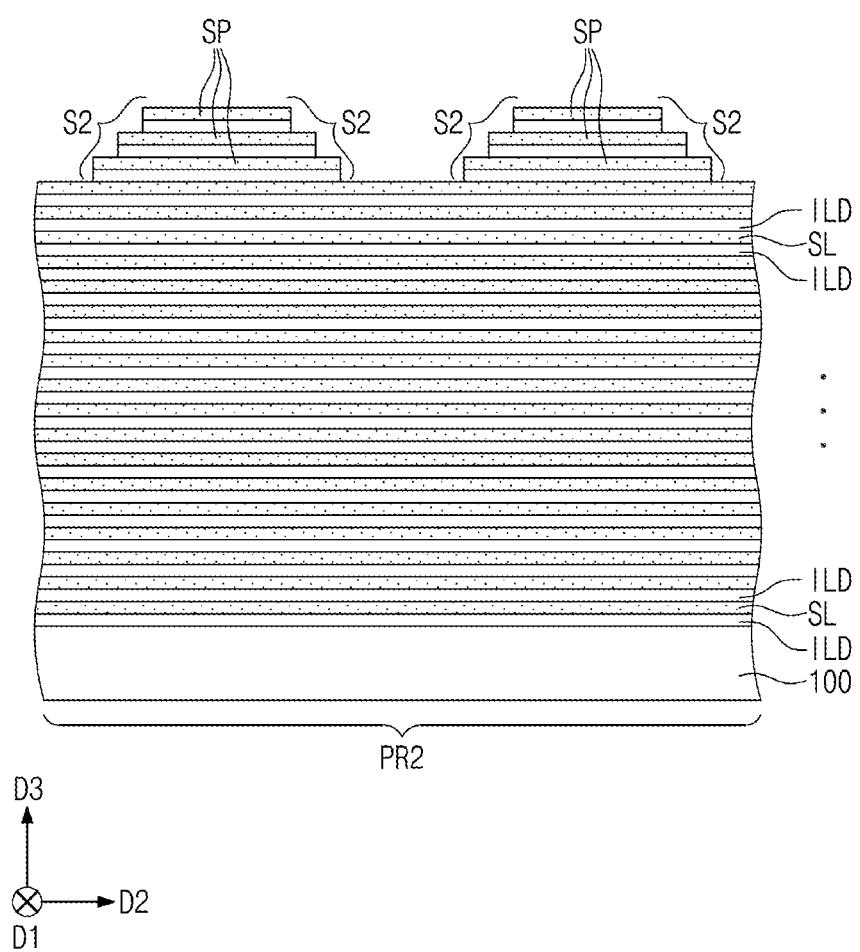

FIGS. 12A and 12B illustrate cross-sectional views showing a mold structure of a semiconductor device according to some embodiments.

Referring to FIGS. 12A and 12B, the mold structure ML may include sacrificial patterns SP and dielectric layers ILD that are vertically and alternately stacked on the substrate 100. As discussed above, the mold structure ML may include the first, second, and third recess regions RR1, RR2, and RR3 having different depths on the first, second, and third pad regions PR1, PR2, and PR3.

The sacrificial patterns SP may include upper sacrificial patterns USP having first pad parts on the first pad part PP1. The upper sacrificial patterns USP may form an upper stepwise structure S1a along the first direction D1. As for the upper stepwise structure S1a, one stair step may include one upper sacrificial pattern USP.

The mold structure ML may include a first pad part PP1, a first fence part FP1, a second pad part PP2, a second fence part FP2, a third pad part PP3, and a third fence part FP3 that are sequentially arranged along the first direction D1.

According to some embodiments, the mold structure ML may have a thickness that is smaller on the second pad part PP2 than on the first pad part PP1 and smaller on the third pad part PP3 than on the second pad part PP2.

Each of the second and third pad parts PP2 and PP3 may have a first stepwise structure S1b and S1c that is formed along the first direction D1, and may also have a second stepwise structure S2 formed along the second direction D2 that intersects the first direction D1. A step difference, e.g., a total height or a number of layers along a vertical direction of one step, of the first stepwise structure S1b and S1c may be greater than a step difference in stair steps of the second stepwise structure S2. For example, one stair step of the first stepwise structure S1b and S1c may be formed by two or more (e.g., four) sacrificial patterns SP that are continuously stacked. One stair step of the second stepwise structure S2 may be formed by one sacrificial pattern SP. In addition, a slope of the second stepwise structure S2 may be less than a slope of the first stepwise structure S1b and S1c.

A thickness of each of the first, second, and third fence parts FP1, FP2, and FP3 may be substantially the same as that of a stack structure (see ST of FIG. 17B) on the cell array region CAR. Each of the first, second, and third fence parts FP1, FP2, and FP3 may extend along the second direction D2 with a uniform thickness.

As discussed above, the first fence part FP1 may include first dummy sacrificial patterns DSP1 located at the same levels as those of the upper sacrificial patterns USP, the second fence part FP2 may include second dummy sacrificial patterns DSP2, and the third fence part FP3 may include third dummy sacrificial patterns DSP3.

The number of the second dummy sacrificial patterns DSP2 may be greater than the number of the first dummy sacrificial patterns DSP1, and the number of the third dummy sacrificial patterns DSP3 may be greater than the number of the second dummy sacrificial patterns DSP2.

The first dummy sacrificial patterns DSP1 of the first fence part FP1 may form a first dummy stepwise structure in the first direction D1 and a second dummy stepwise structure in the second direction D2. The first dummy stepwise structure may be substantially the same as the first stepwise structure S1b and S1c of each of the first, second, and third pad parts PP1, PP2, and PP3, and the second dummy stepwise structure may be substantially the same as the second stepwise structure S2 of each of the first, second, and third pad parts PP1, PP2, and PP3. The first dummy sacrificial patterns DSP1 of the first fence part FP1 may be stacked in a pyramid shape. The first dummy stepwise structure may face in the first direction D1 toward an upper stepwise structure S1a.

According to some embodiments, the sacrificial patterns SP may be replaced with electrodes in a subsequent process, and a stack structure (see ST of FIG. 17B) according to some embodiments may have a structure substantially the same as that of the mold structure ML.

FIGS. 13, 14, 15, and 16 illustrate cross-sectional views showing stages in a method of planarizing a buried dielectric layer that covers a mold structure of a semiconductor device according to some embodiments.

Referring to FIG. 13, a buried dielectric layer 110 may be deposited on an entire surface of the substrate 100. The buried dielectric layer 110 may fill the first, second, and third recess regions RR1, RR2, and RR3 of the mold structure ML on the connection region CNR. The buried dielectric layer 110 may have a thickness greater than a thickness (or height) of the mold structure ML.

For example, the buried dielectric layer 110 may be formed by using a deposition process, e.g., chemical vapor deposition (CVD), and thus may have grooves formed on the connection region CNR. For example, the buried dielectric layer 110 may have a non-flat top surface on the connection region CNR and also have a substantially flat top surface on the cell array region CAR. The buried dielectric layer 110 may have grooves G1, G2, and G3 on, e.g., vertically overlapping, the first, second, and third pad regions PR1, PR2, and PR3, respectively, and the grooves G1, G2, and G3 may have their depths that increase in a direction oriented away from the cell array region CAR.

The buried dielectric layer 110 may be formed of a dielectric material having an etch selectivity with respect to the sacrificial patterns SP. The buried dielectric layer 110 may include, e.g., plasma enhanced tetraethylorthosilicate (PE-TEOS), $O_3$-tetratthylorthosilicate ($O_3$-TEOS), undoped silicate glass (USG), phosphosilicate glass (PSG), borosilicate glass (BSG), borophosphosilicate glass (BPSG), fluorosilicate glass (FSG), spin on glass (SOG), Tonen Silazene (TOSZ), or a combination thereof. For example, the buried dielectric layer 110 may be formed of a tetraethylorthosilicate (TEOS) layer.

Figure 14:
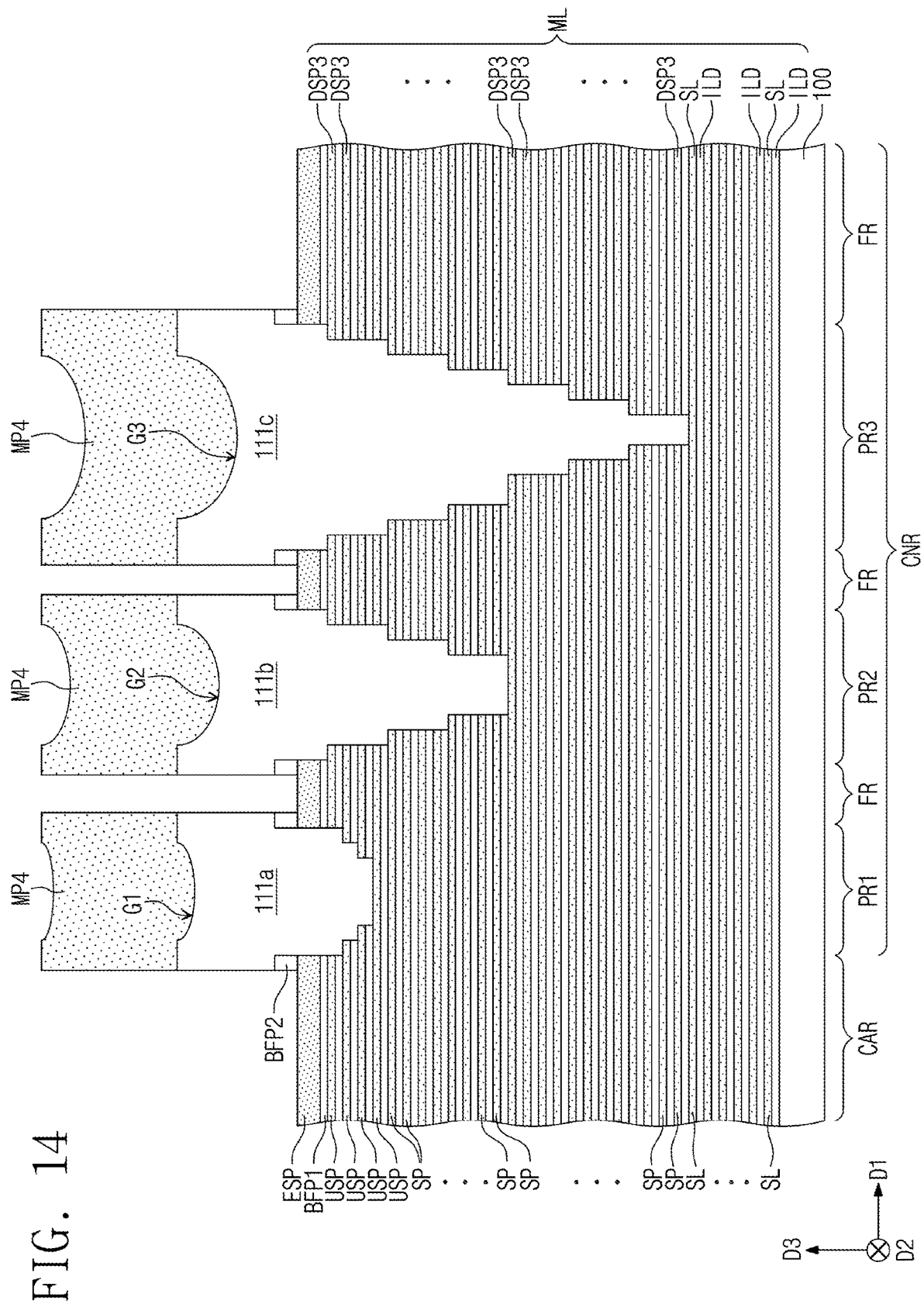

Referring to FIG. 14, fourth mask patterns MP4 may be formed on the buried dielectric layer 110. The fourth mask patterns MP4 may be spaced apart from each other in the first direction D1, and may have their linear shapes that extend in the second direction D2 on the first, second, and third pad regions PR1, PR2, and PR3.

The fourth mask patterns MP4 may expose the cell array region CAR and may fill the grooves G1, G2, and G3 of the buried dielectric layer 110. The fourth mask patterns MP4 may be used as an etching mask to etch the buried dielectric layer 110 to form protruding buried dielectric patterns 111a, 111b, and 111c that are separated from each other.

The etch stop patterns ESP may serve as an etch stopper when the fourth mask patterns MP4 are used to etch the buried dielectric layer 110, and a second buffer dielectric pattern BFP2 may be etched. For example, top surfaces of the etch stop patterns ESP may be exposed on the cell array region CAR and the fence regions FR.

According to some embodiments, portions of the buried dielectric layer 110 on the connection region CNR may be previously etched before a planarization process is performed on the buried dielectric layer 110, and thus there may be a reduction in volume of the buried dielectric layer 110 that is removed by the planarization process. Therefore, it may be possible to decrease process failure and process time in the planarization process.

Figure 15:
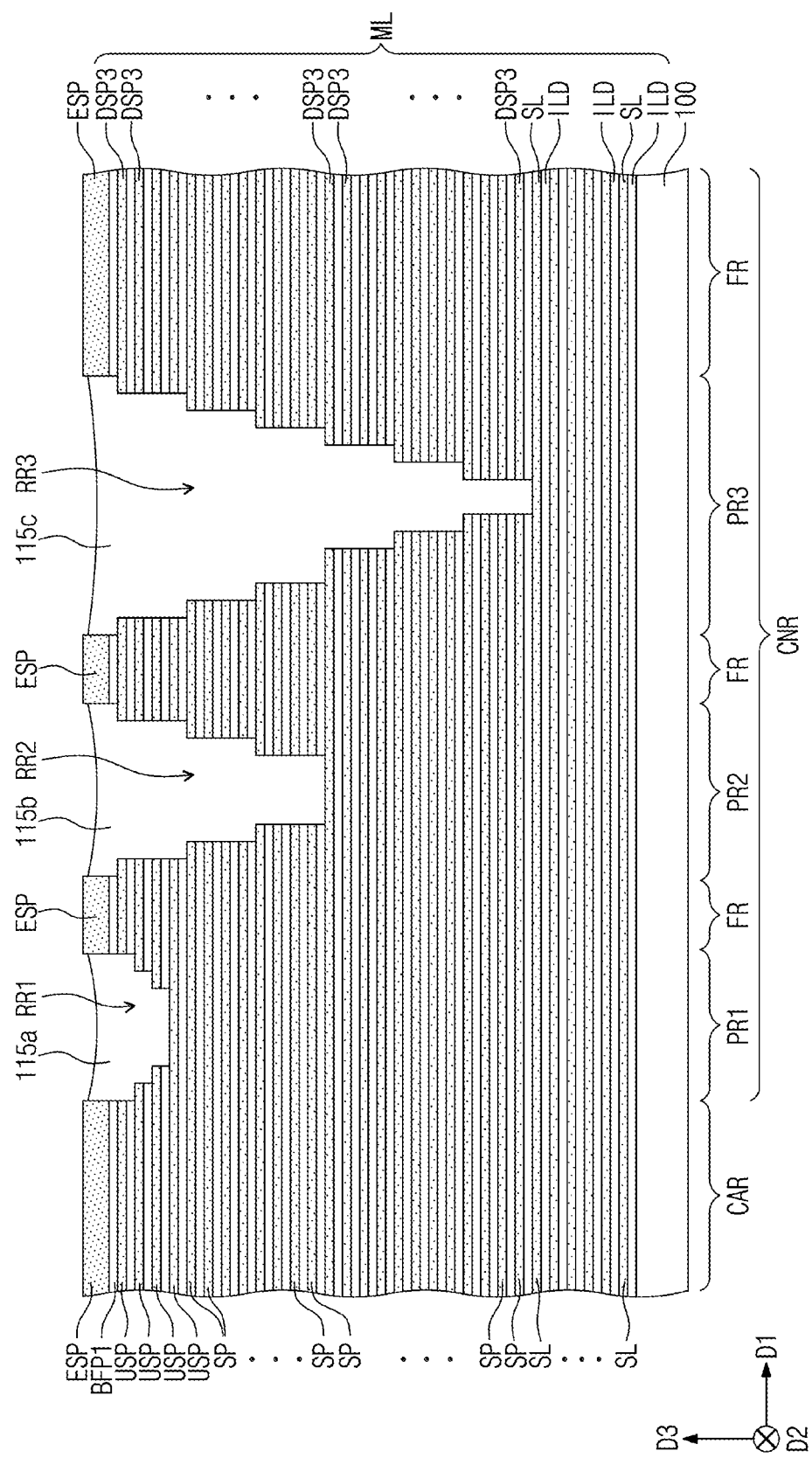

Referring to FIG. 15, a planarization process may be performed on the protruding buried dielectric patterns 111a, 111b, and 111c. For example, a chemical mechanical polishing (CMP) process may be performed as the planarization process, and the etch stop patterns ESP may be used as a polishing end point. Because the protruding buried dielectric patterns 111a, 111b, and 111c are present only on the connection region CNR in the planarization process, there may be a reduction in volume of the buried dielectric layer 110 that is removed by the planarization process.

The planarization process may form buried dielectric patterns 115a, 115b, and 115c in the first, second, and third recess regions RR1, RR2, and RR3 of the mold structure ML. Each of the buried dielectric patterns 115a, 115b, and 115c may have a top surface that is rounded, e.g., curved inwardly, due to dishing phenomena in the planarization process.

Figure 16:
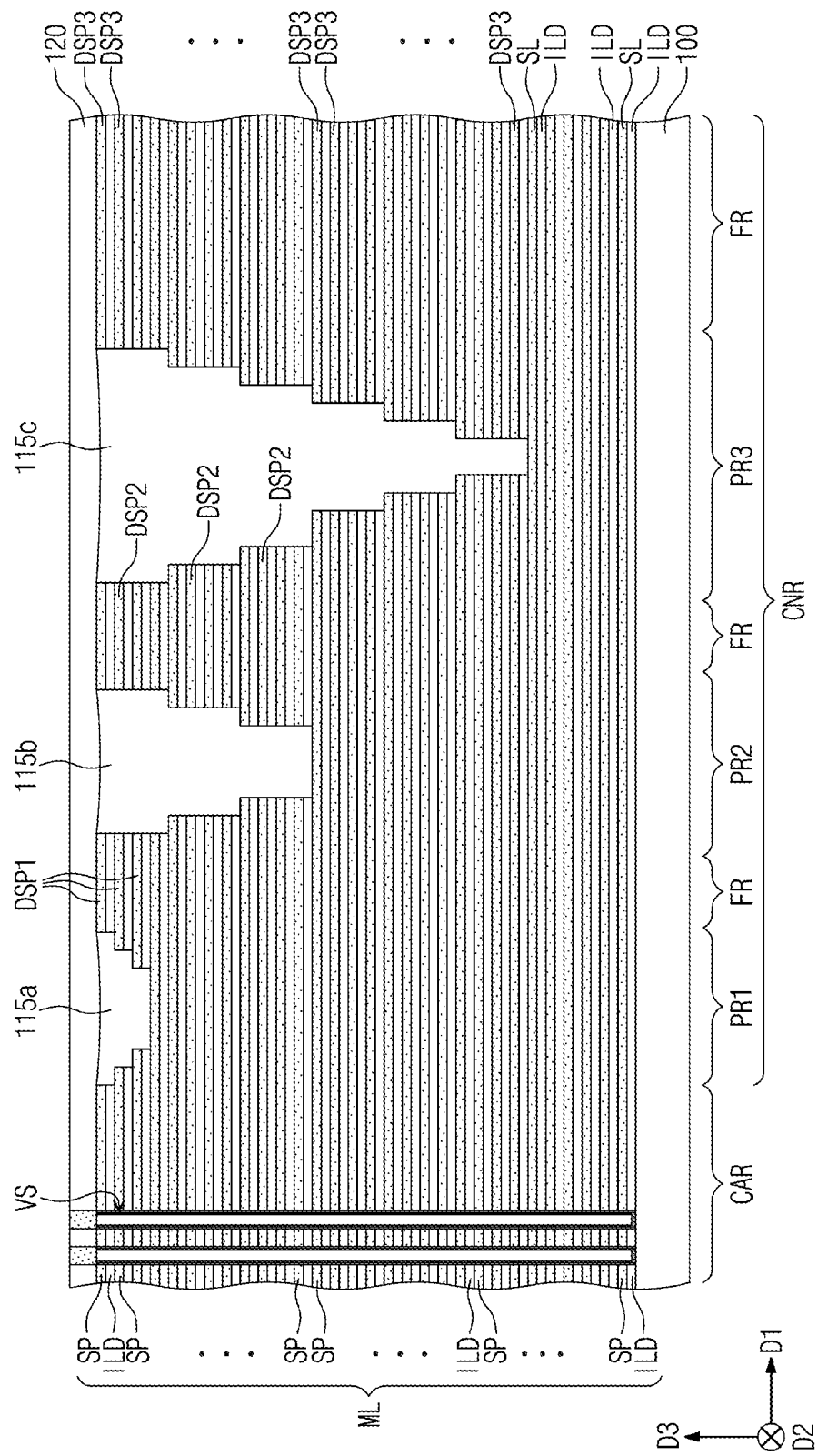

Referring to FIG. 16, after the planarization process, the etch stop patterns ESP may be removed, and thus the first buffer dielectric patterns BFP1 may be exposed. After the removal of the etch stop patterns ESP, a wet etching process may be performed on the buried dielectric patterns 115a, 115b, and 115c based on positions of the top surfaces of the buried dielectric patterns 115a, 115b, and 115c.

In some embodiments, after the etch stop patterns ESP are removed, the top surfaces of the buried dielectric patterns 115a, 115b, and 115c may be substantially coplanar with those of the fence regions FR of the mold structure ML, e.g., the top surfaces of the fence regions FR of the mold structure ML may be coplanar with topmost portions (e.g., edges) of the buried dielectric patterns 115a, 115b, and 115c. Each of the top surfaces of the buried dielectric patterns 115a, 115b, and 115c may have a downwardly convex profile. The top surfaces of the buried dielectric patterns 115a, 115b, and 115c may be located at a level between those of top and bottom surfaces of an uppermost dielectric layer ILD of the mold structure ML, e.g., relative to the substrate 100. Alternatively, each of the buried dielectric patterns 115a, 115b, and 115c may have a top surface at a level between those of top and bottom surfaces of an uppermost upper sacrificial pattern USP, e.g., relative to the substrate 100.

After the formation of the buried dielectric patterns 115a, 115b, and 115c, vertical structures VS may be formed to penetrate the mold structure ML. The vertical structures VS may be formed on the cell array region CAR and the connection region CNR.

The formation of the vertical structures VS may include forming vertical holes that penetrate the mold structure ML, and sequentially forming a data storage pattern and a vertical semiconductor pattern in each of the vertical holes. In an anisotropic etching process for forming the vertical holes, a top surface of the substrate 100 may be over-etched, and lower portions of the vertical structures VS may be positioned in the substrate 100.

The data storage pattern may include a tunneling dielectric layer, a charge storage layer, and a blocking dielectric layer that are sequentially stacked. The vertical semiconductor pattern may be formed in the vertical hole in which the data storage pattern is formed, and a bit-line conductive pad may be formed on a top end of the vertical semiconductor pattern.

After the formation of the vertical structures VS, a first interlayer dielectric layer 120 may be formed to cover top surfaces of the vertical structures VS. On the connection region CNR, the first interlayer dielectric layer 120 may cover the fence parts FR and the buried dielectric patterns 115a, 115b, and 115c.

Figure 17A:
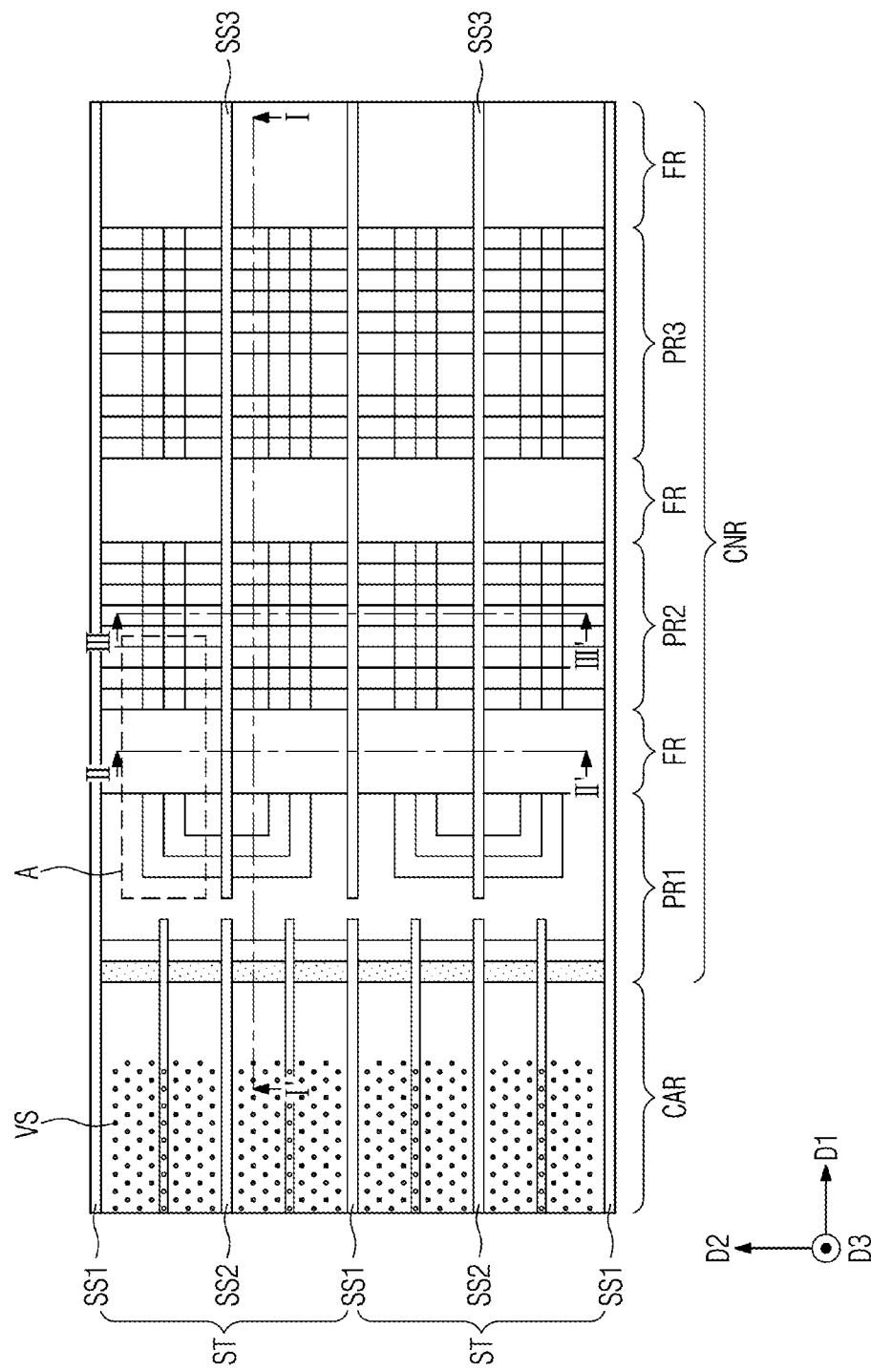
FIG. 17A illustrates a plan view showing a semiconductor device according to some embodiments.
Figure 17B:
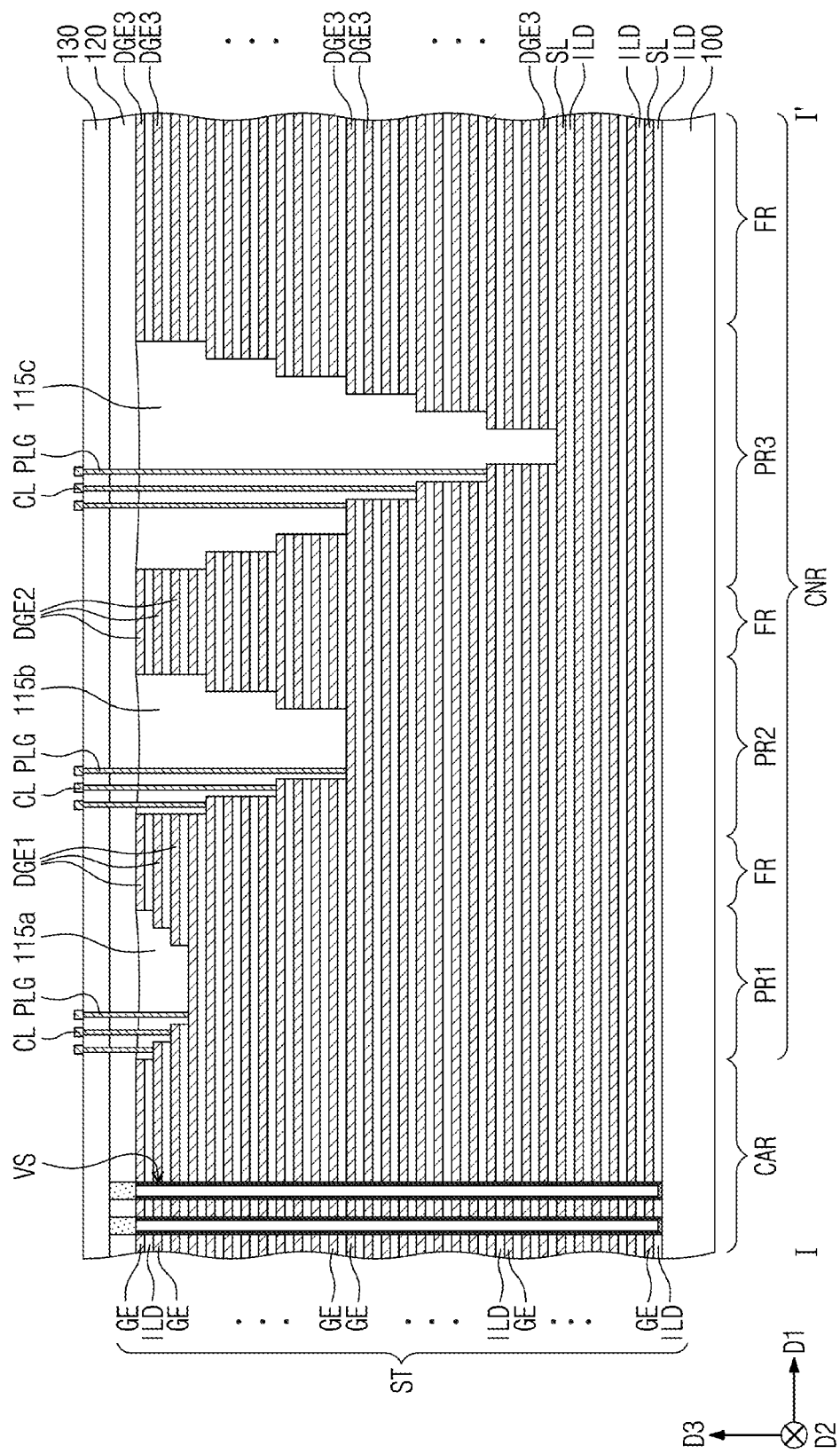
FIGS. 17B, 17C, and 17D illustrate cross-sectional views respectively taken along lines I-I', and of FIG. 17A, showing a semiconductor device according to some embodiments.

After the formation of the first interlayer dielectric layer 120, a process may be performed in which the sacrificial patterns SP of the mold structure ML are replaced with electrodes (see GE of FIG. 17B). During the process in which the sacrificial patterns SP are replaced with the electrodes GE, the dummy sacrificial patterns DSP may be replaced with dummy electrodes. The process, in which the sacrificial patterns SP are replaced with the electrodes GE, may include isotropically etching the sacrificial patterns SP by using an etching recipe that has an etch selectivity with respect to the dielectric layers ILD and the vertical structures VS. As the electrodes GE and the dummy electrodes are formed, a stack structure (see ST of FIG. 17B) may be formed which includes the dielectric layers ILD and the electrodes GE that are alternately stacked on the substrate 100.

Figure 17C:
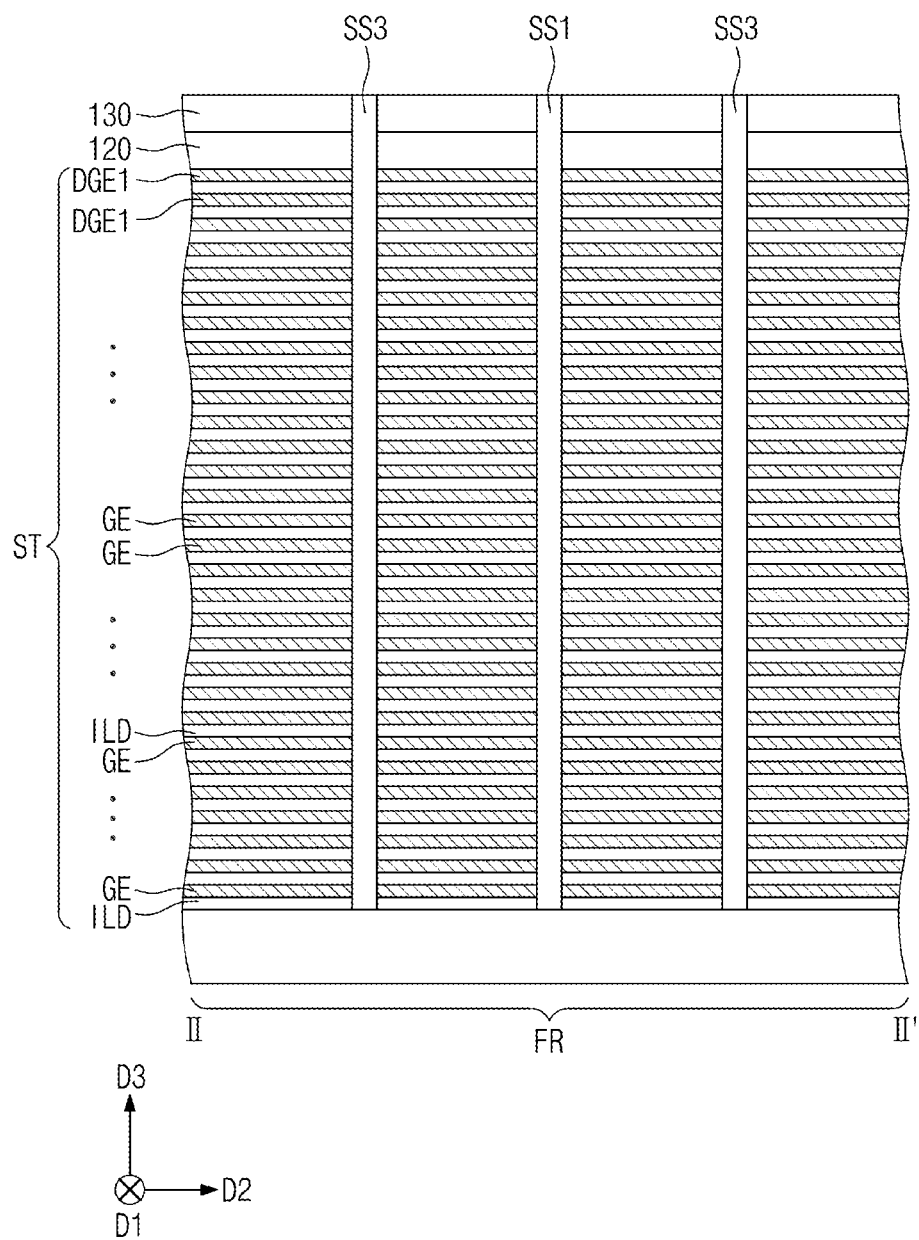
Figure 17D:
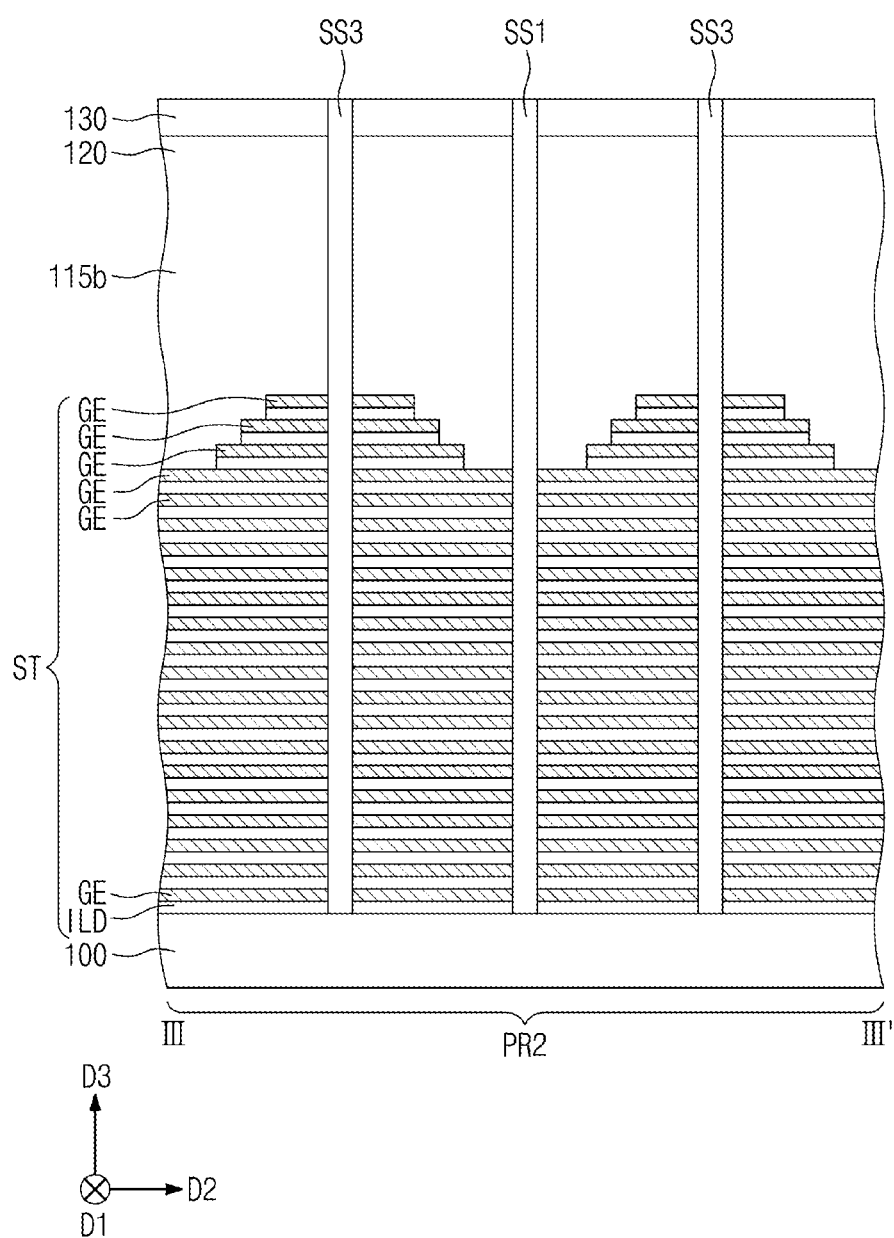
Figure 18A:
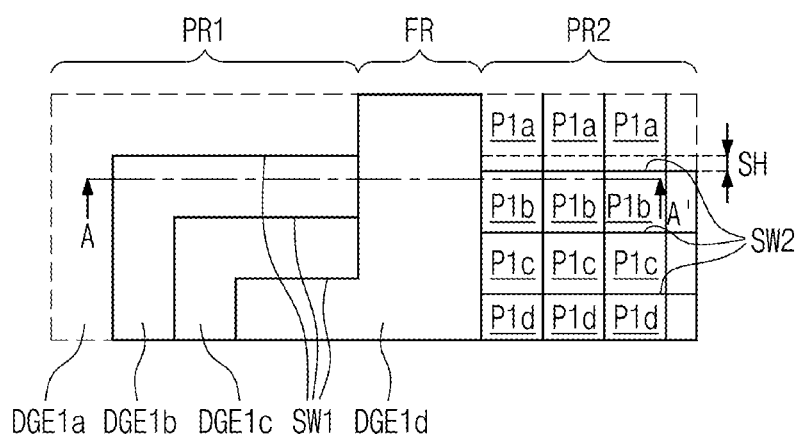
FIG. 18A illustrates an enlarged view showing section A of FIG. 17A.
Figure 18B:
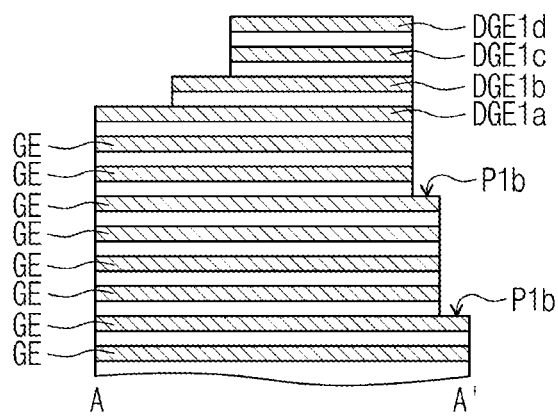
FIG. 18B illustrates a cross-sectional view along line A-A' of FIG. 18A.

FIG. 17A illustrates a plan view showing a semiconductor device according to some embodiments. FIGS. 17B, 17C, and 17D illustrate cross-sectional views respectively taken along lines I-I', and of FIG. 17A, showing a semiconductor device according to some embodiments. FIG. 18A illustrates an enlarged view showing section A of FIG. 17A. FIG. 18B illustrates a cross-sectional view taken along line A-A' of FIG. 18A.

Referring to FIGS. 17A, 17B, 17C, and 17D, a stack structure ST may be disposed on the substrate 100. As discussed above with reference to FIG. 16, the stack structure ST may be formed by replacing the sacrificial patterns SP and the dummy sacrificial patterns DSP with electrodes GE and dummy electrodes DGE1, DGE2, and DGE3. Therefore, like the mold structure ML discussed above, the stack structure ST may include pad parts and fence parts on the connection region CNR. For example, the stack structure ST may include a first pad part, a first fence part, a second pad part, a second fence part, a third pad part, and a third fence part that are sequentially arranged along the first direction D1.

The first pad part of the stack structure ST may have an upper stepwise structure formed along the first direction D1. Each of the second and third pad parts of the stack structure ST may include a first stepwise structure formed along the first direction D1 and a second stepwise structure formed along the second direction D2 that intersects the first direction D1. The first stepwise structure may have a slope greater than that of the second stepwise structure. The second stepwise structure and the upper stepwise structure may have substantially the same slope.

Each of the first, second, and third fence parts of the stack structure ST may include dummy electrodes that are located at the same levels as those of the electrodes and are spaced apart in the first direction D1 from the electrodes.

The first fence part may include first dummy electrodes DGE1 that form a first dummy stepwise structure in the first direction D1 and a second dummy stepwise structure in the second direction D2. The first dummy stepwise structure may be substantially the same as a first stepwise structure of each of the first, second, and third pad parts, and the second dummy stepwise structure may be substantially the same as a second stepwise structure of each of the first, second, and third pad parts. The first dummy electrodes DGE1 of the first fence part may be stacked in a pyramid shape. The first dummy stepwise structure may face in the first direction D1 toward the upper stepwise structure. The second fence part may include second dummy electrodes DGE2, and the third fence part may include third dummy electrodes DGE3.

Each of the electrodes GE may include a pad part to which a contact plug is coupled on the connection region CNR. On each of the second and third pad regions PR2 and PR3, the pad parts of the electrodes GE may be disposed along the second direction D2 and may form the second stepwise structure. For example, the second stepwise structure may be formed by the pad parts of four electrodes GE.

Referring to FIGS. 18A and 18B, when viewed in plan, second sidewalls SW2 of the electrodes GE that form the second stepwise structure on the second part of the stack structure ST may be offset in the second direction D2 from first sidewalls SW1 of first dummy electrodes DGE1 on the first fence part. For example, the first sidewalls SW1 of the first dummy electrodes DGE1 may be spaced apart in the second direction D2 at a certain distance SH from the second sidewalls SW2 of the electrodes GE. When viewed in cross section, the first dummy electrodes DGE1 (or DGE1a, DGE1b, DGE1c, and DGE1d) may have their sidewalls SW1 located at different levels from those of sidewalls of the electrodes GE that form a pad part of the electrode structure ST. FIGS. 18A and 18B depict four first dummy electrodes DGE1a, DGE1b, DGE1c, and DGE1d wherein the symbol DEG1a indicates a lowermost first dummy electrode (e.g., a $(4n-3)^{th}$ layer, where n is a natural number) and the symbol DEG1d denotes an uppermost first dummy electrode (e.g., an $4n^{th}$ layer, where n is a natural number). Moreover, in FIGS. 18A and 18B, the languages "P1a, P1b, P1c, and P1d" represent pad parts of the electrodes GE wherein the "P1a" and "P1d" indicate a lowermost pad part and an uppermost pad part, respectively. Furthermore, the number of the pad parts P1a, P1b, P1c, and P1d of the electrodes GE may decrease by four steps.

FIG. 18A depicts that there is alignment between the second sidewalls SW2 of the pad parts P1a, P1b, P1c, and P1d of the electrodes GE that are arranged along the second direction D2, but embodiments are not limited thereto. Alternatively, there may be an offset in the second direction D2 between the second sidewalls SW2 of the pad parts P1a, P1b, P1c, and P1d of the electrodes GE that are located at different levels.

According to some embodiments, because the first mask pattern MP1 has the trapezoidal top surface when the mold structure ML is formed as discussed above with reference to FIG. 6A, the distance SH between the first sidewalls SW1 of the first dummy electrodes DGE1 and the second sidewalls SW2 of the electrodes GE may increase in a direction oriented away from the cell array region CAR. For example, a distance between the second sidewalls SW2 of the electrodes GE on the third part and the first sidewalls SW1 of the first dummy electrode DGE1 may be greater than the distance SH between the second sidewalls SW2 of the electrodes GE on the second pad part and the first sidewalls SW1 of the first dummy electrodes DGE1.

Referring back to FIGS. 17A, 17B, 17C, and 17D, the buried dielectric patterns 115a, 115b, and 115c may cover pad parts between the fence parts. The buried dielectric patterns 115a, 115b, and 115c may have their top surfaces substantially coplanar with those of the fence parts FR of the stack structure ST. The top surfaces of the buried dielectric patterns 115a, 115b, and 115c may each have a downward convex profiled and a rounded shape. The buried dielectric patterns 115a, 115b, and 115c may have their thicknesses in the third direction D3 perpendicular to the top surface of the substrate 100, and the thicknesses of the buried dielectric patterns 115a, 115b, and 115c may increase in a direction oriented away from the cell array region CAR. The buried dielectric patterns 115a, 115b, and 115c may have their widths in the first direction D1, which widths may increase in a direction oriented away from the cell array region CAR.

The substrate 100 may be provided thereon with first and second separation structures SS1 and SS2 that penetrate the stack structure ST. The first separation structures SS1 may extend along the first direction D1 from the cell array region CAR toward the connection region CNR, and may be spaced apart from each other in the second direction D2 that intersects the first direction D1. The second separation structure SS2 may penetrate the stack structure ST on the cell array region CAR. The second separation structure SS2 may be disposed between the first separation structures SS1. When viewed in the first direction D1, the second separation structure SS2 may have a length less than that of the first separation structure SS1. Alternatively, a plurality of second separation structures SS2 may be provided between the first separation structures SS1. Each of the first and second separation structures SS1 and SS2 may cover a dielectric layer that covers a sidewall of the stack structure ST.

On the connection region CNR, third separation structures SS3 may penetrate the stack structure ST while being spaced apart from the first and second separation structures SS1 and SS2. The third separation structures SS3 may extend along the first direction D1.

On the connection region CNR, contact plugs PLG may be connected to the electrodes GE of the stack structure ST. A second interlayer dielectric layer 130 may be disposed on the first interlayer dielectric layer 120, and the contact plugs PLG may penetrate the first and second interlayer dielectric layers 120 and 130 and the buried dielectric patterns 115a, 115b, and 115c.

The second interlayer dielectric layer 130 may be provided thereon with bit lines BL and connection lines CL. The bit lines BL may be connected through bit-line contact plugs to the vertical structures VS, and the connection lines CL may be connected to the contact plugs PLG.

FIGS. 19A, 19B, 20A, and 20B illustrate cross-sectional views showing stages in a method of planarizing the buried dielectric layer 110 that covers a mold structure of a semiconductor device according to some embodiments. For brevity of explanation, a detailed description of same features as those of the semiconductor device discussed above will be omitted, and a mainly difference thereof will be described.

Figure 19A:
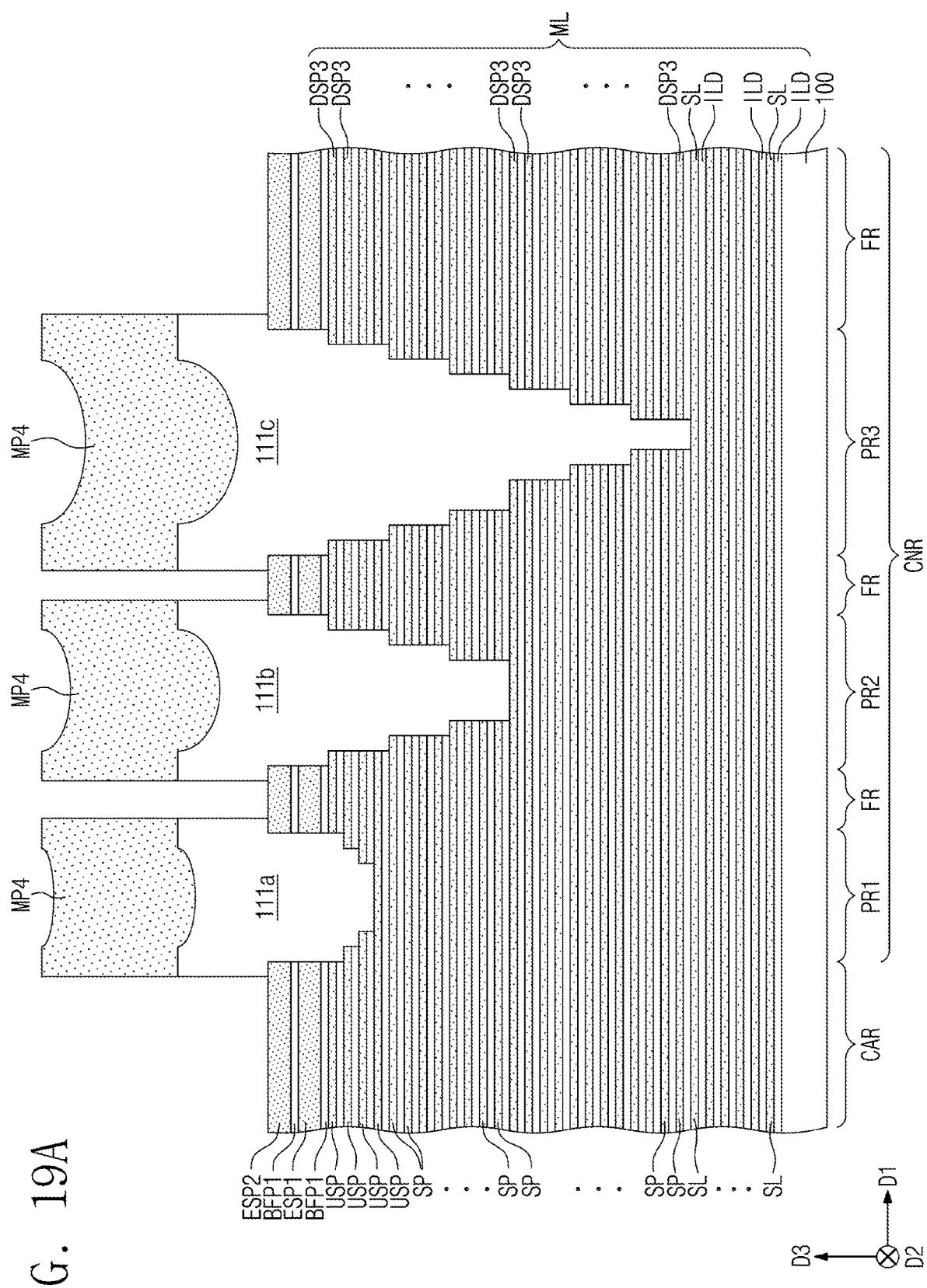
FIGS. 19A, 19B, 20A, and 20B illustrate cross-sectional views of stages in a method of planarizing a buried dielectric layer that covers a mold structure of a semiconductor device according to some embodiments.
Figure 19B:
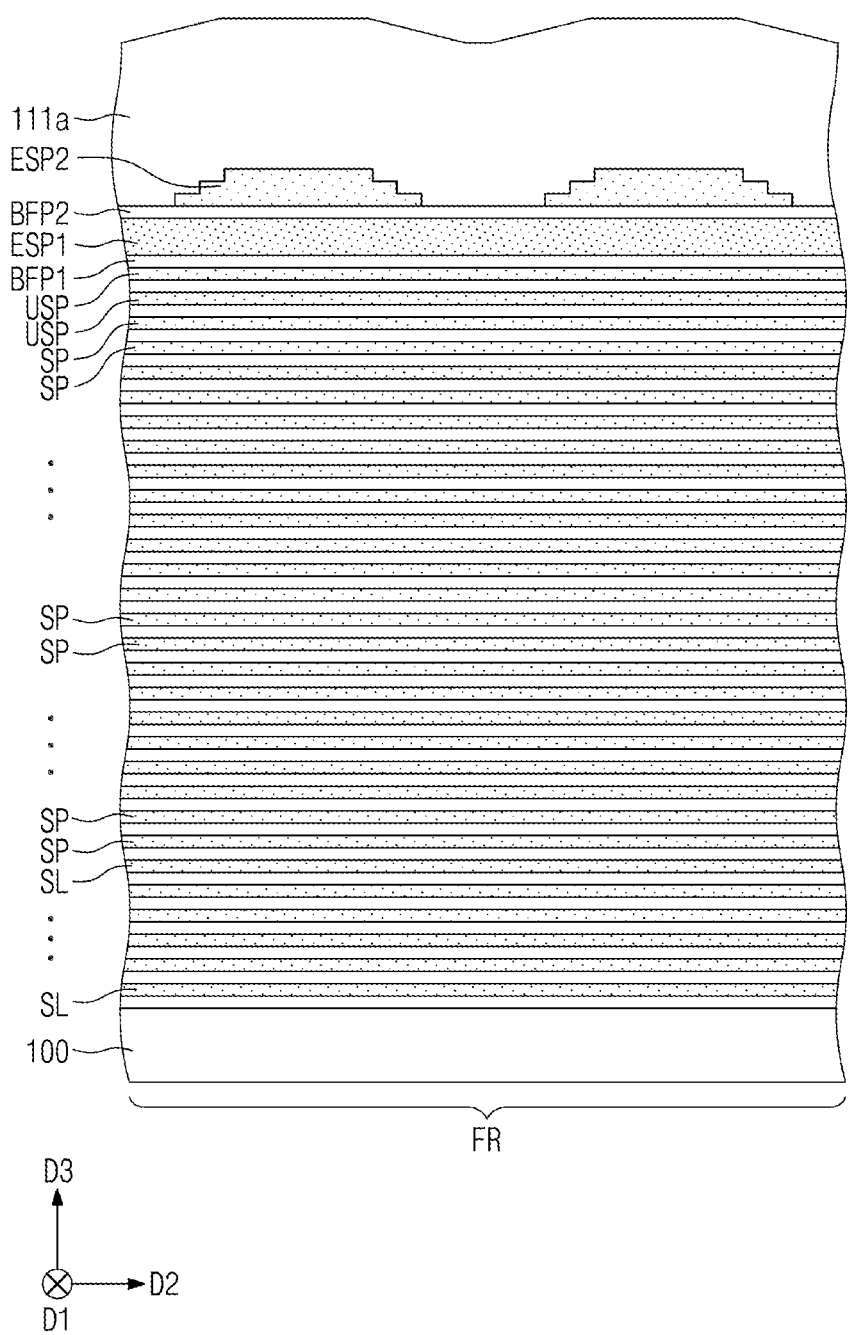

Referring to FIGS. 19A and 19B, after the preliminary mold structure PML is formed on the substrate 100, as discussed above with reference to FIGS. 5A and 5B, an etch stop structure, which includes the first and second etch stop patterns ESP1 and ESP2, may be formed on the preliminary mold structure PML by an etching process. The preliminary mold structure PML may be formed with the first buffer dielectric patterns BFP1, the first etch stop patterns ESP1, the second buffer dielectric pattern BFP2, and the second buffer dielectric patterns BFP2 sequentially stacked, after the etching process. As discussed above, the etch stop structure may have a linear shape that extends along the second direction D2 and on the connection region CNR, and may expose the preliminary mold structure PML on the first, second, and third pad regions PR1, PR2, and PR3.

Afterwards, as discussed with respect to FIGS. 6A to 12B, on the fence regions FR, the mold structure ML including the first, second, and third recess regions RR1, RR2, and RR3 may be formed. When the mold structure ML is formed, the first stepwise structure may be formed on the second etch stop patterns ESP2 on the fence regions FR.

After that, on the mold structure ML, the buried dielectric layer 110 may be formed to fill the first, second, and third recess regions RR1, RR2, and RR3, as discussed with reference to FIG. 13. The buried dielectric layer 110 may be etched by using the fourth mask pattern MP4 as an etching mask to form the protruding buried dielectric patterns 111a, 111b, and 111c. When the fourth mask pattern MP4 is used to pattern the buried dielectric layer 110, the second etch stop patterns ESP2 may be used as an etch stopper.

Figure 20A:
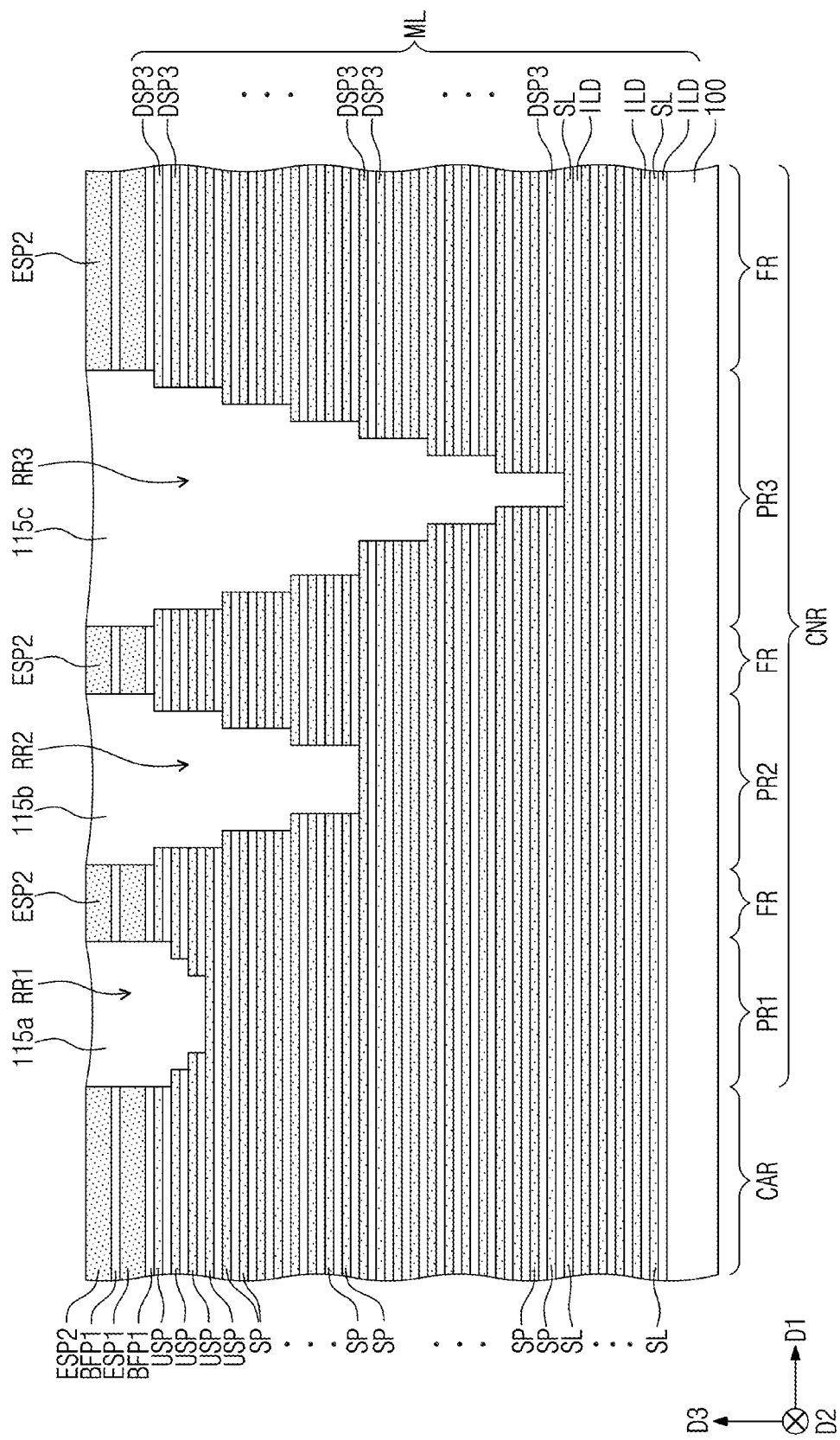
Figure 20B:
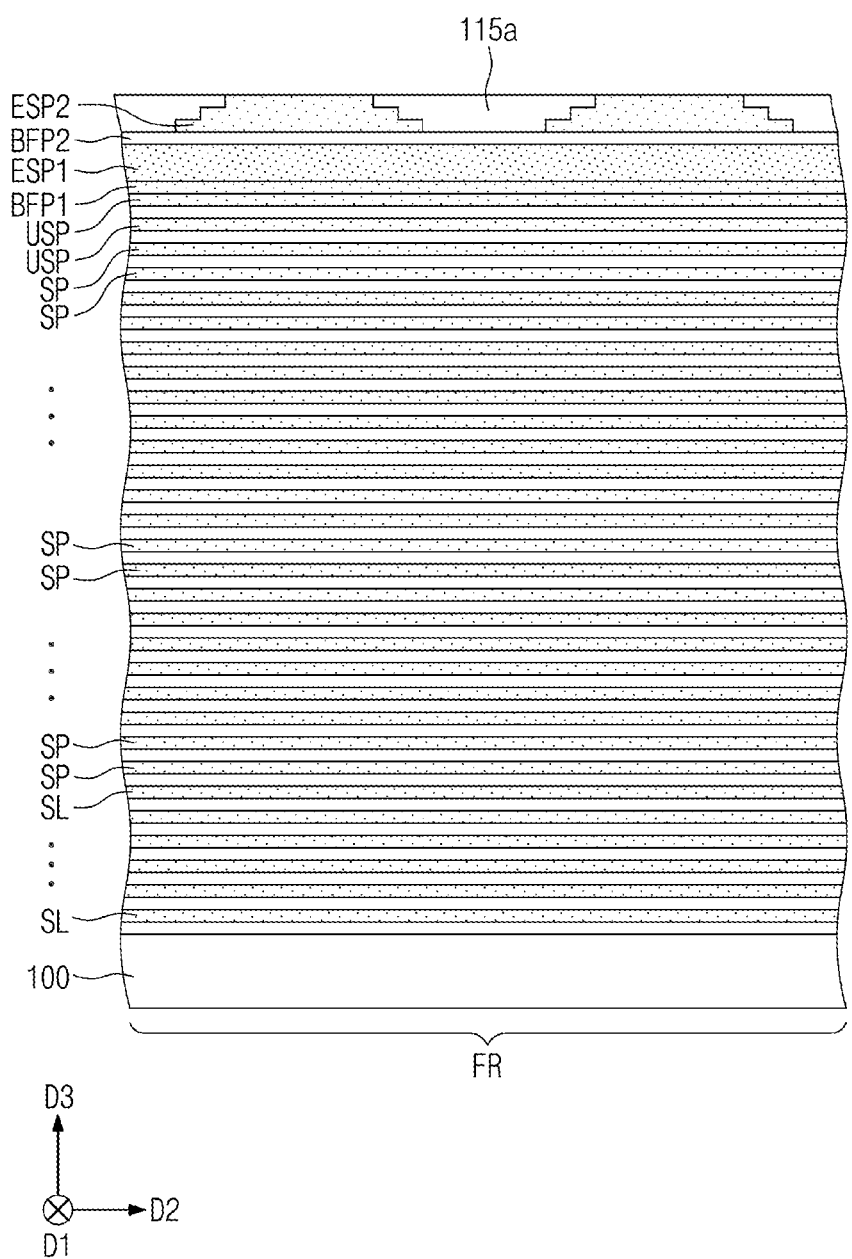

Referring to FIGS. 20A and 20B, a planarization process may be performed on the protruding buried dielectric patterns 111a, 111b, and 111c, as discussed above with reference to FIG. 14, and the second etch stop patterns ESP2 may be used as a polishing end point when the planarization process is performed. Because the second etch stop patterns ESP2 have stepwise structures on the fence regions FR, portions of the buried dielectric layer 110 may remain on portions of the fence regions FR on the second etch stop patterns ESP2.

Afterwards, the second etch stop patterns ESP2, the second buffer dielectric patterns BFP2, and the first etch stop patterns ESP1 may be sequentially removed. The top surfaces of the buried dielectric patterns 115a, 115b, and 115c may be recessed during the sequential removal of the second etch stop patterns ESP2, the second buffer dielectric patterns BFP2, and the first etch stop patterns ESP1.

Figure 21A:
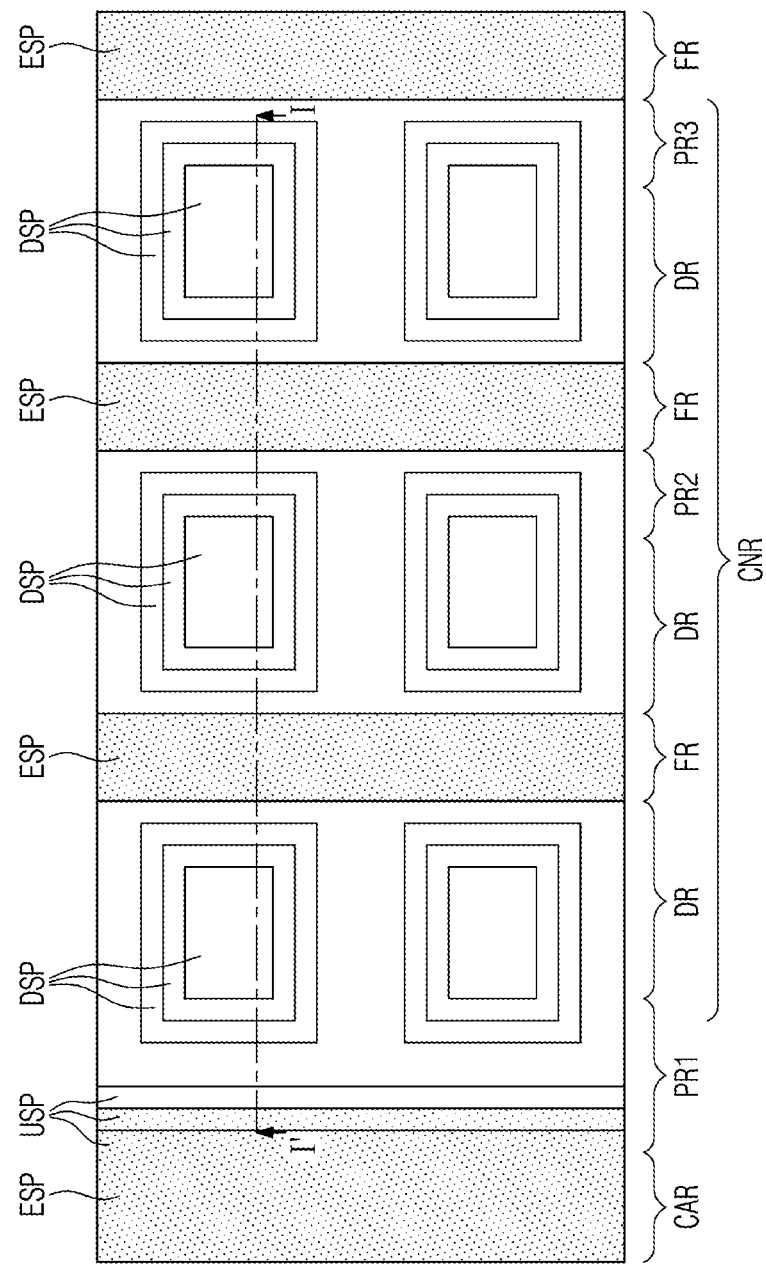
FIG. 21A illustrates a plan view of a method of forming a mold structure of a semiconductor device according to some embodiments.

FIG. 21A illustrates a plan view showing a method of forming a mold structure of a semiconductor device according to some embodiments. FIGS. 21B to 21E illustrate cross-sectional views taken along line I-I' of FIG. 20A, showing stages in a method of forming a mold structure of a semiconductor device according to some embodiments.

Figure 21B:
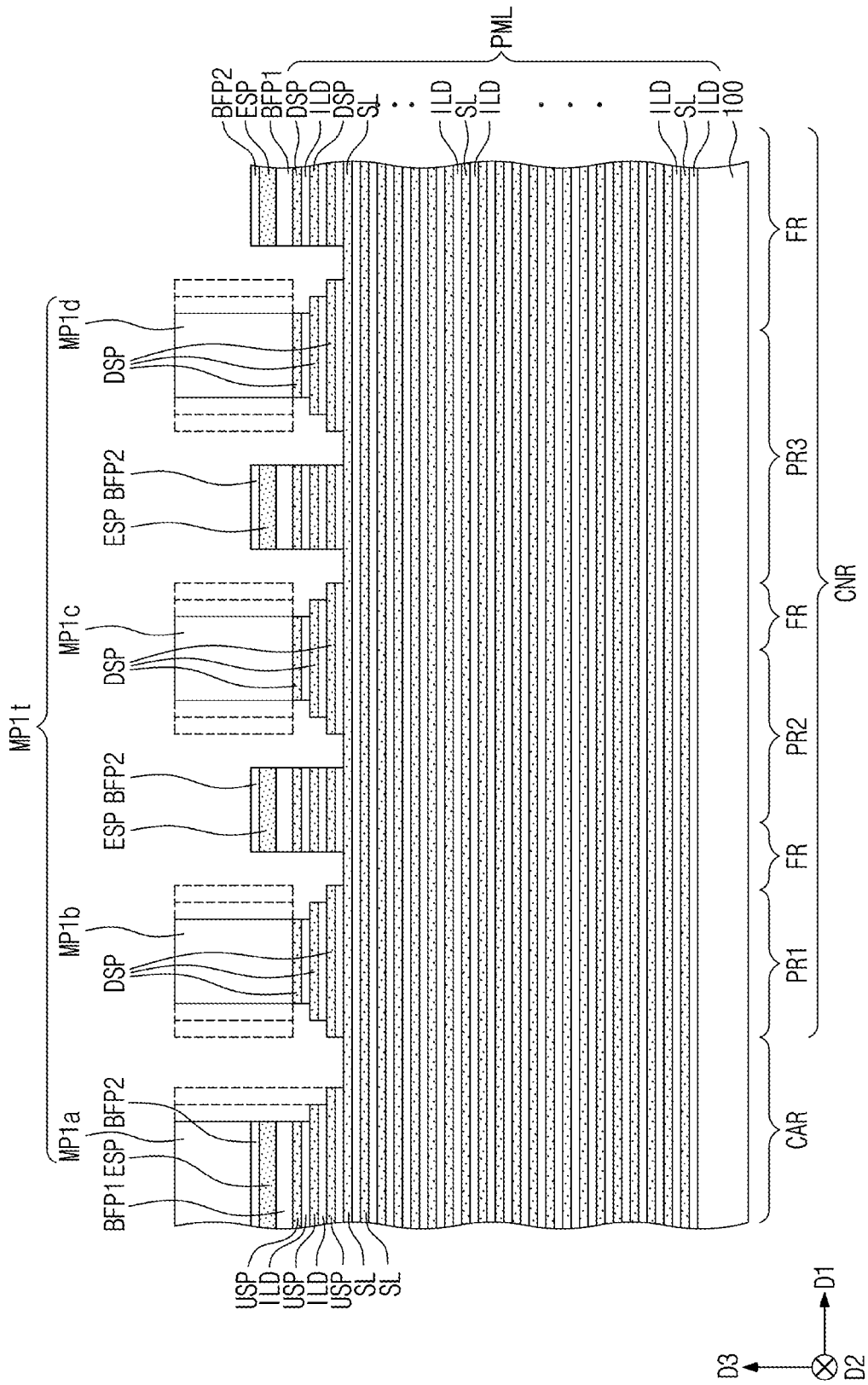
FIGS. 21B to 21E illustrate cross-sectional views along line I-I' of FIG. 20A.

Referring to FIGS. 21A and 21B, the substrate 100 may further include dummy regions DR between the fence regions FR and the first, second, and third pad regions PR1, PR2, and PR3. A plurality of first mask patterns MP1 may be provided between the fence regions FR and the first, second, and third pad regions PR1, PR2, and PR3. The plurality of first mask patterns MP1 may be used to alternately and repeatedly perform the first etching process and the first trimming process to form dummy sacrificial patterns DSP that are stacked in a pyramid shape on each of the dummy regions DR.

Figure 21C:
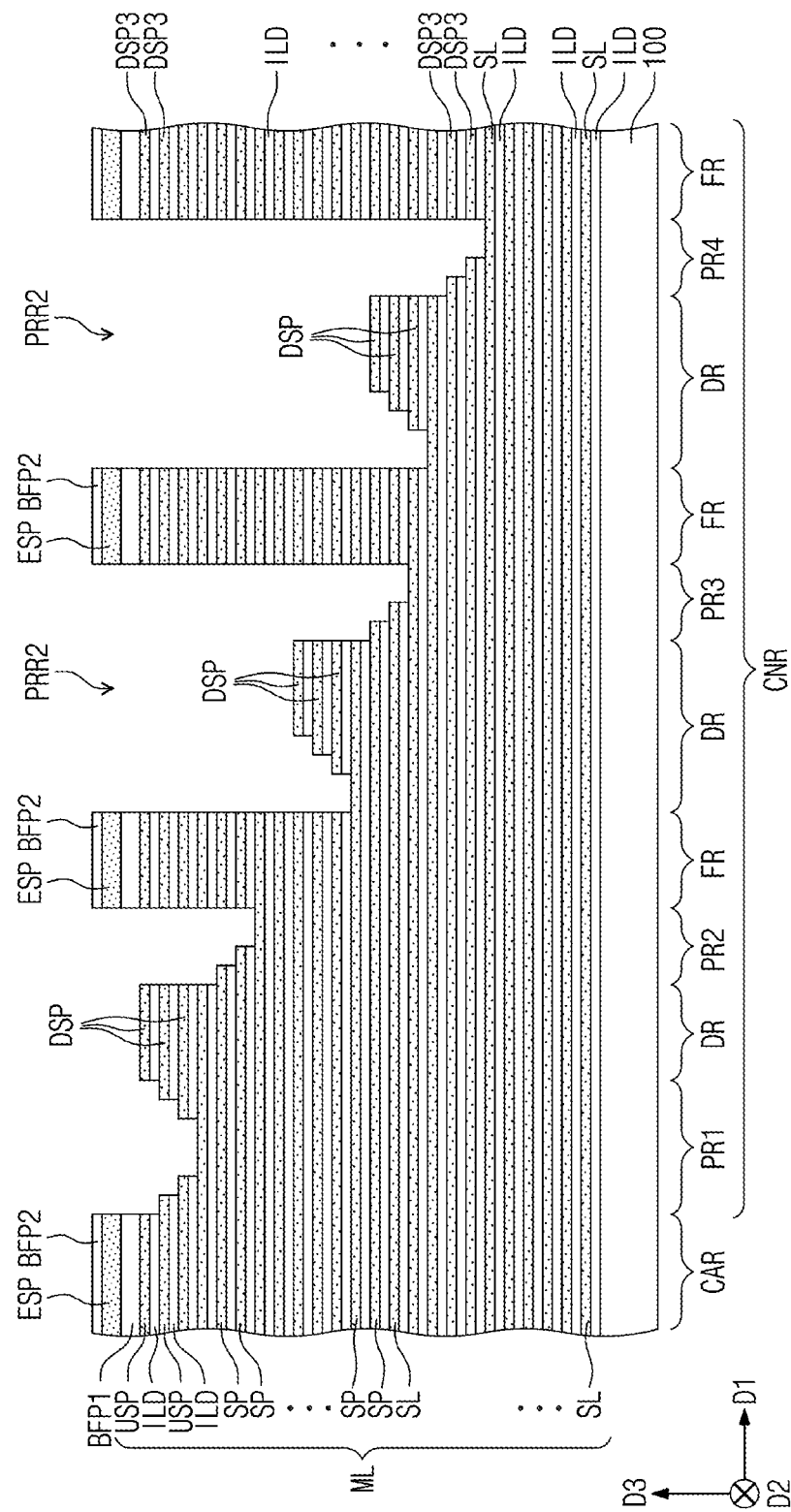

Afterwards, referring to FIG. 21C, as discussed above with reference to FIGS. 8A to 11B, the second mask pattern MP2 may be used to alternately and repeatedly perform the second etching process and the second trimming process. Therefore, the mold structure ML with its recess regions may be formed. According to the present embodiment, on each of the first, second, and third pad regions PR1, PR2, and PR3, the dummy sacrificial patterns DSP may form a first dummy stepwise structure along the first direction D1. In addition, on each of the first, second, and third pad regions PR1, PR2, and PR3, the sacrificial patterns SP may form a first stepwise structure along the first direction D1.

Figure 21D:
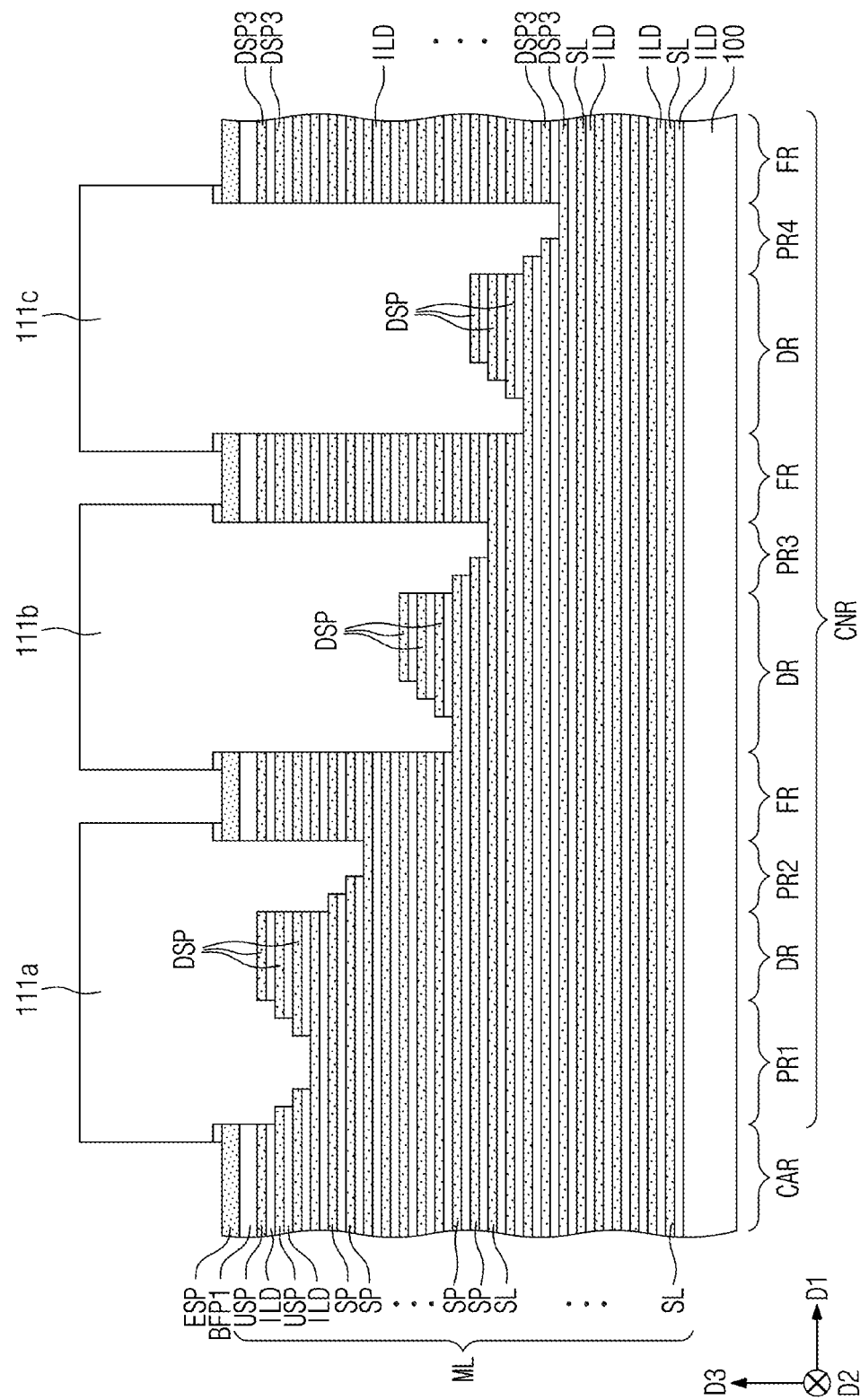
Figure 21E:
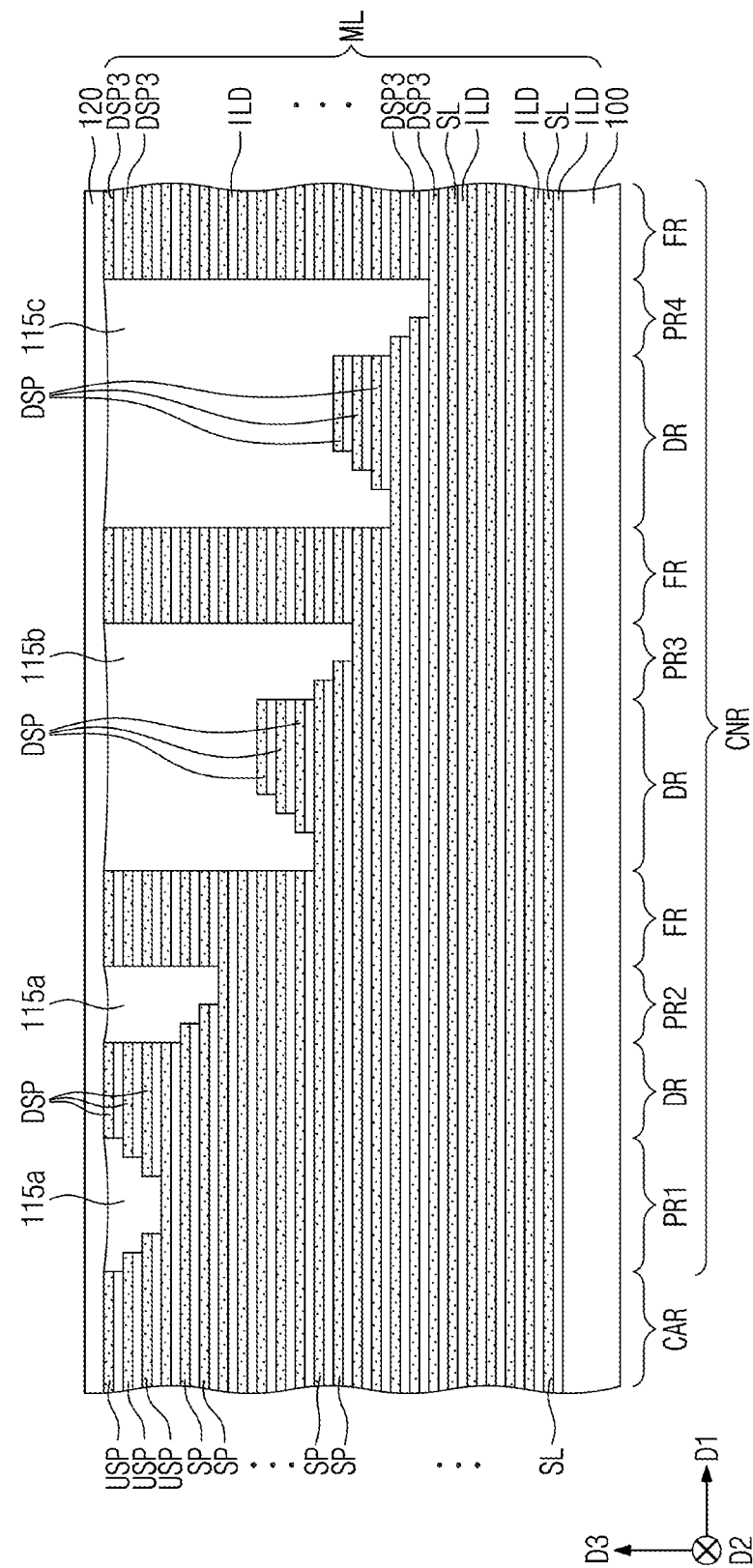

After that, referring to FIGS. 21D and 21E, as discussed above with reference to FIGS. 13, 14, and 15, the buried dielectric patterns 115a, 115b, and 115c may be formed on the recess regions of the mold structure ML.

Figure 22:
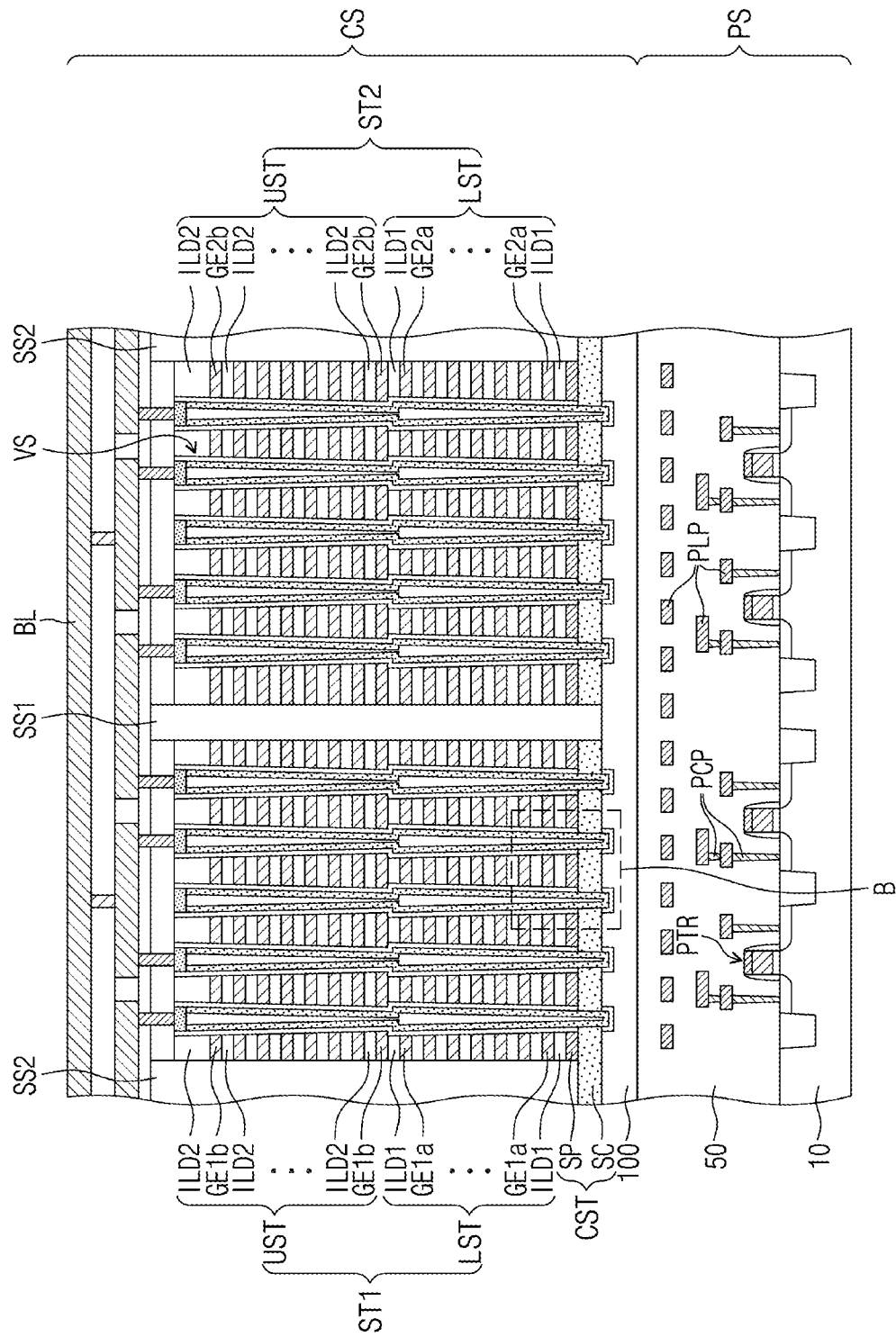
FIG. 22 illustrates a cross-sectional view showing a semiconductor device according to some embodiments.
Figure 23A:
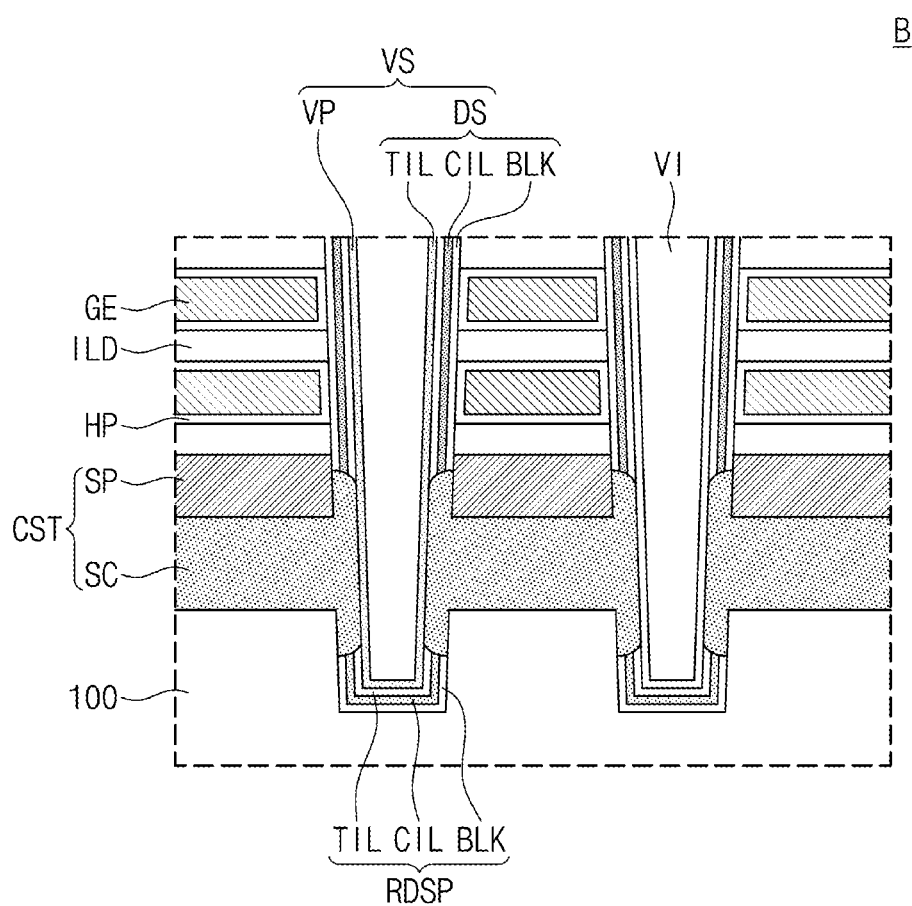
FIGS. 23A, 23B, and 23C illustrate enlarged views of section B of FIG. 22.
Figure 23B:
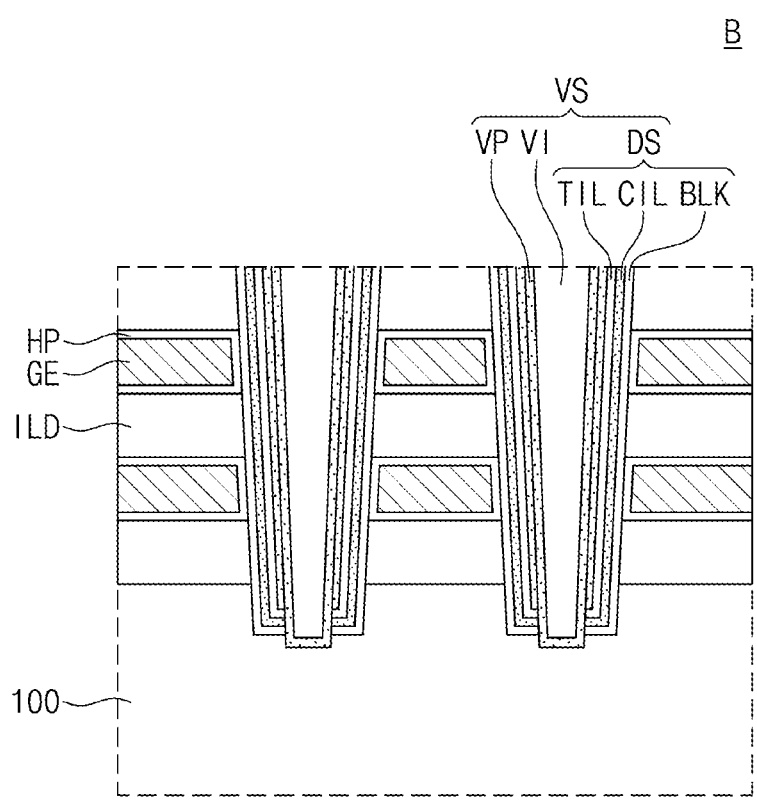
Figure 23C:
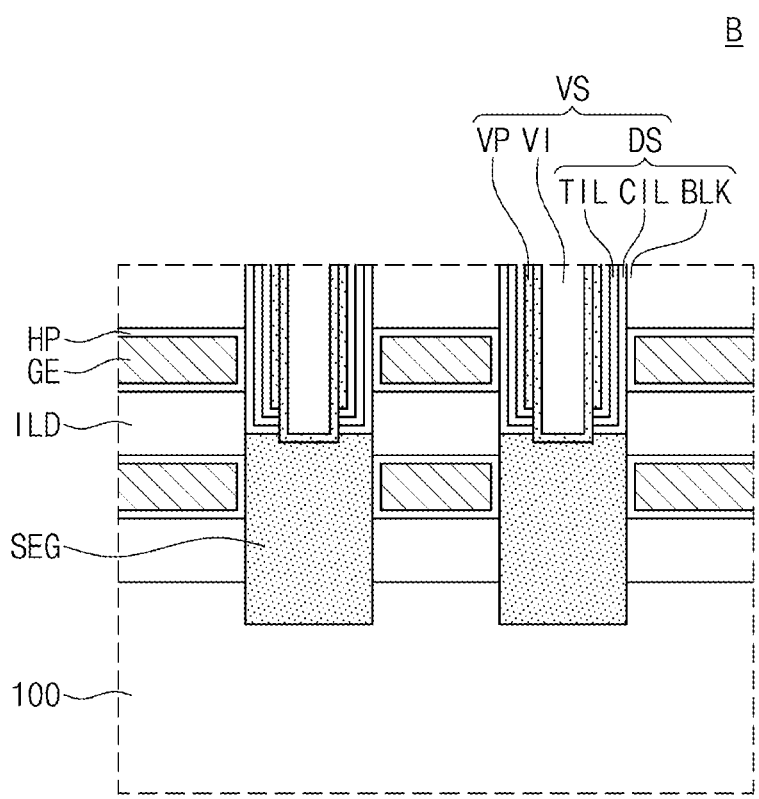

FIG. 22 illustrates a cross-sectional view showing a semiconductor device according to some embodiments. FIGS. 23A, 23B, and 23C illustrate enlarged views showing section B of FIG. 22. For brevity of explanation, a detailed description of same features as those of the semiconductor device discussed above will be omitted, and a difference thereof will be described.

According to the embodiment shown in FIG. 22, a semiconductor device may include a peripheral circuit structure PS and a cell array structure CS on the peripheral circuit structure PS. The peripheral circuit structure PS may include peripheral circuits PTR integrated on an entire surface of a semiconductor substrate 10 and a lower dielectric layer 50 that covers the peripheral circuits PTR.

The semiconductor substrate 10 may include the cell array region CAR and the connection region CNR. The semiconductor substrate 10 may be a silicon substrate.

The peripheral circuits PTR may be row and column decoders, a page buffer, and a control circuit. For example, the peripheral circuits PTR may include NMOS and PMOS transistors. Peripheral circuit lines PLP may be electrically connected to the peripheral circuits PTR through peripheral contact plugs PCP.

The lower dielectric layer 50 may be provided on the entire surface of the semiconductor substrate 10. On the semiconductor substrate 10, the lower dielectric layer 50 may cover the peripheral circuits PTR, the peripheral contact plugs PCP electrically connected to the peripheral circuits PTR, and the peripheral circuit lines PLP electrically connected to the peripheral circuits PTR.

The lower dielectric layer 50 may include a plurality of stacked dielectric layers. For example, the lower dielectric layer 50 may include one or more of a silicon oxide layer, a silicon nitride layer, a silicon oxynitride layer, and a low-k dielectric layer.

The cell array structure CS may be disposed on the lower dielectric layer 50. As discussed above, the cell array structure CS may include first and second cell structures provided on the substrate 100. The first and second cell structures may include stack structures ST1 and ST2, separation structures SS1 and SS2, vertical structures VS, and bit lines BL.

Each of the first and second stack structures ST1 and ST2 may include a lower stack structure LST and an upper stack structure UST on the lower stack structure LST. The lower stack structure LST may include lower electrodes GE1a or GE2a that are vertically stacked on the substrate 100 and may also include lower dielectric layers ILD1 between the lower electrodes GE1a or GE2a. The upper stack structure UST may include upper electrodes GE1b or GE2b that are vertically stacked on an uppermost lower electrode GE1a or GE2a and upper dielectric layers ILD2 between the upper electrodes GE1b or GE2b. A lowermost one of the upper electrodes GE2a or GE2b may be disposed on a lowermost lower dielectric layer ILD1.

Each of the vertical structures VS may include a lower channel that penetrates the lower stack structure LST, an upper channel that penetrates the upper stack structure UST, and an extension between the lower and upper channels. The extension may be provided in the uppermost lower dielectric layer ILD1. The vertical structures VS may each have a diameter that abruptly increases at the expansion.

Referring to FIG. 23A, each of the vertical structures VS according to some embodiments may include a vertical semiconductor pattern VP, a data storage pattern DS, and a buried dielectric pattern VI.

The vertical semiconductor pattern VP may include a semiconductor material, e.g., silicon (Si), germanium (Ge), or a mixture thereof. The vertical channel pattern VP including the semiconductor material may be used as channels of the memory cell transistors MCT and of the lower transistors LT1 and LT2, all of which transistors are discussed with reference to FIG. 1.

The vertical semiconductor pattern VP may have a macaroni shape or a pipe shape whose bottom end is closed. A buried dielectric pattern VI may fill an inside of the vertical semiconductor pattern VP shaped as discussed above. A conductive pad may be formed on an upper end of the vertical semiconductor pattern VP, and the conductive pad may be an impurity-doped region or formed of a conductive material.

The data storage pattern DS may extend in the third direction D3 and surround a sidewall of the vertical semiconductor pattern VP. The data storage pattern DS may have a macaroni shape or a pipe shape whose top and bottom ends are opened. The data storage pattern DS may have a bottom surface located at a level between those of top and bottom surfaces of a support semiconductor pattern SP. In addition, the substrate 100 may be provided therein with a residual data storage pattern RDSP vertically spaced apart from the data storage pattern DS.

The data storage pattern DS may include a tunnel dielectric layer TIL, a charge storage layer CIL, and a blocking dielectric layer BLK, which layers TIL, CIL, and BLK constitute a data storage layer of a NAND Flash memory device. For example, the charge storage layer CIL may be a trap dielectric layer, a floating gate electrode, or a dielectric layer including conductive nano-dots. The tunnel dielectric layer TIL and the blocking dielectric layer BLK may each be one of materials whose bandgap is greater than that of the charge storage layer CIL. The residual data storage pattern RDSP may have a thin-film structure the same as that of the data storage pattern DS.

In addition, referring to FIG. 23A, a horizontal dielectric pattern HP may conformally cover the vertical semiconductor pattern VP and may also cover sidewalls, top surfaces, and bottom surfaces of the electrode GE adjacent to the vertical semiconductor pattern VP. The horizontal dielectric pattern HP may include a high-k dielectric layer, e.g., an aluminum oxide layer or a hafnium oxide layer.

Moreover, referring to FIG. 23A, a source structure CST may be disposed between the substrate 100 and the stack structure ST. The source structure CST may include a source semiconductor pattern SC and a support semiconductor pattern SP on the source semiconductor pattern SC. The source structure CST may be parallel to a top surface of the substrate 100, and may extend in the first direction D1 parallel to the stack structure ST.

The source semiconductor pattern SC may be disposed between the substrate 100 and the stack structure ST. The source semiconductor pattern SC may be formed of a semiconductor material doped with impurities (e.g., phosphorus (P) or arsenic (As)) having a first conductivity type. For example, the source semiconductor pattern SC may be formed of a polysilicon layer doped with n-type impurities. For each vertical structure VS, a portion of a sidewall of the vertical semiconductor pattern VP may be in contact with the source semiconductor pattern SC.

The support semiconductor pattern SP may cover a top surface of the source semiconductor pattern SC, and may penetrate a portion of the source semiconductor pattern SC to thereby contact the substrate 100. The support semiconductor pattern SP may include one or more of a semiconductor doped with impurities having the first conductivity type (e.g., n-type) and an intrinsic semiconductor doped with no impurities. A concentration of n-type impurities may be less in the support semiconductor pattern SP than in the source semiconductor pattern SC.

According to the embodiment of FIG. 23B, each of the vertical structures VS may penetrate the stack structure ST to thereby connect with the substrate 100. For example, each of the vertical structures VS may include a data storage pattern DS and a vertical semiconductor pattern VP. The vertical semiconductor pattern VP may be in direct contact with the substrate 100 and may have a "U" shape or a pipe shape whose bottom end is closed.

The data storage pattern DS may extend in the third direction D3 and may have a macaroni shape or a pipe shape whose top and bottom ends are opened. The data storage pattern DS may include, as discussed above with reference to FIG. 23A, a tunnel dielectric layer TIL, a charge storage layer CIL, and a blocking dielectric layer BLK, which layers TIL, CIL, and BLK constitute a data storage layer of a NAND Flash memory device.

According to the embodiment shown in FIG. 23C, a semiconductor pillar SEG may be provided between the substrate 100 and each vertical semiconductor structure VS. The semiconductor pillar SEG may penetrate the electrode GE provided at the bottom of the stack structure ST. The semiconductor pillar SEG may directly contact the substrate 100, and may include an epitaxial layer grown from the substrate 100 formed of a semiconductor material. The semiconductor pillar SEG may electrically connect the substrate 100 to the vertical semiconductor pattern VP of the vertical structure VS. The semiconductor pillar SEG may include silicon (Si), germanium (Ge), silicon-germanium (SiGe), a III-V group semiconductor compound, or a II-VI group semiconductor compound.

By way of summation and review, example embodiments provide a semiconductor device with improved reliability and increased integration. Example embodiments also provide an electronic system including the semiconductor device. Example embodiments also provide an easy method of fabricating a semiconductor device.

That is, according to example embodiments, before a planarization process is performed on a buried dielectric layer that covers a mold structure, portions of the buried dielectric layer may be previously removed on a connection region to thereby reduce a volume of the buried dielectric layer that is removed in the planarization process. In addition, because an etch stop pattern is formed on the mold structure on the connection region, it may be possible to reduce a dishing phenomenon when the buried dielectric layer is planarized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a cell array region and a connection region; and
   a stack structure including dielectric layers and electrodes that are vertically and alternately stacked on the substrate, the stack structure having a first pad part, a first fence part, a second pad part, and a second fence part that are sequentially arranged along a first direction,
   wherein each of the first pad part and the second pad part of the stack structure includes a first stepwise structure along the first direction, and a second stepwise structure along a second direction that intersects the first direction,
   wherein each of the first fence part and the second fence part of the stack structure includes dummy electrodes at same levels as those of the electrodes, the dummy electrodes being spaced apart in the first direction from the electrodes,
   wherein the dummy electrodes on the first fence part have a first dummy stepwise structure along the first direction, and a second dummy stepwise structure along the second direction, and
   wherein sidewalls of the electrodes that define the second stepwise structure of the second pad part are offset from sidewalls of the dummy electrodes that define the second dummy stepwise structure of the first pad part.

2. The semiconductor device as claimed in claim 1, wherein the first and second fence parts extend along the second direction and have substantially the same thickness.

3. The semiconductor device as claimed in claim 1, wherein a slope of the first stepwise structure is greater than a slope of the second stepwise structure.

4. The semiconductor device as claimed in claim 3, wherein a slope of each of the first and second dummy stepwise structures is substantially the same as the slope of the second stepwise structure.

5. The semiconductor device as claimed in claim 1, wherein a step difference in stair steps of the first stepwise structure is greater than a step difference in stair steps of the second stepwise structure.

6. The semiconductor device as claimed in claim 1, wherein a thickness of the stack structure is smaller on the second pad part than on the first pad part.

7. The semiconductor device as claimed in claim 1, wherein the electrodes include upper electrodes having pad parts along the first direction on the first pad part, the upper electrodes defining an upper stepwise structure that faces the first dummy stepwise structure.

8. A semiconductor device, comprising:
   a substrate including a cell array region and a connection region;

a stack structure including dielectric layers and electrodes that are vertically and alternately stacked on the substrate, the stack structure having fence parts and pad parts that are alternately arranged along a first direction on the connection region; and buried dielectric patterns that cover the pad parts between the fence parts of the stack structure, wherein each of the pad parts of the stack structure has a first stepwise structure along the first direction, and a second stepwise structure along a second direction that intersects the first direction, wherein the fence parts of the stack structure have substantially a same thickness and extend along the second direction, and wherein a top surface of each of the buried dielectric patterns is rounded.

9. The semiconductor device as claimed in claim 8, wherein a thickness in a third direction of the buried dielectric patterns increases in a direction oriented away from the cell array region, the third direction being perpendicular to the first direction and the second direction.

10. The semiconductor device as claimed in claim 8, wherein widths in the first direction of the buried dielectric patterns increase in a direction oriented away from the cell array region.

11. The semiconductor device as claimed in claim 8, wherein the top surface of each of the buried dielectric patterns is substantially coplanar with top surfaces of the fence parts of the stack structure.

12. The semiconductor device as claimed in claim 8, wherein a slope of the first stepwise structure is greater than a slope of the second stepwise structure.

13. The semiconductor device as claimed in claim 8, wherein a step difference in stair steps of the first stepwise structure is greater than a step difference in stair steps of the second stepwise structure.

14. The semiconductor device as claimed in claim 8, wherein the top surface of each of the buried dielectric patterns has a downwardly convex profile.

15. The semiconductor device as claimed in claim 8, wherein each of the fence parts includes dummy electrodes that are at same levels as those of the electrodes and are spaced apart in the first direction from the electrodes.

16. The semiconductor device as claimed in claim 8, wherein the thickness of the fence parts is substantially the same as a thickness of the stack structure on the cell array region.

17. The semiconductor device as claimed in claim 8, wherein the electrodes include upper electrodes that define an upper stepwise structure along the first direction on each of the pad parts, a slope of the upper stepwise structure being substantially the same as a slope of the second stepwise structure.

18. The semiconductor device as claimed in claim 8, wherein each of the fence parts has a third stepwise structure that faces in the first direction toward the first stepwise structure of each of the pad parts.

19. An electronic system, comprising: a semiconductor device including a cell array and an input/output pad that is electrically connected to the cell array and a peripheral circuit, the cell array including: a substrate having a cell array region and a connection region, a stack structure having dielectric layers and electrodes that are vertically and alternately stacked on the substrate, the stack structure including fence parts and pad parts that are alternately arranged along a first direction on the connection region, and buried dielectric patterns that cover the pad parts between the fence parts of the stack structure; and a controller electrically connected through the input/output pad to the semiconductor device, the controller being configured to control the semiconductor device, wherein each of the pad parts of the stack structure has a first stepwise structure along the first direction, and a second stepwise structure along a second direction that intersects the first direction, and wherein the fence parts of the stack structure have a thickness that is uniform in the first direction and the second direction; wherein a top surface of each of the buried dielectric patterns has a downwardly convex profile.

* * * * *